(12) United States Patent
Yamazaki et al.

(10) Patent No.: US 12,190,812 B2
(45) Date of Patent: Jan. 7, 2025

(54) DISPLAY DEVICE COMPRISING A FIRST TRANSISTOR, A SECOND TRANSISTOR, A THIRD TRANSISTOR, AND A LIGHT-EMITTING ELEMENT

(71) Applicant: Semiconductor Energy Laboratory Co., Ltd., Atsugi (JP)

(72) Inventors: Shunpei Yamazaki, Setagaya (JP); Kenichi Okazaki, Atsugi (JP); Koji Kusunoki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/283,844

(22) PCT Filed: Apr. 11, 2022

(86) PCT No.: PCT/IB2022/053350
§ 371 (c)(1),
(2) Date: Sep. 25, 2023

(87) PCT Pub. No.: WO2022/224074
PCT Pub. Date: Oct. 27, 2022

(65) Prior Publication Data
US 2024/0169914 A1    May 23, 2024

(30) Foreign Application Priority Data
Apr. 22, 2021   (JP) ................... 2021-072618

(51) Int. Cl.
*G09G 3/32* (2016.01)
*G09G 3/3233* (2016.01)
*H10K 59/121* (2023.01)

(52) U.S. Cl.
CPC ....... *G09G 3/3233* (2013.01); *H10K 59/1213* (2023.02); *G09G 2300/0426* (2013.01);
(Continued)

(58) Field of Classification Search
CPC ......... G09G 3/3233; G09G 2300/0426; G09G 2300/0819; G09G 2300/0452; G09G 2300/042; H10K 59/1213
See application file for complete search history.

(56) References Cited

U.S. PATENT DOCUMENTS

| 5,953,985 A | 9/1999 | Kobayashi |
| 6,120,338 A | 9/2000 | Hirano et al. |

(Continued)

FOREIGN PATENT DOCUMENTS

| CN | 205943423 U | 2/2017 |
| CN | 106558285 A | 4/2017 |

(Continued)

OTHER PUBLICATIONS

International Search Report (Application No. PCT/IB2022/053350) Dated Jun. 28, 2022.

(Continued)

*Primary Examiner* — Lisa S Landis
(74) *Attorney, Agent, or Firm* — Eric J. Robinson; Robinson Intellectual Property Law Office, P.C.

(57) ABSTRACT

A display device that has high display quality is provided. A highly reliable display device is provided. A display device with low power consumption is provided. A light-emitting element is electrically connected to one of a source and a drain of a first transistor. The other of the source and the drain of the first transistor is electrically connected to one of a source and a drain of a second transistor. A gate electrode of the second transistor is electrically connected to one of a source and a drain of a third transistor. A semiconductor layer of the second transistor and a semiconductor layer of the third transistor each include indium, zinc and a third metal. The ratio of the number of indium atoms to the total number of the indium atoms, zinc atoms, and atoms of the third metal in the semiconductor layer of the second tran- (Continued)

sistor is higher than or equal to 30 atomic % and lower than or equal to 100 atomic %. The second transistor has a function of controlling the amount of light emission of the light-emitting element.

6 Claims, 23 Drawing Sheets

(52) U.S. Cl.
CPC ............ *G09G 2300/0452* (2013.01); *G09G 2300/0819* (2013.01); *G09G 2300/0842* (2013.01); *G09G 2320/0233* (2013.01); *G09G 2330/021* (2013.01)

(56) References Cited

U.S. PATENT DOCUMENTS

| | | |
|---|---|---|
| 8,922,464 B2 | 12/2014 | Inoue et al. |
| 10,373,983 B2 | 8/2019 | Takahashi et al. |
| 10,504,924 B2 | 12/2019 | Yamazaki et al. |
| 10,700,098 B2 | 6/2020 | Takahashi et al. |
| 11,404,447 B2 | 8/2022 | Takahashi et al. |
| 11,676,971 B2 | 6/2023 | Takahashi et al. |
| 2002/0072139 A1 | 6/2002 | Kashiwabara |
| 2011/0148290 A1 | 6/2011 | Oota |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2012/0287025 A1* | 11/2012 | Inoue ............... G09G 3/3233 345/76 |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2016/0172595 A1 | 6/2016 | Malinowski et al. |
| 2016/0315133 A1 | 10/2016 | Sato |
| 2017/0092196 A1 | 3/2017 | Gupta et al. |
| 2017/0141167 A1 | 5/2017 | Naganuma |
| 2017/0256754 A1 | 9/2017 | Defranco et al. |
| 2017/0301699 A1 | 10/2017 | Yamazaki et al. |
| 2017/0373194 A1 | 12/2017 | Yamazaki |
| 2018/0040640 A1 | 2/2018 | Takahashi et al. |
| 2018/0190908 A1 | 7/2018 | Ke et al. |
| 2020/0203662 A1 | 6/2020 | Mollard et al. |
| 2023/0178569 A1 | 6/2023 | Shima et al. |
| 2023/0282649 A1 | 9/2023 | Takahashi et al. |
| 2023/0326934 A1 | 10/2023 | Yoshimoto et al. |

FOREIGN PATENT DOCUMENTS

| | | |
|---|---|---|
| JP | 2000-036385 A | 2/2000 |
| JP | 2002-324673 A | 11/2002 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2012-252329 A | 12/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2018-025777 A | 2/2018 |
| JP | 2019-179696 A | 10/2019 |
| JP | 2020-160305 A | 10/2020 |
| KR | 2012-0127253 A | 11/2012 |
| KR | 2018-0015574 A | 2/2018 |
| KR | 2018-0079082 A | 7/2018 |
| WO | WO-2017/058400 | 4/2017 |
| WO | WO-2018/087625 | 5/2018 |

OTHER PUBLICATIONS

Written Opinion (Application No. PCT/IB2022/053350) Dated Jun. 28, 2022.

Zakhidov.A et al., "Orthogonal processing: a new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Chang.T et al., "LTPO TFT Technology for AMOLEDs", SID Digest '19 : SID International Symposium Digest of Technical Papers, May 29, 2019, vol. 50, No. 1, pp. 545-548.

Yonebayashi.R et al., "High Refresh Rate and Low Power Consumption AMOLED Panel Using Top-gate n-Oxide and p-LTPS TFTs", SID Digest '20 : SID International Symposium Digest of Technical Papers, Sep. 25, 2020, pp. 355-358.

\* cited by examiner

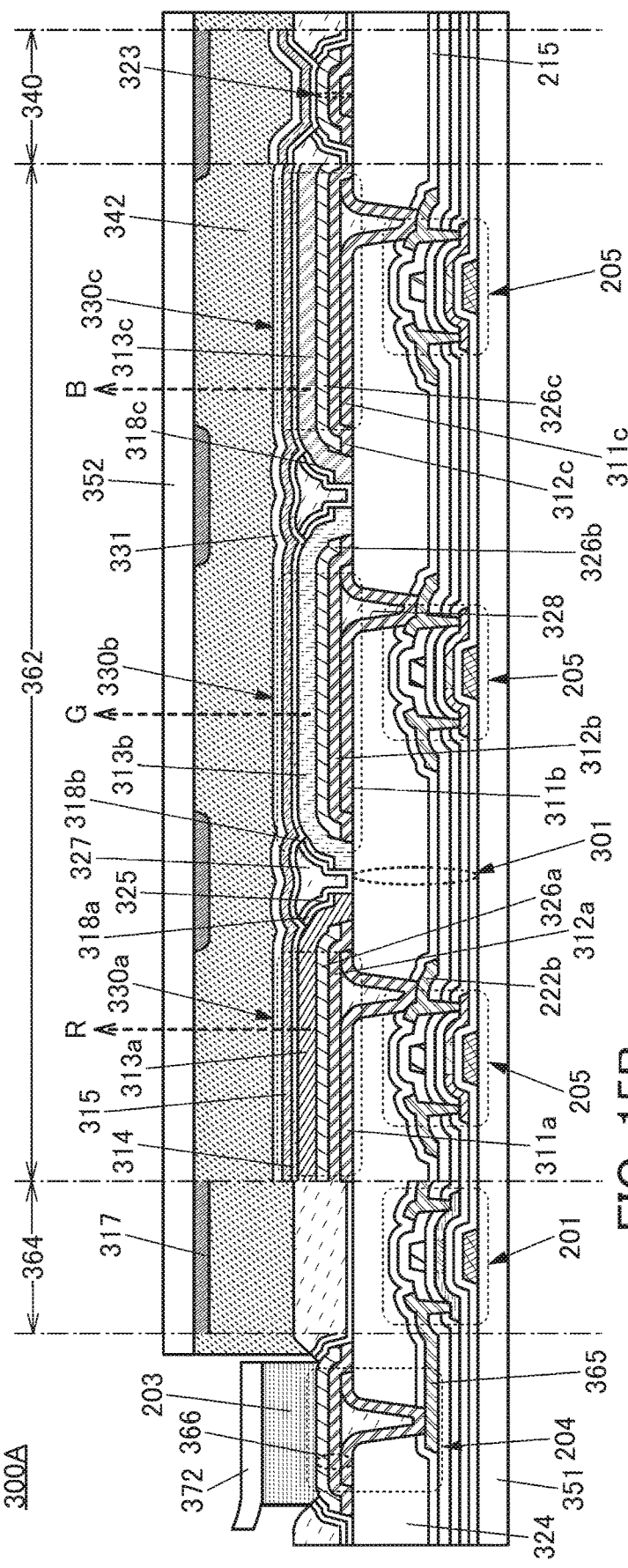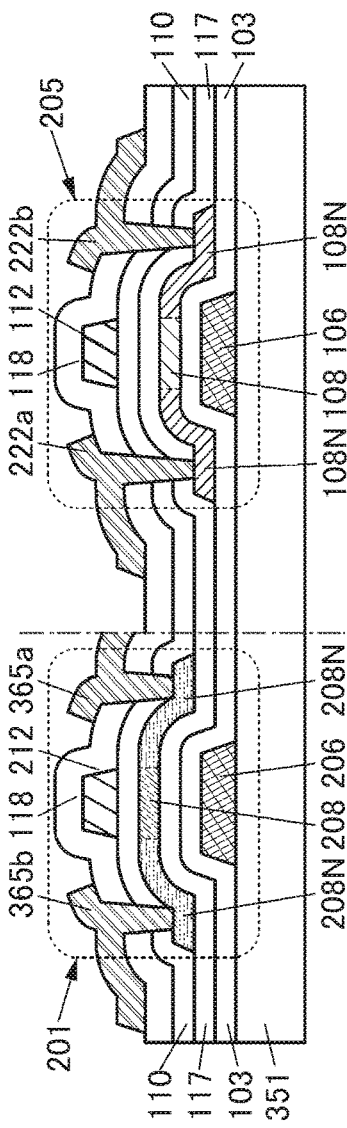

DISPLAY DEVICE COMPRISING A FIRST TRANSISTOR, A SECOND TRANSISTOR, A THIRD TRANSISTOR, AND A LIGHT-EMITTING ELEMENT

TECHNICAL FIELD

One embodiment of the present invention relates to a display device. Another embodiment of the present invention relates to a driving method of a display device. Another embodiment of the present invention relates to a semiconductor device. Another embodiment of the present invention relates to a driving method of a semiconductor device. Another embodiment of the present invention relates to a driving method of a circuit.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a pixel, a pixel circuit, a circuit, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with an increase in definition. An example of a device required to have the highest resolution is a device for virtual reality (VR) or augmented reality (AR).

Examples of display devices that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying a voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

Patent Document 2 discloses a display device using an organic EL device for VR.

In Non-Patent Document 1, a pixel circuit including a thin film transistor using polycrystalline silicon and a thin film transistor using an oxide is described. In Non-Patent Document 2, driving of a pixel circuit of a display at various refresh rates is described.

REFERENCES

Patent Documents

[Patent Document 1] Japanese Published Patent Application No. 2002-324673
[Patent Document 2] PCT International Publication No. 2018/087625

Non-Patent Documents

[Non-Patent Document 1] Ting-Kuo Chang et al., "LTPO TFT Technology for AMOLEDs," SID Symp. Dig. Tech. Pap., pp. 545-548 (2019).
[Non-Patent Document 2] Ryo Yonebayashi et al., "High refresh rate and low power consumption AMOLED panel using top-gate n-oxide and p-LTPS TFTs," J. Soc. Inf. Disp., 28, 4, pp. 350-359 (2020).

SUMMARY OF THE INVENTION

Problems to be Solved by the Invention

An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to provide a novel display device.

An object of one embodiment of the present invention is to provide a semiconductor device with favorable electrical characteristics. An object of one embodiment of the present invention is to provide a highly reliable semiconductor device. An object of one embodiment of the present invention is to provide a semiconductor device with stable electrical characteristics. An object of one embodiment of the present invention is to provide a semiconductor device with low power consumption. An object of one embodiment of the present invention is to provide a semiconductor device including different transistors the same substrate. An object of one embodiment of the present invention is to provide a novel semiconductor device.

Note that the description of these objects does not preclude the presence of other objects. Note that one embodiment of the present invention does not have to achieve all the objects. Note that objects other than these can be derived from the descriptions of the specification, the drawings, the claims, and the like.

Means for Solving the Problems

One embodiment of the present invention is a display device including a first transistor, a second transistor, a third transistor, and a light-emitting element. The light-emitting element is electrically connected to one of a source and a drain of the first transistor. The other of the source and the drain of the first transistor is electrically connected to one of a source and a drain of the second transistor. A gate electrode of the second transistor is electrically connected to one of a source and a drain of the third transistor. A semiconductor layer of the second transistor includes indium, zinc, and an element M. The element M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt. A semiconductor layer of the third transistor includes indium, zinc and the element M. The ratio of the number of indium atoms to the total number of the indium atoms, zinc atoms, and atoms of the element M in the semiconductor layer of the second transistor is higher than or equal to 30 atomic % and lower than or equal to 100 atomic %. The second transistor has a function of controlling the amount of light emission of the light-emitting element.

In the above structure, it is preferable that the other of the source and the drain of the third transistor be electrically connected to the other of the source and the drain of the second transistor, and the ratio of the number of the indium atoms to the total number of the indium atoms, the zinc atoms, and the atoms of the element M in the semiconductor layer of the second transistor be higher than that in the semiconductor layer of the third transistor.

In the above structure, it is preferable that the ratio of the number of atoms of the element M to the total number of indium atoms, zinc atoms, and the atoms of the element M in the semiconductor layer of the third transistor be higher than that in the semiconductor layer of the second transistor.

In the above structure, it is preferable that the ratio of the number of the atoms of the element M to the total number of atoms of contained metal elements in the semiconductor layer of the third transistor be higher than or equal to 20 atomic % and lower than or equal to 60 atomic %.

In the above structure, a fourth transistor, a fifth transistor, a first wiring, a capacitor, and a driver circuit are preferably included. One of a source and a drain of the fourth transistor is preferably electrically connected to the one of the source and the drain of the second transistor. One of a source and a drain of the fifth transistor is preferably electrically connected to the other of the source and the drain of the second transistor. The other of the source and the drain of the fourth transistor is preferably electrically connected to the first wiring. A first electrode of the capacitor is preferably electrically connected to the one of the source and the drain of the first transistor. A second electrode of the capacitor is preferably electrically connected to a gate of the second transistor. The first wiring preferably has a function of supplying a video signal output from the driver circuit to the other of the source and the drain of the fourth transistor.

In the above structure, the display device preferably has a function of writing a potential to the gate of the second transistor by turning on the second transistor, the third transistor, and the fourth transistor and turning off the first transistor and the fifth transistor and a function of retaining the written potential by turning off the third transistor and the fourth transistor after the potential is written.

In the above structure, the display device preferably has a function of writing a potential to the gate of the second transistor by turning on the second transistor, the third transistor, and the fourth transistor and turning off the first transistor and the fifth transistor, a function of retaining the written potential by turning off the third transistor and the fourth transistor after the potential is written, and a function of controlling the amount of light emission of the light-emitting element by turning on the first transistor, the second transistor, and the fifth transistor and flowing current through the light-emitting element, after the potential is retained.

Effect of the Invention

According to one embodiment of the present invention, a display device with high display quality can be provided. According to another embodiment of the present invention, a highly reliable display device can be provided. According to another embodiment of the present invention, a display device with low power consumption can be provided. According to another embodiment of the present invention, a novel display device can be provided.

According to one embodiment of the present invention, a semiconductor device with favorable electrical characteristics can be provided. According to another embodiment of the present invention, a highly reliable semiconductor device can be provided. According to another embodiment of the present invention, a semiconductor device with stable electrical characteristics can be provided. According to another embodiment of the present invention, a semiconductor device with low power consumption can be provided. According to another embodiment of the present invention, a semiconductor device including different transistors over the same substrate can be provided. According to another embodiment of the present invention, a novel semiconductor device can be provided.

Note that the description of these effects does not preclude the presence of other effects. Note that one embodiment of the present invention does not necessarily have all of these effects. Note that effects other than these can be derived from the descriptions of the specification, the drawings, the claims, and the like.

BRIEF DESCRIPTION OF THE DRAWINGS

FIG. 15A is a cross-sectional view illustrating an example of a display device. FIG. 15B is a cross-sectional view illustrating an example of transistors.

MODE FOR CARRYING OUT THE INVENTION

Figure 1A:
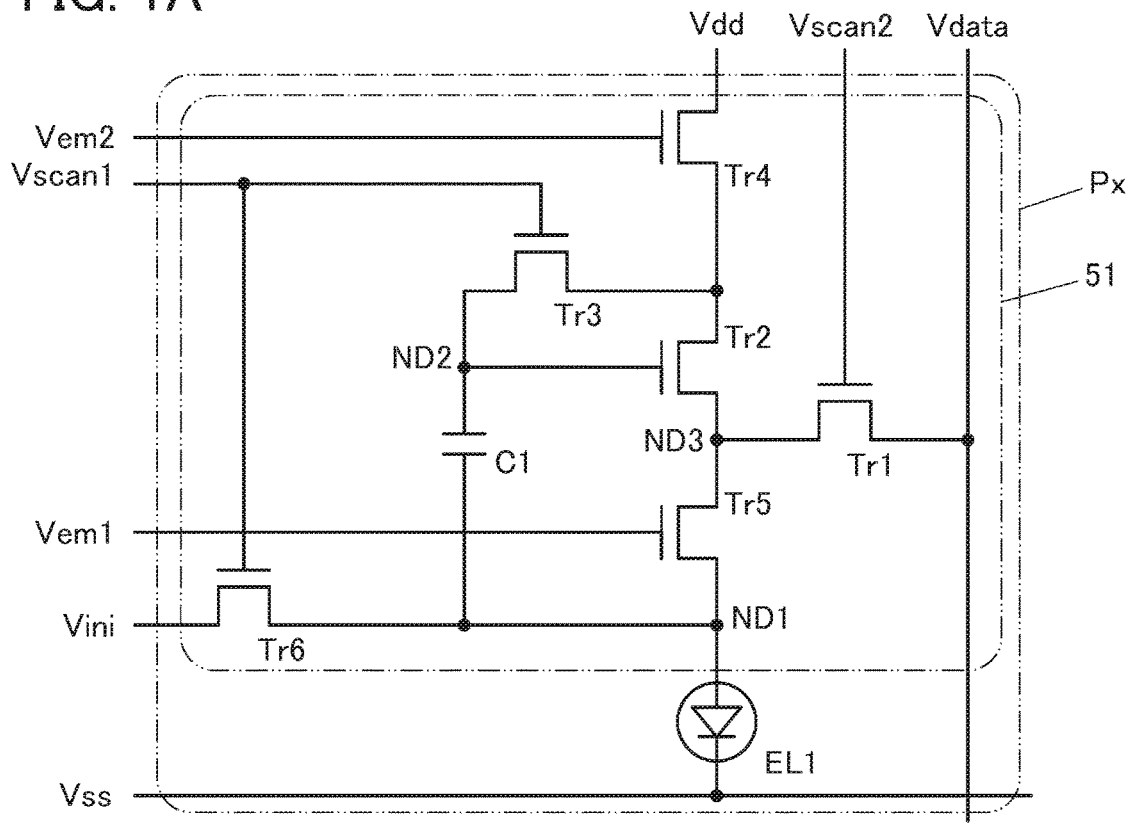
FIG. 1A and FIG. 1B are diagrams each illustrating a configuration example of a pixel.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the following description of the embodiments.

In structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, the size, the layer thickness, or the region is not limited to the illustrated scale.

In this specification and the like, ordinal numbers such as "first" and "second" are used in order to avoid confusion among components and do not limit the number of components.

A transistor is a kind of semiconductor element and can achieve a function of amplifying a current or a voltage, a switching operation for controlling conduction or non-conduction, and the like. An IGFET (Insulated Gate Field Effect Transistor) and a thin film transistor (TFT) are in the category of a transistor in this specification and the like.

Functions of a "source" and a "drain" are sometimes replaced with each other when a transistor of opposite polarity is used or when the direction of current is changed in circuit operation, for example. Therefore, the terms "source" and "drain" can be switched in this specification.

In this specification and the like, one of a source and a drain of a transistor is referred to as a "first electrode" and the other of the source and the drain is referred to as a "second electrode" in some cases. Note that a gate is also referred to as a "gate" or a "gate electrode." In this specification and the like, a first terminal and a second terminal of a transistor refer to one and the other of a source and a drain of the transistor, for example.

In this specification and the like, "electrically connected" includes the case where connection is made through an "object having any electric function." Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

Note that in this specification and the like, an EL layer means a layer containing at least a light-emitting substance (also referred to as a light-emitting layer) or a stacked-layer body including the light-emitting layer provided between a pair of electrodes of a light-emitting device (also referred to as a light-emitting element).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

A display device of one embodiment of the present invention can achieve a reduction in current variations in pixel circuits included in the pixels and excellent display quality. In particular, when an image is displayed on a display portion at low frame frequency, the display device of one embodiment of the present invention can reduce power consumption and achieve excellent display quality.

The low frame frequency is, for example, lower than or equal to 3 Hz, preferably lower than or equal to 1 Hz, more preferably lower than or equal to 0.1 Hz, further preferably lower than or equal to 0.01 Hz. The high frame frequency is, for example, higher than or equal to 30 Hz.

When a transistor using an oxide semiconductor in a channel formation region (hereinafter referred to as an OS transistor) is used as a transistor included in the pixel circuit, electric charge written to each node can be held for a long period. When a still image for which rewriting every frame is not required is displayed at high frequency, the frame frequency is lowered, a signal corresponding to image data is written to the pixel circuit, and then the operation of a peripheral driver circuit can be stopped. A driving method in which the operation of a peripheral driver circuit is stopped in such a manner while a still image is displayed is also referred to as "idling stop driving." The idling stop driving results in lower power consumption of the display device.

The refresh rate of the display device of one embodiment of the present invention can be variable. For example, the refresh rate is adjusted (adjusted in the range of 0.01 Hz to 240 Hz inclusive, for example) in accordance with contents displayed on the display device, whereby power consumption can be reduced. Moreover, driving with a lowered refresh rate that reduces the power consumption of the display device may be referred to as idling stop (IDS) driving.

The driving frequency of a touch sensor or a near touch sensor may be changed in accordance with the refresh rate described above. In the case where the refresh rate of the display device is 120 Hz, for example, the driving frequency of the touch sensor or the near touch sensor can be higher than 120 Hz (typically 240 Hz). With this structure, low power consumption can be achieved, and the response speed of the touch sensor or the near touch sensor can be increased.

To increase the emission luminance of the light-emitting device included in the pixel circuit, the amount of current fed through the light-emitting device needs to be increased. For this, it is necessary to increase the source—drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor in the pixel circuit, the amount of current flowing through the light-emitting device can be increased, so that the emission luminance of the light-emitting device can be increased.

When transistors operate in a saturation region, a change in source—drain current with respect to a change in gate—source voltage can be smaller in an OS transistor than in a Si transistor. Accordingly, when an OS transistor is used as the driving transistor in the pixel circuit, the amount of current flowing between the source and the drain can be set minutely by a change in gate—source voltage; hence, the amount of current flowing through the light-emitting device can be controlled. Accordingly, the number of gray levels in the pixel circuit can be increased.

Regarding saturation characteristics of current flowing when the transistor operates in a saturation region, the OS transistor can make current (saturation current) flow more stably than the Si transistor even when the source—drain voltage gradually increases. Thus, by using an OS transistor as the driving transistor, a stable current can be fed through a light-emitting device that contains an EL material even when the current—voltage characteristics of the light-emitting device vary, for example. In other words, when the OS transistor operates in the saturation region, the source—drain current hardly changes with an increase in the source—drain voltage; hence, the emission luminance of the light-emitting device can be stable.

As described above, with use of an OS transistor as a driving transistor included in the pixel circuit, it is possible to achieve "inhibition of black floating," "increase in emission luminance," "increase in gray level," "inhibition of variation in light-emitting devices," and the like.

Configuration Example of Pixel

FIG. 1A illustrates an example of a pixel Px of one embodiment of the present invention.

A pixel Px includes a pixel circuit 51 and a light-emitting element EL1. The pixel circuit 51 includes transistors Tr1 to Tr6 and a capacitor C1. In addition, the pixel Px is electrically connected to a wiring Vdata, a wiring Vdd, a wiring Vss, a wiring Vini, a wiring Vscan1, a wiring Vscan2, a wiring Vem1, and a wiring Vem2.

The transistors Tr1 to Tr6 are n-channel field-effect transistors. In addition, the transistors Tr1 to Tr6 are preferably enhancement (normally-off) n-channel field-effect transistors. Accordingly, their threshold voltage (also referred to as "Vth") is preferably higher than 0 V.

The light-emitting element EL1 includes a first electrode electrically connected to the wiring Vss and a second electrode electrically connected to the transistor Tr5.

The transistor Tr5 includes a first terminal electrically connected to the light-emitting element EL1, a second terminal electrically connected to the transistor Tr2 and the transistor Tr1, and a gate electrode electrically connected to the wiring Vem1. Here, the first terminal and the second terminal of a transistor refer to one and the other of a source and a drain of the transistor, for example.

The transistor Tr5 has a function of a switch determining whether a current flows through the light-emitting element EL1 or not.

The transistor Tr6 includes a first terminal electrically connected to the light-emitting element EL1, a second terminal electrically connected to the wiring Vini, and a gate electrode electrically connected to the wiring Vscan1.

The capacitor C1 includes a first electrode electrically connected to the light-emitting element EL1 and a second electrode electrically connected to the transistor Tr2.

Note that a node ND1 is a node where the second electrode of the light-emitting element EL1, the first terminal of the transistor Tr5, the first terminal of the transistor Tr6, and the first electrode of the capacitor C1 are electrically connected.

The transistor Tr2 includes a first terminal electrically connected to the transistor Tr5, a second terminal electrically connected to the transistor Tr3 and the transistor Tr4, and a gate electrode electrically connected to the capacitor C1.

The transistor Tr1 includes a first terminal electrically connected to the transistor Tr2 and the transistor Tr5, a second terminal electrically connected to the wiring Vdata, and a gate electrode electrically connected to the wiring Vscan2.

Note that a node ND3 is a node where the second terminal of the transistor Tr5, the first terminal of the transistor Tr2, and the second terminal of the transistor Tr1 are electrically connected.

The transistor Tr3 includes a first terminal, a second terminal, and a gate electrode. The gate electrode of the transistor Tr3 and the wiring Vscan1 are electrically connected. In addition, the first terminal of the transistor Tr3 is electrically connected to the gate electrode of the transistor Tr2, and the second terminal of the transistor Tr3 is electrically connected to the second terminal of the transistor Tr2. Thus, when the transistor Tr3 is turned on, the gate electrode of the transistor Tr2 and the second terminal can be brought into conduction.

Note that a node ND2 is a node where the gate electrode of the transistor Tr2, the second electrode of the capacitor C1, and the first terminal of the transistor Tr3 are electrically connected.

The transistor Tr4 includes a first terminal electrically connected to the transistor Tr2 and the transistor Tr3, a second terminal electrically connected to the wiring Vdd, and a gate electrode electrically connected to the wiring Vem2.

The second terminal of the transistor Tr2, the second terminal of the transistor Tr3, and the first terminal of the transistor Tr4 are electrically connected.

The transistor Tr2 has a function as a current control transistor for the light-emitting element EL1. That is, the transistor Tr2 has a function of controlling the amount of light emitted from the light-emitting element EL1. The transistor Tr2 is thus referred to as a driving transistor in some cases.

A transistor with extremely small hysteresis is used as the transistor Tr2 in the pixel circuit 51 of one embodiment of the present invention, thereby improving display quality of the display device even at low frame frequency.

As for a transistor with significantly large hysteresis, the threshold value of the transistor is changed by, for example, a voltage stress between the gate and source of the transistor.

If the transistor Tr2 has hysteresis characteristics, the threshold value of the transistor Tr2 might fluctuate during the period in which a current flows through the light-emitting element EL1. In particular, in the display portion, when the frame frequency of image display is low, the period from after image data is written to the pixel to the next frame is long, and accordingly a change in the luminance of the light-emitting element EL1 due to the fluctuation in the threshold value of the transistor Tr2 is easily viewed by the user of the display device.

The hysteresis of an OS transistor is extremely small. Accordingly, the use of an OS transistor as the driving transistor in the pixel circuit of one embodiment of the present invention can inhibit the change in the luminance of the light-emitting element EL1. In the pixel circuit of one embodiment of the present invention, the use of an OS transistor as the driving transistor can reduce variations in the values of current flowing through the light-emitting element EL1, thereby improving the display quality of the display device even at low frame frequency.

The hysteresis of one of the transistors included in the pixel circuit of one embodiment of the present invention is, for example, preferably less than or equal to 0.1 V, more preferably less than or equal to 0.05 V in an Id-Vg measurement in the case where reciprocating scanning is performed at Vg in the range of −15 V to +20 V inclusive. In addition, Vd in the Id-Vg measurement is, for example, higher than or equal to 0.01 V and lower than or equal to 10 V. The measurement interval between Vg measurements is 0.1 V, for example. In addition, a hold period shorter than or equal to one second may be set for each Vg measurement point, for example. Here, Id is the current between a source and a drain, Vd is the voltage between the source and the gate, and Vg corresponds to the voltage between the source and the gate. The channel length of a transistor used in the measurement is less than or equal to 100 μm, or less than or equal to 10 μm, for example. In addition, the channel width of the transistor used for the measurement is less than or equal to 100 μm, or less than or equal to 10 μm, for example.

Moreover, an OS transistor has a high breakdown voltage between its source and drain. The use of an OS transistor as a transistor included in the pixel circuit 51 enables stable operation even when the potential difference supplied to the wiring Vdd and the wiring Vss for the light-emitting element EL1 is large, and thus high reliability can be achieved. An OS transistor having high withstand voltage between its source and drain is preferably used as the transistor Tr2, in which case the current in the light-emitting element EL1 can be controlled with high accuracy even during the long-term use of the display device.

The wiring Vdata has a function of supplying a signal Vdata_1 corresponding to a video signal to the transistor Tr1. The wiring Vdata is referred to as a source line in some cases. The pixel circuit 51 has a function of supplying the node ND2 with a signal obtained by application of correction processing to the signal Vdata_1, by turning on the transistors Tr1, Tr2, and Tr3. The correction processing can inhibit variations in the threshold values of the transistors Tr2 from affecting the current flowing through the light-emitting element EL1. It can be said in some cases that, the pixel circuit 51 has a function of supplying the node ND2 with a potential in which the influence of the variations in the threshold values of the transistors Tr2 is canceled out.

Here, the variations in the threshold values of the transistors Tr2 indicate, for example, variations among a plurality of pixel circuits in the threshold values of the transistors Tr2 included in the pixel circuits 51.

The pixel circuit 51 has a function of retaining a potential supplied to the node ND2 by turning off the transistor Tr3. Since an oxide semiconductor used in a channel formation region of an OS transistor has a band gap greater than or equal to 2 eV, the off-state current is significantly low. With the use of an OS transistor as the transistor Tr3, leakage current in an off state can be extremely low, and accordingly a fluctuation in the potential of a signal supplied to the node ND2 can be extremely reduced.

Since when the frame frequency of image display on the display portion is low, the period from after image data is written to the pixel circuit to the next frame is long, the off-state leakage current of the transistor Tr3 leads to a large amount of fluctuation in the potential of the node ND2. Hence, when the frame frequency is low, in particular, a transistor with low off-state leakage current is preferably used as the transistor Tr3.

In the pixel circuit 51, the transistor Tr1 can be in an off state during the period from after a signal from the wiring Vdata is written to the next frame, for example. When the transistor Tr1 is in an off state, a current flowing through the wiring Vdata can be blocked in the pixel circuit 51, and the power consumption of the pixel circuit 51 and the power consumption of a circuit supplying a signal to the wiring Vdata can be reduced.

In the pixel circuit 51, for example, a potential corresponding to a signal from the wiring Vini is written to the node ND1 through the transistor Tr6, and then the transistor Tr6 can be in an off state until the next frame period. When the transistor Tr6 in an off state, a current flowing through the wiring Vini can be blocked, and the power consumption of the pixel circuit 51 and the power consumption of a circuit supplying a signal to the wiring Vini can be reduced.

Figure 1B:
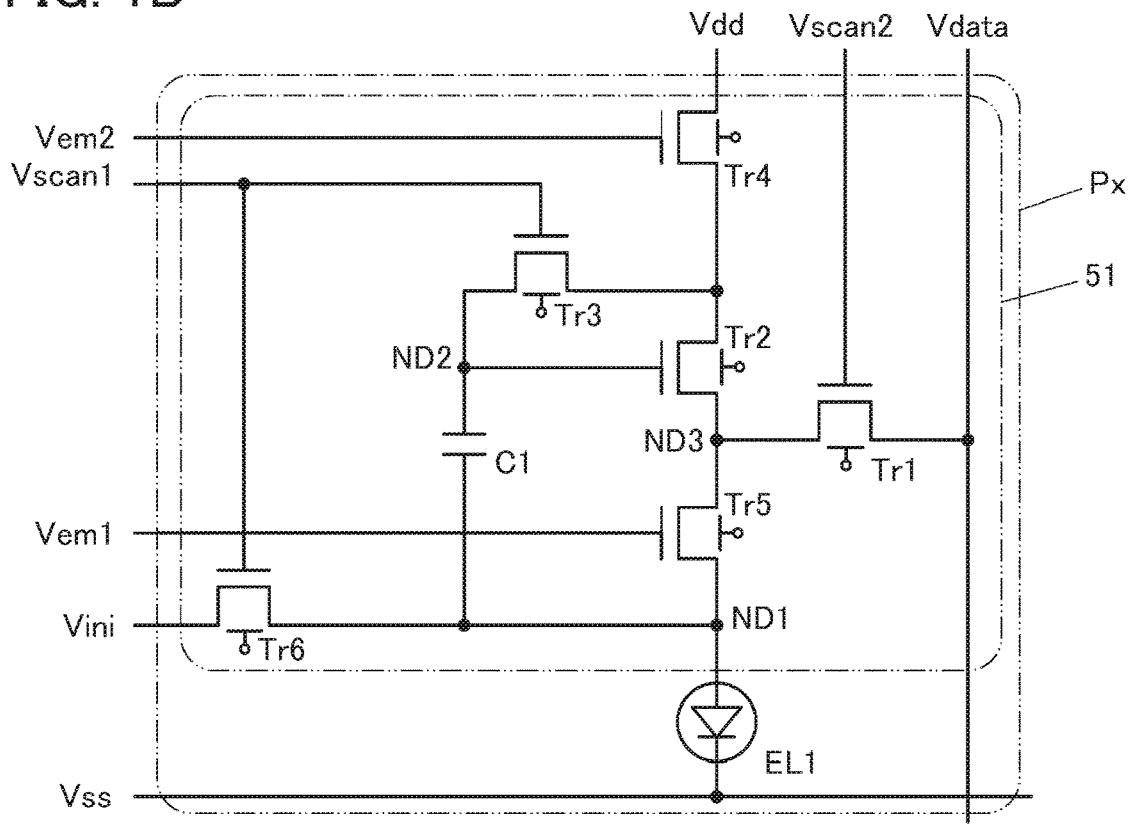

The transistors included in the pixel circuit 51 may each have a back gate. In particular, the OS transistor preferably has a back gate. FIG. 1B shows an example in which the transistors have back gates. The back gate can be supplied with the same signal as that of the gate.

Alternatively, the back gate can be supplied with the same signal as that of the source or the drain. When a signal is supplied to the back gate, for example, the threshold value of the transistor can be controlled.

Figure 2:
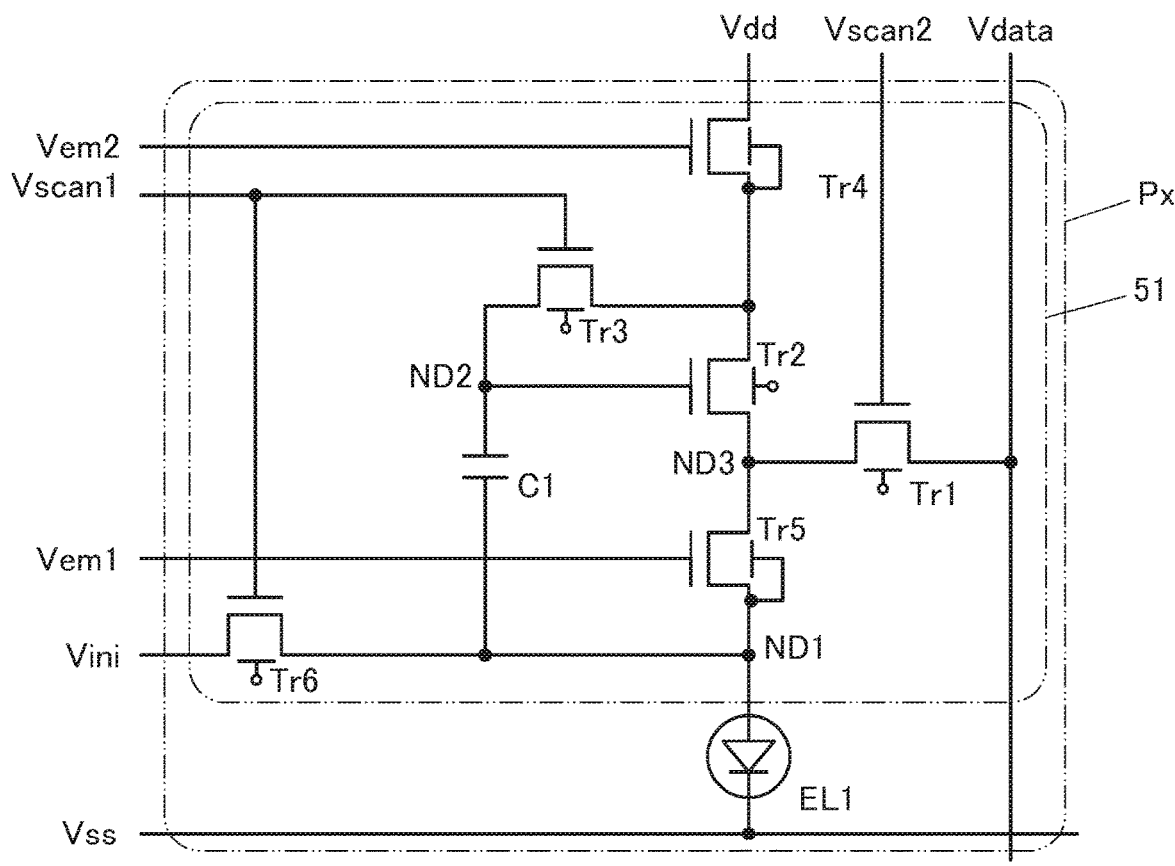
FIG. 2 is a diagram illustrating a configuration example of a pixel.

The back gate of a transistor may be electrically connected to the source or the drain of the transistor. In the pixel circuit 51 in the example shown in FIG. 2, the back gate of each of the transistor Tr4 and the transistor Tr5 is electrically connected to the corresponding one of the source and the drain. Electrical connection between the back gate of a transistor and the source or drain of the transistor can increase resistance to the application of a gate electric field of the transistor and improve reliability, for example.

An OS transistor has extremely higher field-effect mobility than amorphous silicon. In addition, the OS transistor has an extremely low leakage current between a source and a drain in an off state (hereinafter, also referred to as off-state current), and charge accumulated in a capacitor that is connected in series to the transistor can be held for a long period. Furthermore, power consumption of the display device can be reduced with an OS transistor.

The off-state current value per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10-24$ A). Note that the off-state current per micrometer of channel width of a transistor including silicon in a channel formation region (hereinafter, referred to as a Si transistor) at room temperature is higher than or equal to 1 fA ($1 \times 10^{-15}$ A) and lower than or equal to 1 pA ($1 \times 10^{-12}$ A). Therefore, the off-state current of an OS transistor is lower than that of a Si transistor by approximately ten orders of magnitude.

The off-state current of the OS transistor hardly increases even in a high-temperature environment. Specifically, the off-state current hardly increases even at an environment temperature higher than or equal to room temperature and lower than or equal to 200° C. Furthermore, the on-state current is unlikely to decrease even in the high-temperature environment. A display device including the OS transistor can operate stably and have high reliability even in a high-temperature environment.

As silicon included in a Si transistor, amorphous silicon and crystalline silicon (e.g., microcrystalline silicon and single crystal silicon) can be given.

As the light-emitting element EL1, an EL device such as an OLED (Organic Light Emitting Diode) and a QLED (Quantum-dot Light Emitting Diode) is preferably used. Examples of a light-emitting substance contained in the EL device include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescence (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting device in a high-luminance region can be inhibited. Note that the light-emitting element EL1 is not limited thereto and may be an inorganic EL element containing an inorganic material, a light-emitting diode, or the like. In addition, an LED (Light Emitting Diode) such as a micro-LED can also be used as the light-emitting device.

Operation Example of Pixel

Next, an example of the operation of the pixel Px illustrated in FIG. 1A is described with reference to FIG. 3A, FIG. 3B, FIG. 4A, and FIG. 4B. In the operation example described below, the potentials of the node ND1, the node ND2, and the node ND3 are denoted by, respectively, a potential VND 1, a potential $V_{ND2}$, and a potential $V_{ND3}$ in FIG. 3B, FIG. 4A, FIG. 4B, and the like in some cases.

Figure 3A:
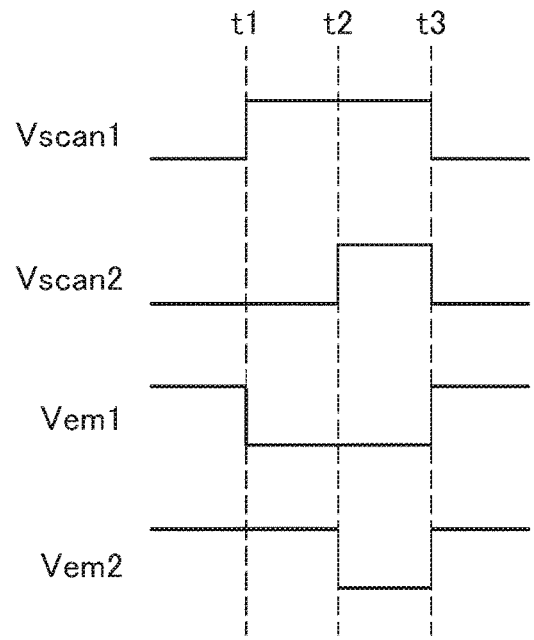
FIG. 3A is a timing chart showing an operation example of a pixel.

FIG. 3A is a timing chart illustrating an example of an operation of the pixel Px. Note that in the following description, unless otherwise specified, all the transistors included in the pixel are n-channel transistors; however, the following description can also apply to the case where some or all of the transistors are p-channel transistors when a high potential and a low potential are interchanged as necessary, for example.

<Initialization Operation>

At Time t1, a high potential signal H is first supplied to the wiring Vscan1 and the wiring Vem2, and a low potential signal L is supplied to the wiring Vscan2 and the wiring Vem1.

The transistor Tr1 and the transistor Tr5 are in an off state.

Figure 3B:
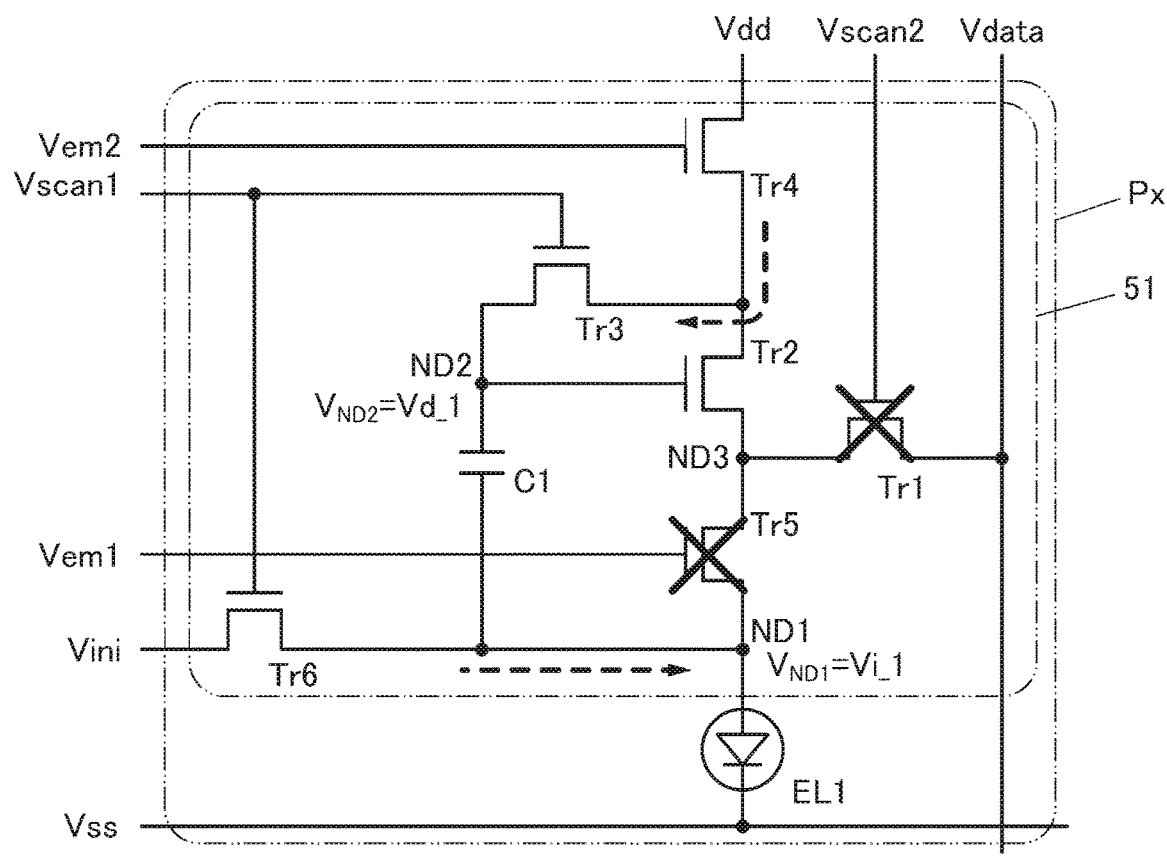
FIG. 3B is a diagram illustrating a configuration example of a pixel.

The transistor Tr6 is turned on and a potential Vi_1 is supplied to the node ND1 from the wiring Vini (FIG. 3B).

The transistor Tr3 and the transistor Tr4 are turned on and a potential Vd 1 is supplied to the node ND2 from the wiring Vdd (FIG. 3B).

<Threshold Value Compensation Operation>

Next, at Time t2, a high potential signal is supplied to the wiring Vscan1 and the wiring Vscan2, and the low potential signal L is supplied to the wiring Vem1 and the wiring Vem2.

The transistor Tr4 is turned off. In addition, the transistor Tr5 continuously remains in an off state.

Figure 4A:
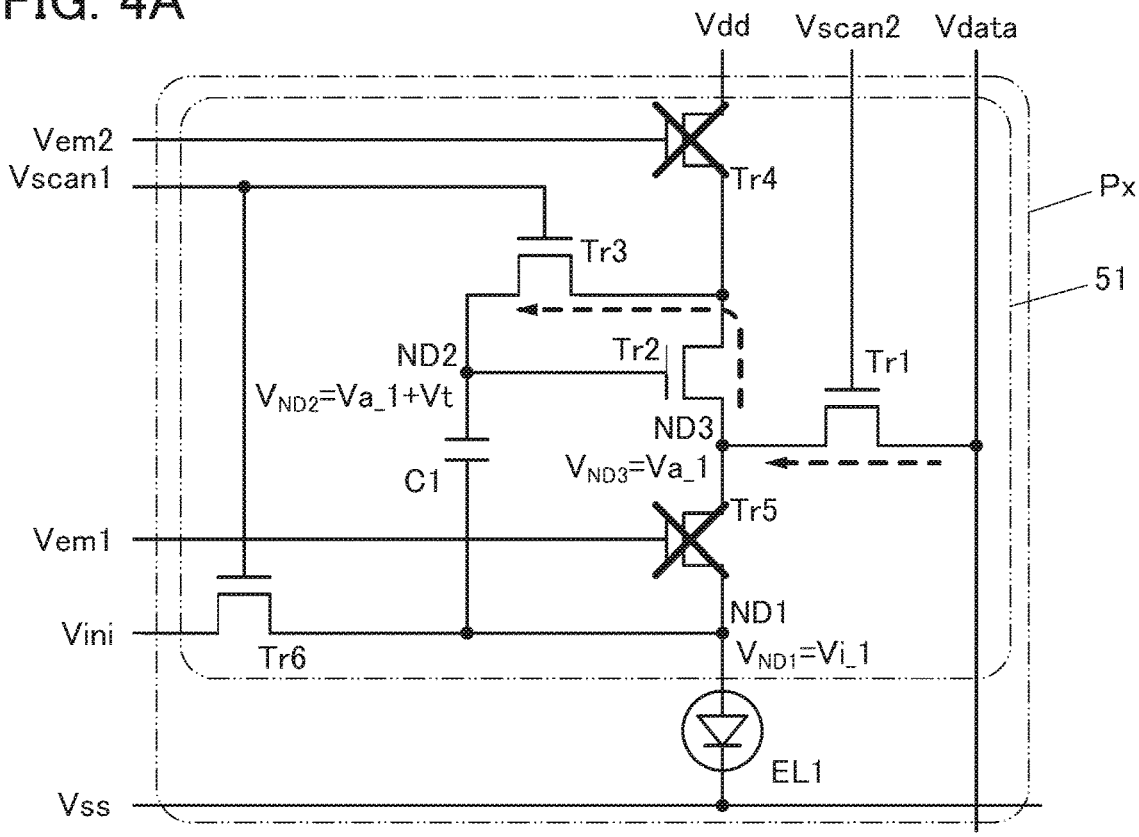
FIG. 4A is a diagram illustrating a configuration example of a pixel.

The transistor Tr6 continuously remains in an on state and the potential Vi_1 is retained in the node ND1 (FIG. 4A).

The transistor Tr1 is turned on, and a potential Va_1 is supplied to the node ND3 from the wiring Vdata through the transistor Tr1 (FIG. 4A).

The transistor Tr3 continuously remains in an on state. In addition, since the potential Vd 1 is supplied to the node ND2, the transistor Tr2 also continuously remains in an on state.

In accordance with a change in the potential of the node ND3, the potential of the node ND2 changes, and the node ND2 is supplied with the sum (potential (Va_1+Vt)) of the potential of the node ND3 (potential Va_1) and the threshold value of the transistor Tr2 (potential Vt) (FIG. 4A).

In each of a plurality of pixels included in the display portion, the threshold value of the transistor Tr2 is obtained and a potential corresponding to the threshold value of the transistor Tr2 is supplied between the gate and source of the transistor Tr2; consequently, the variations in the threshold values of the transistors among the pixels can be corrected. Note that the operation of obtaining the threshold value of the transistor Tr2 is referred to as "threshold value compensation operation" in some cases.

<Light Emission Operation>

Next, at Time t3, a high potential signal is supplied to the wiring Vem1 and the wiring Vem2, and the low potential signal L is supplied to the wiring Vscan1 and the wiring Vscan2.

The transistor Tr1 is turned off and the node ND3 is electrically disconnected from the wiring Vdata. The transistor Tr6 is turned off and the node ND1 is electrically disconnected from the wiring Vini.

The transistor Tr3 is turned off and the potential of the node ND2 is retained.

Figure 4B:
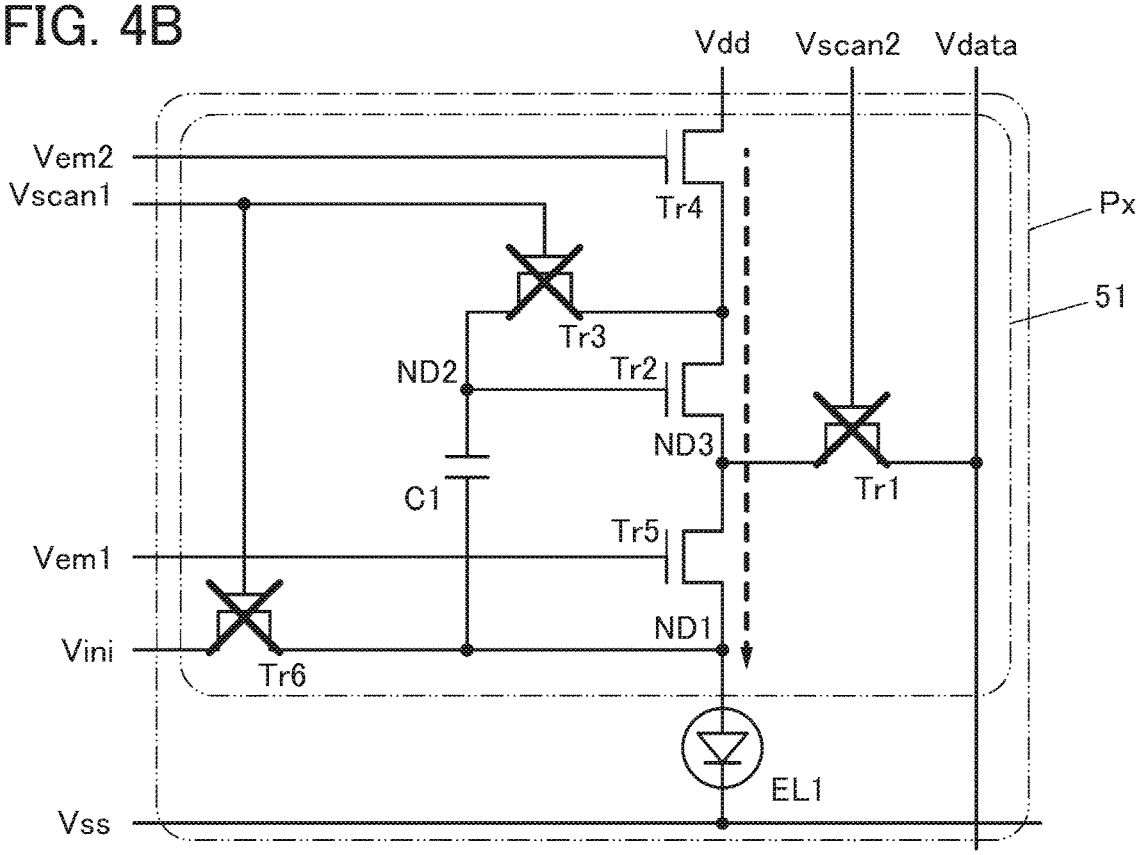
FIG. 4B is a diagram illustrating a configuration example of a pixel.

The transistor Tr4, the transistor Tr2, and the transistor Tr5 are turned on and a current flows through the light-emitting element EL1 (FIG. 4B). The channel length, the channel width, the material and thickness of the gate insulating film, the material used for the channel formation region, and the like of each of the transistor Tr2, the transistor Tr4, and the transistor Tr5 are determined such that the current flowing through the light-emitting element EL1 are controlled mainly depending on the current drive capability of the transistor Tr2.

Since the variations in the threshold values of the transistors Tr2 are corrected in the plurality of pixels included in the display portion and luminance variations attributable to the variations in transistor characteristics can therefore be reduced, the display device of one embodiment of the present invention can achieve excellent display quality.

<Quenching Operation>

The light-emitting element EL1 can continuously emit light during one frame period. Such a driving method is also referred to as a "hold type" or "hold-type driving." When the hold-type driving is used as a driving method of a display device, a flicker phenomenon or the like on a display screen can be reduced. However, the hold-type driving is likely to cause an afterimage, an image blur, and the like in moving image display. The resolution that is perceived by a person in displaying moving images is also referred to as "moving image resolution." Thus, the hold-type driving tends to reduce the moving image resolution.

Furthermore, "black insertion driving," which solves an afterimage, an image blur, and the like in moving image display, is known. The "black insertion driving" is also referred to as a "pseudo impulsive type" or "pseudo impulsive driving." The black insertion driving is a driving method in which black display is performed in every other frame or black display is performed for a certain period in one frame.

The transistor Tr5 can be turned off by supplying a low potential signal to the wiring Vem1 electrically connected to the gate electrode of the transistor Tr5. With the transistor Tr5 in an off state, the current in the light-emitting element EL1 is stopped and black insertion can be performed.

When a still image is displayed at reduced frame frequency, black insertion driving is performed in some cases in such a manner that only the transistor Tr5 is controlled at high speed and the current flowing in the light-emitting element EL1 is periodically blocked at high frequency.

Here, for example, the case where the frame frequency is 1 Hz is described. A high potential signal and a low potential signal are supplied to the wiring Vem1 electrically connected to the gate electrode of the transistor Tr5 at a frequency higher than 1 Hz, which is a frequency of 60 Hz here, for example, whereby black display can be inserted at a cycle of 60 Hz in one frame period. Even in the case where the frame frequency is low and one frame period is long, black insertion driving at high frequency can make a change in luminance in one frame period less visible.

With the use of an OS transistor as the transistor Tr2, the hysteresis of the transistor Tr2 is extremely small and a change in luminance can be kept small when the frame frequency is low as in still image display, whereby excellent display quality can be achieved in some cases even without high-speed black insertion driving using the transistor Tr5. Thus, during the period in which a still image is displayed, a circuit portion supplying a signal to the wiring Vem1 electrically connected to the gate electrode of the transistor Tr5 can be stopped, and accordingly the power consumption of the driver circuit can further be reduced.

[Transistor]

An oxide semiconductor that can be used for the OS transistor is described below. For example, a metal oxide described below can be used as the oxide semiconductor for the OS transistor.

The metal oxide included in the OS transistor preferably contains at least indium or zinc. The metal oxide further preferably contains indium and zinc. The metal oxide preferably contains indium, an element M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, the element M is preferably one or more kinds selected from gallium, aluminum, yttrium, and tin, and is further preferably gallium.

The composition of the metal oxide greatly affects the electrical characteristics and reliability of a transistor. For example, the indium content in the metal oxide is preferably high, in which case a transistor having a high on-state current can be achieved in some cases.

For example, the content of the element M in a metal oxide is preferably high, in which case the band gap of the metal oxide increases and a transistor with much lower off-state leakage current can be achieved in some cases.

An OS transistor can be suitably used as the transistor Tr2. In particular, an OS transistor in which the content of indium in a metal oxide is high can be suitably used as the transistor Tr2.

The transistor Tr2 has a function of controlling the driving current of the light-emitting element EL1. The use of an OS transistor in which the content of indium in a metal oxide is high as the transistor Tr2 can improve the current drive capability of the transistor Tr2, thereby sufficiently responding to an increased luminance of the light-emitting element EL1.

As the transistor Tr3, the transistor Tr6, and the transistor Tr1, OS transistors can be used suitably. As the transistor Tr3, the transistor Tr6, and the transistor Tr1, OS transistors in which the content of the element M in a metal oxide is high can be suitably used, in particular.

When the transistor Tr3 is in an off state, the transistor Tr3 has a function of retaining the potential supplied to the gate electrode of the transistor Tr2. When the off-state leakage current of the transistor Tr3 is high, for example, the leakage current might lower the potential of the gate electrode of the transistor Tr2 and lower the luminance of the light-emitting element EL1. As the transistor Tr3, thus, a transistor with a low off-state leakage current is preferably used.

The transistor Tr6 and the transistor Tr1 are electrically connected to the wiring Vini and the wiring Vdata, respectively. Thus, when the off-state leakage current of the transistor Tr6 and the transistor Tr1 is high, for example, part of the current flowing through the light-emitting element EL1 might leak to the wiring Vini and the wiring Vdata and cause a fluctuation in luminance. As the transistor Tr6 and the transistor Tr1, thus, transistors with a low off-state leakage current are preferably used.

As the transistor Tr3, the transistor Tr6, and the transistor Tr1, Si transistors may be used.

As the transistor Tr4 and the transistor Tr5, Si transistors can be suitably used, and in particular, transistors including crystalline silicon in channel formation regions can be suitably used. As the transistor Tr4 and the transistor Tr5, OS transistors can be suitably used, and in particular, OS transistors in which the indium content in a metal oxide is high can be suitably used.

The transistor Tr4 and the transistor Tr5 preferably have sufficient current drive capability so as not to limit the amount of current of the transistor Tr2. Thus, as the transistor Tr4 and the transistor Tr5, transistors including crystalline silicon (e.g., microcrystalline silicon and single crystal silicon) in channel formation regions can be suitably used. As a transistor including polycrystalline silicon, for example, a transistor including low temperature polysilicon (LTPS (Low Temperature Poly Silicon)) can be used.

When OS transistors are used as the transistor Tr4 and the transistor Tr5, the indium content in the metal oxide is preferably increased to improve the current drive capability of the OS transistors.

Details of the metal oxide that can be used in an OS transistor will be described later.

Configuration Example 2 of Pixel

Figure 5A:
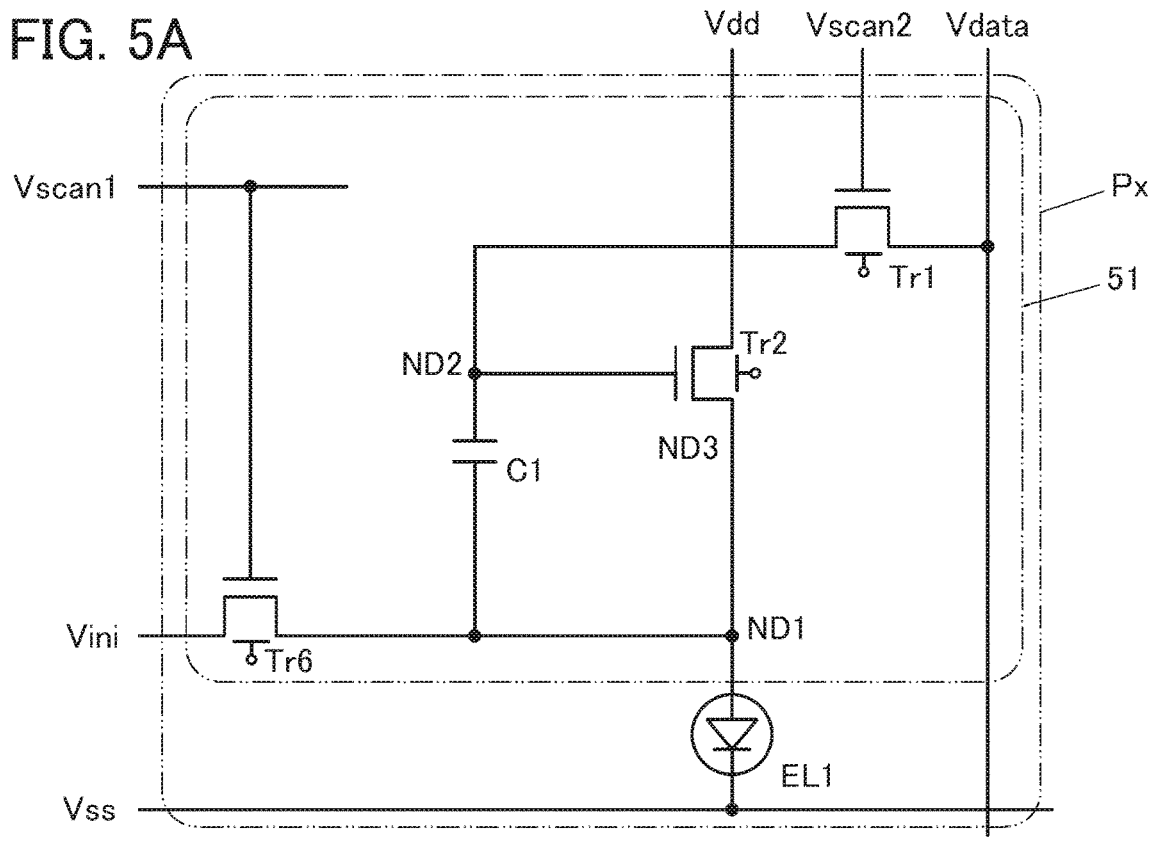
FIG. 5A and FIG. 5B are diagrams each illustrating a configuration example of a pixel.

FIG. 5A illustrates a configuration example of the pixel. The pixel circuit Px illustrated in FIG. 5A includes the pixel circuit 51 and the light-emitting element EL1. The pixel circuit 51 includes the transistors Tr1, Tr2, and Tr6 and the capacitor C1.

In FIG. 5A, the first terminal of the transistor Tr2 is electrically connected to the light-emitting element EL1 and the second terminal is electrically connected to the wiring Vdd. The first terminal of the transistor Tr1 is electrically connected to the wiring Vdata, and the second terminal is electrically connected to the gate of the transistor Tr2.

An OS transistor can be suitably used as the transistor Tr2. In particular, an OS transistor in which the content of indium in a metal oxide is high can be suitably used as the transistor Tr2.

As the transistor Tr6 and the transistor Tr1, OS transistors can be used suitably. As the transistor Tr6 and the transistor Tr1, OS transistors in which the content of the element M in a metal oxide is high can be suitably used, in particular.

An OS transistor in which the content of indium in a metal oxide is high can be suitably used as the transistor Tr6. With the use of an OS transistor in which the content of indium in a metal oxide is high as the transistor Tr6, a display device with high display quality even for display at high frequency can be achieved.

Figure 5B:
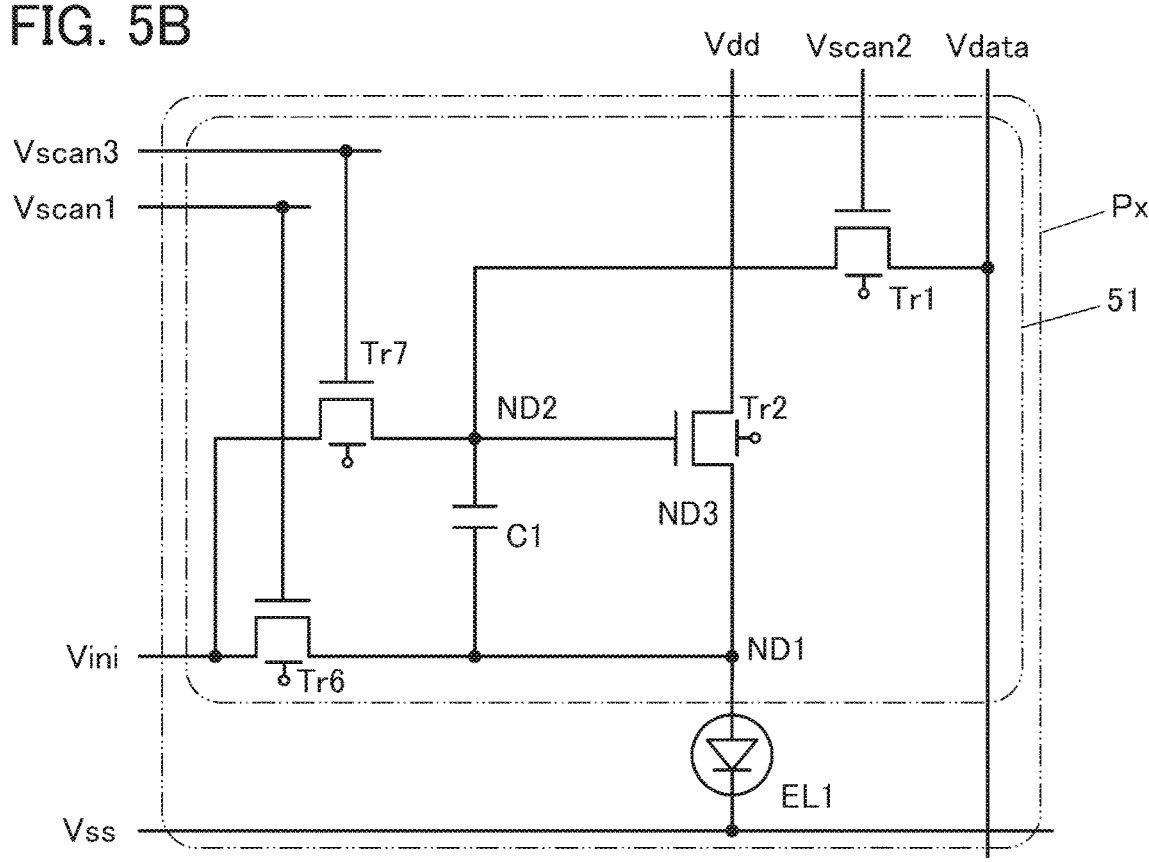

A configuration example of a pixel shown in FIG. 5B is different from that in FIG. 5A in that a transistor Tr7 is included.

The transistor Tr7 includes a gate electrode electrically connected to a wiring Vscan3, a first terminal electrically connected to the wiring Vini, and a second terminal electrically connected to the gate of the transistor Tr2 and the second electrode of the capacitor C1. An OS transistor can be suitably used as the transistor Tr7. An OS transistor including a metal oxide in which the content of the element M in a metal oxide is high can be suitably used as the transistor Tr7. Alternatively, an OS transistor in which the content of indium in a metal oxide is high can be suitably used as the transistor Tr7.

[Display Device]

A configuration example of a display device using the pixel of one embodiment of the present invention is described.

Figure 6:
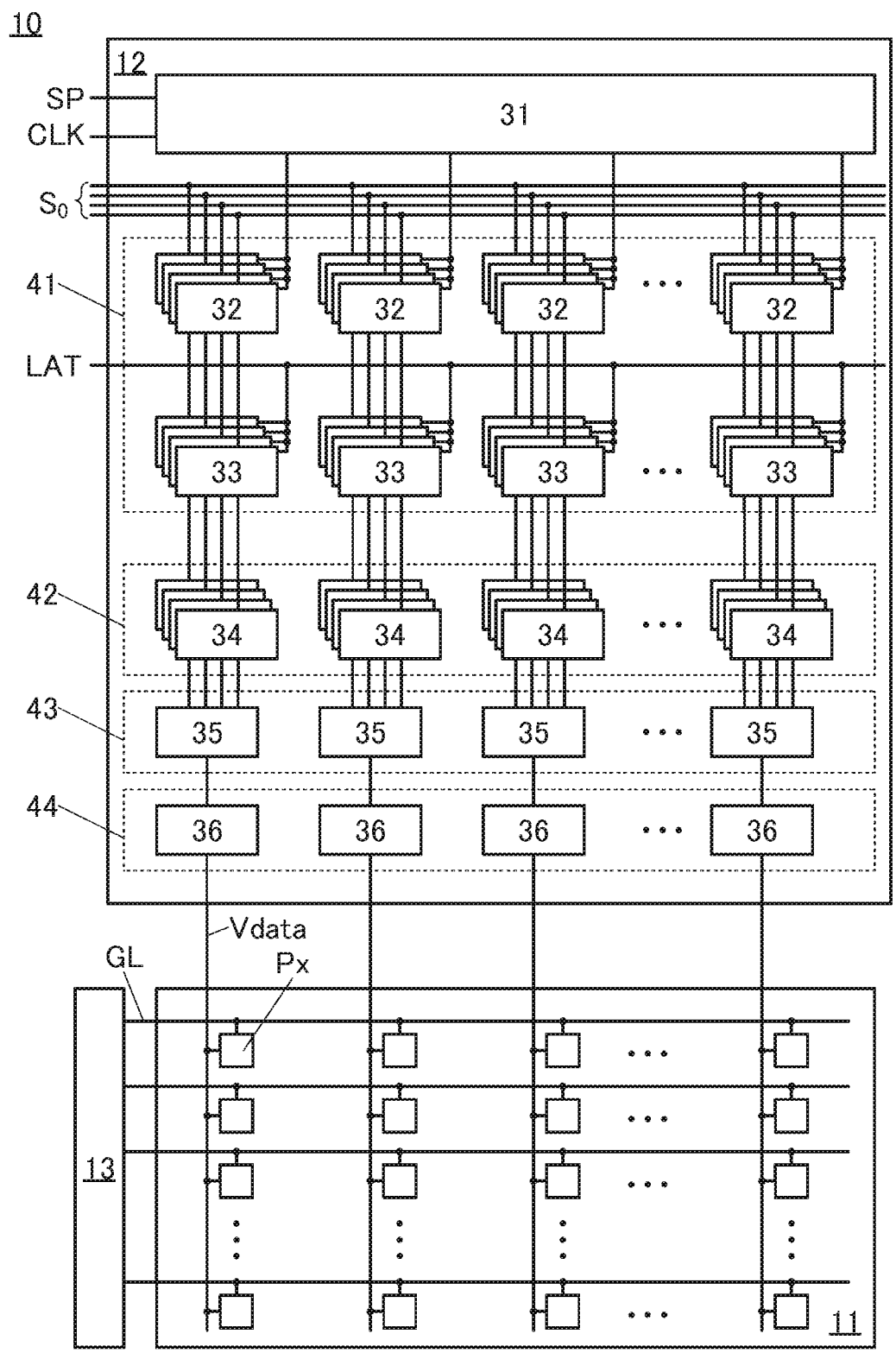
FIG. 6 is a diagram illustrating a configuration example of a display device.

FIG. 6 illustrates a block diagram of a display device 10. The display device 10 includes a display portion 11, a first driver circuit 12, and a second driver circuit 13.

In the display portion 11, a plurality of pixels Px are arranged in a matrix. Each of the pixels include at least a display element and a transistor. An organic EL element, a liquid crystal element, or the like can be typically used as the display element.

The first driver circuit 12 includes a circuit functioning as a source driver. The first driver circuit 12 has a function of generating a gray level signal based on a video signal input from the outside and supplying the signal to a pixel included in the display portion 11.

The second driver circuit 13 includes a circuit functioning as a gate driver. The second driver circuit 13 has a function of generating a selection signal based on a signal input from the outside and supplying the signal to a pixel included in the display portion 11.

As the pixel Px included in the display portion 11, the pixel Px described above is preferably used.

For the first driver circuit 12, an OS transistor or the like can be used. Since high-speed switching operation is required in a source driver or a demultiplexer circuit, an OS transistor using a metal oxide with a high indium content in a semiconductor layer is preferably used as an OS transistor used for the second driver circuit 13.

For the first driver circuit 12, a transistor including silicon in a channel formation region can be used. The first driver circuit 12 may include both an OS transistor and a Si transistor as transistors.

For the second driver circuit 13, an OS transistor or the like can be used. The gate driver does not require switching operation with high response speed compared with the source driver, the demultiplexer driver circuit, or the like. Thus, a transistor that has a lower off-state current and stability as the OS transistor is used; for example, an OS transistor in which a metal oxide with a high content of the element M is used in a semiconductor layer can be used for the second driver circuit 13.

For the second driver circuit 13, a transistor including silicon in a channel formation region can be used. The second driver circuit 13 may include both an OS transistor and a Si transistor as transistors.

As needed, an OS transistor using a metal oxide with a high indium content in a semiconductor layer may be used for the second driver circuit 13 and an OS transistor using a metal oxide with a high content of the element M in a semiconductor layer may be used for the first driver circuit 12.

In the display portion 11, a plurality of wirings Vdata connected to the first driver circuit 12 and a plurality of wirings GL connected to the second driver circuit 13 are provided. Each wiring Vdata has a function as a source line, for example. Each wiring GL has a function as a gate line, for example.

Structure Example of First Driver Circuit

A more specific cross-sectional structure example of the first driver circuit 12 included in the display device 10 is described below.

The first driver circuit 12 includes a shift register circuit 31, a latch circuit portion 41, a level shifter circuit portion 42, a D/A converter portion 43, an analog buffer circuit portion 44, and the like.

The latch circuit portion 41 includes a plurality of latch circuits 32 and a plurality of latch circuits 33. The level shifter circuit portion 42 includes a plurality of level shifter circuits 34. The D/A converter portion 43 includes a plurality of DAC circuits 35. The analog buffer circuit portion 44 includes a plurality of analog buffer circuits 36.

A clock signal CLK and a start pulse signal SP are input to the shift register circuit 31. The shift register circuit 31 generates a timing signal whose pulse sequentially shifts in accordance with the clock signal CLK and the start pulse signal SP, and outputs the timing signal to each of the latch circuits 32 in the latch circuit portion 41.

A video signal $S_O$ and a latch signal LAT are input to the latch circuit portion 41.

When timing signals are input to the latch circuits 32, the video signals $S_O$ are sampled in response to pulse signals in the timing signals and sequentially written to the latch circuits 32. A period until writing of the video signals $S_O$ to the latch circuits 32 is briefly completed can be referred to as a line period.

When one line period is completed, the video signals held in the latch circuits 32 are written to the latch circuits 33 all at once and held in accordance with a pulse of the latch signal LAT input to each of the latch circuits 33. To the latch circuits 32 that have finished sending the video signals to the latch circuits 33, the next video signals are sequentially written again in accordance with timing signals from the shift register circuit 31. In this second line period, the video signals that have been written to and held in the latch circuits 33 are output to the level shifter circuits 34 in the level shifter circuit portion 42.

When the video signals are input to the level shifter circuits 34 in the level shifter circuit portion 42, the voltage amplitudes of the signals are amplified by the level shifter circuits 34, and then sent to the DAC circuits 35 in the D/A converter portion 43. A group of video signals input to each of the DAC circuits 35 are converted into an analog signal, which is output to the analog buffer circuit portion 44. The video signal input to the analog buffer circuit portion 44 is output to each wiring Vdata through each of the analog buffer circuits 36.

The second driver circuit 13 selects the wirings GL sequentially. The video signal input from the first driver circuit 12 to the display portion 11 through the wiring Vdata is input to each of the pixels Px connected to the wiring GL selected by the second driver circuit 13.

Note that another circuit that can output a signal whose pulse sequentially shifts may be used instead of the shift register circuit 31.

Variation Example of First Driver Circuit

The first driver circuit 12 illustrated in FIG. 6 has a structure in which a digital signal is converted into an analog signal to be output to the display portion 11; the use of an analog signal as an input signal further simplifies the structure of the first driver circuit 12.

Figure 7A:
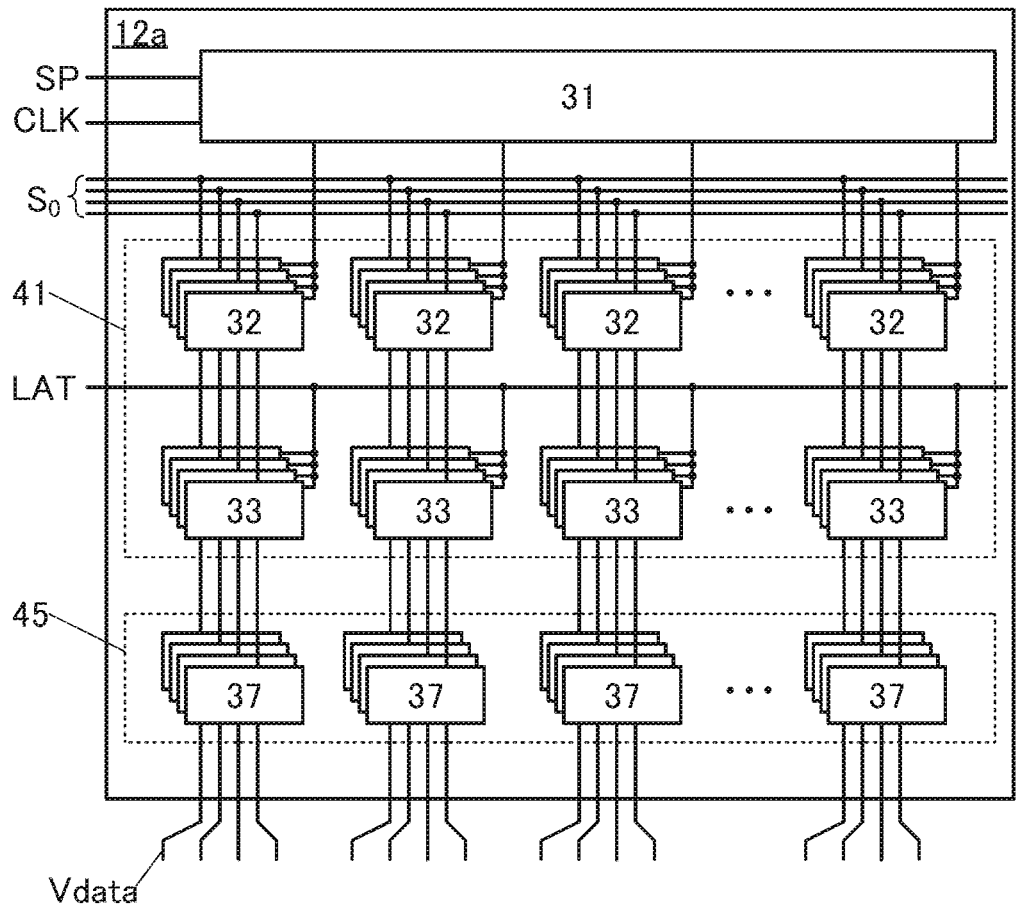
FIG. 7A and FIG. 7B are diagrams each illustrating a configuration example of a display device.

A first driver circuit 12a illustrated in FIG. 7A includes the shift register circuit 31, the latch circuit portion 41, and a source follower circuit portion 45. The source follower circuit portion 45 includes a plurality of source follower circuits 37.

In the latch circuits 32, analog video signals $S_0$ are sampled as analog data in response to timing signals from the shift register circuit 31. The latch circuits 32 output video signals held in the latch circuits 33 all at once in accordance with the latch signal LAT.

The video signals held in the latch circuits 33 are output to one of the wirings Vdata through the source follower circuit 37. Note that the aforementioned analog buffer circuit may be used instead of the source follower circuit 37.

Figure 7B:
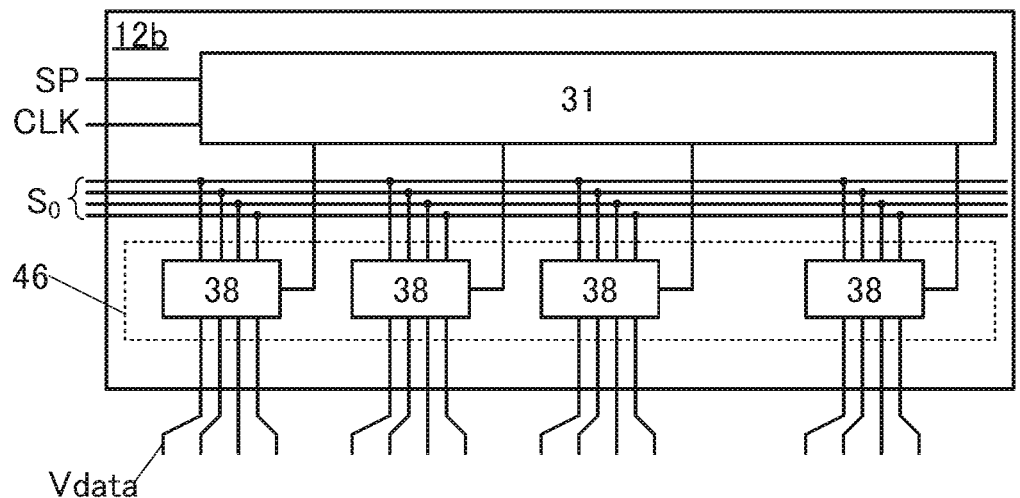

The first driver circuit 12b illustrated in FIG. 7B includes the shift register circuit 31 and a demultiplexer circuit 46.

The demultiplexer circuit 46 includes a plurality of sampling circuits 38. Each sampling circuit 38 receives a plurality of analog video signals $S_0$ from a plurality of wirings and outputs video signals to a plurality of wirings Vdata at a time in response to a timing signal input from the shift register circuit 31. The shift register circuit 31 outputs timing signals so as to sequentially select a plurality of sampling circuits 38.

For example, in the case where 2160 wirings Vdata are connected to the display portion 11 and video signals $S_0$ are supplied from 54 wirings, 40 sampling circuits 38 are provided in the demultiplexer circuit 46, so that one line period can be divided into 40 periods and video signals can be output to 54 wirings Vdata at a time in each period.

Here, an OS transistor may be used for the demultiplexer circuit 46 and a Si transistor may be used for the shift register circuit 31. For example, the case where transistors including single crystal silicon are used for the shift register circuit 31 and OS transistors are used for the demultiplexer circuit 46 and the display portion 11 is considered. The OS transistors can be stacked over the transistors including single crystal silicon, for example.

The above case is preferred because it is possible to reduce the number of wirings that extend from a layer in which the Si transistors included in the shift register circuit 31 are provided to a layer in which the OS transistors included in the demultiplexer circuit 46 and the display portion 11 are provided.

The above is the description of the first driver circuit portion.

[Metal Oxide]

The composition of the metal oxide that can be used for a semiconductor layer of a transistor in one embodiment of the present invention is described. Note that the composition of the metal oxide is rephrased as the composition of the semiconductor layer in some cases.

The metal oxide preferably contains at least indium or zinc. Note that the metal oxide further preferably contains indium and zinc. A metal oxide preferably contains indium, an element M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example.

Examples of the applicable metal oxide include indium oxide, indium zinc oxide (In—Zn oxide), indium tin oxide (In—Sn oxide), indium titanium oxide (In—Ti oxide), indium aluminum zinc oxide (In—Al—Zn oxide, also referred to as IAZO), indium tin zinc oxide (In—Sn—Zn oxide), indium titanium zinc oxide (In—Ti—Zn oxide), indium gallium zinc oxide (In—Ga—Zn oxide, also referred to as IGZO), indium gallium tin zinc oxide (In—Ga—Sn—Zn oxide), and indium gallium aluminum zinc oxide (In—Ga—Al—Zn oxide, also referred to as IGAZO or IAGZO). Alternatively, indium tin oxide containing silicon, or the like can also be used.

In particular, the element M is preferably one or more kinds selected from gallium, aluminum, yttrium, and tin, and the element M is further preferably gallium. In this specification and the like, a metal oxide containing indium, the element M, and zinc is referred to as In-M-Zn oxide in some cases.

The composition of the semiconductor layer significantly affects the electrical characteristics and reliability of the transistor.

<Content of Indium>

Higher content of indium in the semiconductor layer enables the transistor to have a high on-state current.

In this specification and the like, the ratio of the number of indium atoms to the number of atoms of the metal elements contained is sometimes referred to as indium content. The same applies to other metal elements.

Higher indium content in the semiconductor layer enables the transistor to have a high on-state current. By using such a transistor as a transistor required to have a high on-state current, a display device having excellent electrical characteristics can be provided.

In the case where an In—Zn oxide is used for the semiconductor layer, the indium content can be increased by using a metal oxide in which the atomic ratio of indium is higher than or equal to the number of atoms of zinc. For example, a metal oxide in which the atomic ratio between metal elements is In:Zn=1:1, In:Zn=2:1, In:Zn=3:1, In:Zn=4:1, In:Zn=5:1, In:Zn=7:1, or In:Zn=10:1, or the vicinity thereof can be used.

In the case where an In—Sn oxide is used for the semiconductor layer, the indium content can be increased by using a metal oxide in which the atomic ratio of indium is higher than or equal to the number of atoms of tin. For example, it is possible to use a metal oxide in which the atomic ratio of metal elements is In:Sn=1:1, In:Sn=2:1, In:Sn=3:1, In:Sn=4:1, In:Sn=5:1, In:Sn=7:1, or In:Sn=10:1, or in the neighborhood thereof.

In the case where an In—Sn—Zn oxide is used for the semiconductor layer, the indium content can be increased by using a metal oxide in which the atomic ratio of indium is higher than the number of atoms of tin. It is further preferable to use a metal oxide in which the atomic ratio of zinc higher than that of tin. For example, it is possible to use a metal oxide in which the atomic ratio of metal elements is In:Sn:Zn=2:1:3, In:Sn:Zn=3:1:2, In:Sn:Zn=4:2:3, In:Sn:Zn=4:2:4.1, In:Sn:Zn=5:1:3, In:Sn:Zn=5:1:6, In:Sn:Zn=5:1:7, In:Sn:Zn=5:1:8, In:Sn:Zn=6:1:6, In:Sn:Zn=10:1:3, In:Sn:Zn=10:1:6, In:Sn:Zn=10:1:7, In:Sn:Zn=10:1:8, In:Sn:Zn=5:2:5, In:Sn:Zn=10:1:10, In:Sn:Zn=20:1:10, or In:Sn:Zn=40:1:10, or in the neighborhood thereof.

In the case where an In—Al—Zn oxide is used for the semiconductor layer, the indium content can be increased by using a metal oxide in which the atomic ratio of indium is higher than the number of atoms of aluminum. It is further preferable to use a metal oxide in which the atomic ratio of zinc is higher than that of aluminum. For example, it is possible to use a metal oxide in which the atomic ratio of metal elements is In:Al:Zn=2:1:3, In:Al:Zn=3:1:2, In:Al:Zn=4:2:3, In:Al:Zn=4:2:4.1, In:Al:Zn=5:1:3, In:Al:Zn=5:1:6, In:Al:Zn=5:1:7, In:Al:Zn=5:1:8, In:Al:Zn=6:1:6, In:Al:Zn=10:1:3, In:Al:Zn=10:1:6, In:Al:Zn=10:1:7, In:Al:Zn=10:1:8, In:Al:Zn=5:2:5, In:Al:Zn=10:1:10, In:Al:Zn=20:1:10, or In:Al:Zn=40:1:10, or in the neighborhood thereof.

In the case where an In—Ga—Zn oxide is used for the semiconductor layer, the indium content can be increased by using a metal oxide in which the atomic ratio of indium to the number of atoms of the metal elements is higher than the number of atoms of gallium. It is further preferable to use a metal oxide in which the atomic ratio of zinc is higher than gallium. For example, a metal oxide having any of the following atomic ratios of metal elements can be used as the semiconductor layer: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, and a neighborhood thereof.

In the case where an In-M-Zn oxide is used for the semiconductor layer, the indium content can be increased by using a metal oxide in which the atomic ratio of indium to the number of atoms of the metal elements is higher than the number of atoms of the element M. It is further preferable to use a metal oxide in which the atomic ratio of zinc is higher than the element M. For example, a metal oxide having any of the following atomic ratios of metal elements can be used as the semiconductor layer: In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=10:1:3, In:M:Zn=10:1:6, In:M:Zn=10:1:7, In:M:Zn=10:1:8, In:M:Zn=5:2:5, In:M:Zn=10:1:10, In:M:Zn=20:1:10, In:M:Zn=40:1:10, or a neighborhood thereof.

In the case where a plurality of metal elements are contained as the element M, the atomic ratio of the sum of the metal elements can be the atomic ratio of the element M. In In—Ga—Al—Zn oxide where gallium and aluminum are contained as the element M, for example, the atomic ratio of the sum of gallium and aluminum can be the atomic ratio of the element M. The atomic ratio of indium to the element M to zinc is preferably within the ranges given above.

In the semiconductor layer, the indium content can be increased by using a metal oxide in which the ratio of the number of indium atoms to the number of atoms of the metal elements contained is higher than or equal to 30 atomic % and lower than or equal to 100 atomic %, preferably higher than or equal to 30 atomic % and lower than or equal to 95 atomic %, further preferably higher than or equal to 35 atomic % and lower than or equal to 95 atomic %, further preferably higher than or equal to 35 atomic % and lower than or equal to 90 atomic %, further preferably higher than or equal to 40 atomic % and lower than or equal to 90 atomic %, further preferably higher than or equal to 45 atomic % and lower than or equal to 90 atomic %, further preferably higher than or equal to 50 atomic % and lower than or equal to 80 atomic %, further preferably higher than or equal to 60 atomic % and lower than or equal to 80 atomic %, further preferably higher than or equal to 70 atomic % and lower than or equal to 80 atomic %. For example, when an In—Ga—Zn oxide is used for the semiconductor layer, the ratio of the number of indium atoms to the total number of the atoms of indium, the element M, and zinc is preferably within the ranges given above.

<Reliability of Transistor>

One of indicators of evaluating the reliability of a transistor is a GBT (Gate Bias Temperature) stress test in which a state of applying an electric field to a gate is maintained. Among GBTs, a test in which a state where a positive potential (positive bias) relative to a source potential and a drain potential is supplied to a gate is maintained at high temperatures is referred to as a PBTS (Positive Bias Temperature Stress) test, and a test in which a state where a negative potential (negative bias) is supplied to a gate is maintained at high temperatures is referred to as an NBTS (Negative Bias Temperature Stress) test. The PBTS test and the NBTS test conducted in a state where irradiation is performed are respectively referred to as a PBTIS (Positive Bias Temperature Illumination Stress) test and an NBTIS (Negative Bias Temperature Illumination Stress) test.

In particular, in an n-channel transistor, a positive potential is applied to a gate in putting the transistor in an on state (a state where current flows); thus, the amount of change in threshold voltage in the PBTS test is one important item to be focused on as an indicator of the reliability of the transistor.

Light irradiation on a transistor may change electrical characteristics of the transistor. In particular, a transistor provided in a region on which light can be incident preferably exhibits a small variation in electrical characteristics under light irradiation and has high reliability against light. The reliability against light can be evaluated with the amount of change in threshold voltage in a NBTIS test, for example.

<Content of Element M (1)>

With use of a metal oxide that does not contain gallium or has low gallium content in the semiconductor layer, the transistor can be highly reliable against positive bias application. In other words, the amount of change in the threshold voltage of the transistor in the PBTS test can be small. Meanwhile, with use of a metal oxide that contains gallium, the gallium content is preferably lower than the indium content so that the transistor can be highly reliable. Thus, a highly reliable transistor can be achieved.

One of the factors in change in the threshold voltage in the PBTS test is a defect state at the interface between a semiconductor layer and a gate insulating layer or in the vicinity of the interface. As the density of defect states increases, degradation in the PBTS test becomes significant. Generation of the defect states can be inhibited by reducing the gallium content in a region of the semiconductor layer that is in contact with the gate insulating layer.

The following can be given as the reason why the amount of change in the threshold voltage in the PBTS test can be reduced when a metal oxide that does not contain gallium or has low gallium content is used for the semiconductor layer. Gallium contained in the semiconductor layer has a property of attracting oxygen more easily than another metal element (e.g., indium or zinc) does. Thus, when, at the interface between a metal oxide containing a large amount of gallium and the gate insulating layer, gallium is bonded to excess oxygen in the gate insulating layer, trap sites of carriers (here, electrons) are probably generated easily. This might cause the change in the threshold voltage when a positive potential is applied to a gate and carriers are trapped at the interface between the semiconductor layer and the gate insulating layer. Note that oxygen vacancies (Vo) are less likely to be generated in the metal oxide when the semiconductor layer contains gallium.

Specifically, in the case where an In—Ga—Zn oxide is used for the semiconductor layer, the gallium content can be reduced by using a metal oxide in which the atomic ratio of indium is higher than that of gallium. It is further preferable to use a metal oxide in which the atomic ratio of zinc is higher than that of gallium. In other words, a metal oxide in which the atomic ratios of metal elements satisfy In>Ga and Zn>Ga is preferably used as the semiconductor layer.

In the semiconductor layer, the gallium content can be reduced by using a metal oxide having any of the following atomic ratios of metal elements can be used as the semiconductor layer: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, and a neighborhood thereof.

In the semiconductor layer, the indium content can be increased by using a metal oxide in which the ratio of the number of indium atoms to the number of gallium atoms is higher than 0 atomic % and lower than or equal to 50 atomic %, preferably higher than or equal to 0.1 atomic % and lower than or equal to 40 atomic %, further preferably higher than or equal to 0.1 atomic % and lower than or equal to 35 atomic %, further preferably higher than or equal to 0.1 atomic % and lower than or equal to 30 atomic %, further preferably higher than or equal to 0.1 atomic % and lower than or equal to 25 atomic %, further preferably higher than or equal to 0.1 atomic % and lower than or equal to 20 atomic %, further preferably higher than or equal to 0.1 atomic % and lower than or equal to 15 atomic %, further preferably higher than or equal to 0.1 atomic % and lower than or equal to 10 atomic %.

A metal oxide not containing gallium may be used as the semiconductor layer. For example, an In—Zn oxide can be used for the semiconductor layer. In this case, when the atomic ratio of indium to metal elements contained in the metal oxide is increased, the field-effect mobility of the transistor can be increased. By contrast, when the atomic ratio of zinc to metal elements contained in the metal oxide is increased, the metal oxide has high crystallinity; thus, a change in the electrical characteristics of the transistor can be inhibited and the reliability can be increased. Alternatively, a metal oxide that contains neither gallium nor zinc, such as indium oxide, can be used as the semiconductor layer. The use of a metal oxide not containing gallium at all can make a change in the threshold voltage particularly in the PBTS test extremely small.

For example, an oxide containing indium and zinc can be used for the semiconductor layer. In that case, for example, a metal oxide where the atomic ratio of metal elements of In:Zn=2:3, In:Zn=4:1, or a neighborhood thereof can be used.

Although the case of using gallium is described as an example, the same applies to the case where the element M is used instead of gallium. In particular, a metal oxide in which the atomic ratio of indium is higher than the atomic ratio of the element M is preferably used as the semiconductor layer. Furthermore, a metal oxide in which the atomic ratio of zinc is higher than the atomic ratio of the element M is preferably used.

Low content of the element M in the semiconductor layer enables the transistor to be highly reliable against positive bias application. With use of the transistor as a transistor that is required to have high reliability against positive bias application, a highly reliable display device can be provided.

<Content of Element M (2)>

The high content of the element M in the semiconductor layer enables the transistor to be highly reliable against light. In other words, the amount of change in the threshold voltage of the transistor in the NBTIS test can be small. Specifically, in a metal oxide in which the atomic ratio of the element M is higher than or equal to that of indium, the band gap is increased and accordingly the amount of fluctuation in the threshold voltage of the transistor in the NBTIS test can be reduced. An increase in band gap can further lower the off-state current of the transistor in some cases. The band gap of the metal oxide in the semiconductor layer is preferably greater than or equal to 2.0 eV, further preferably greater than or equal to 2.5 eV, further preferably greater than or equal to 3.0 eV, further preferably greater than or equal to 3.2 eV, further preferably greater than or equal to 3.3 eV, further preferably greater than or equal to 3.4 eV, further preferably greater than or equal to 3.5 eV.

For example, when a metal oxide in which the atomic ratio between metal elements is In:M:Zn=1:1:1, In:M:Zn=1:1.1.2, In:M:Zn=1:3:2, In:M:Zn=1:3:3, or In:M:Zn=1:3:4, or the vicinity thereof is used for the semiconductor layer, the content of the element M can be increased.

In the semiconductor layer, the content of the element M can be increased by suitably using, in particular, a metal oxide in which the ratio of the number of atoms of the element M to the number of atoms of the metal elements contained is higher than or equal to 20 atomic % and lower than or equal to 70 atomic %, preferably higher than or equal to 30 atomic % and lower than or equal to 70 atomic %, further preferably higher than or equal to 30 atomic % and lower than or equal to 60 atomic %, further preferably higher than or equal to 40 atomic % and lower than or equal to 60 atomic %, further preferably higher than or equal to 50 atomic % and lower than or equal to 60 atomic %.

In the case where an In—Ga—Zn oxide is used for the semiconductor layer, a metal oxide in which the atomic ratio of indium to the number of atoms of the metal elements is higher than or equal to the number of atoms of gallium can be used. The content of the element M can be increased by using a metal oxide having any of the following atomic ratios of metal elements: In:Ga:Zn=1:1:1, In:Ga:Zn=1:1:1.2, In:Ga:Zn=1:3:2, In:Ga:Zn=1:3:3, In:Ga:Zn=1:3:4, and a neighborhood thereof.

In the semiconductor layer, the content of the element M can be increased by using, in particular, a metal oxide in which the ratio of the number of atoms of gallium to the number of atoms of the metal elements contained is higher than or equal to 20 atomic % and lower than or equal to 60 atomic %, preferably higher than or equal to 20 atomic % and lower than or equal to 50 atomic %, further preferably higher than or equal to 30 atomic % and lower than or equal to 50 atomic %, further preferably higher than or equal to 40 atomic % and lower than or equal to 60 atomic %, further preferably higher than or equal to 50 atomic % and lower than or equal to 60 atomic %.

As an analysis method of the composition of a metal oxide, for example, energy dispersive X-ray spectroscopy (EDX), X-ray photoelectron spectroscopy (XPS), inductively coupled plasma-mass spectroscopy (ICP-MS), or inductively coupled plasma-atomic emission spectrometry (ICP-AES), can be used. Alternatively, such kinds of analysis methods may be performed in combination. Note that as for an element whose content is low, the actual content may be different from the content obtained by analysis because of the influence of the analysis accuracy. In the case where the content of the element M is low, for example, the content of the element M obtained by analysis may be lower than the actual content.

Note that a composition in the neighborhood in this specification and the like includes the range of ±30% of an intended atomic ratio. For example, when the atomic ratio is described as In:M:Zn=4:2:3 or a composition in the neighborhood thereof, the case is included where the atomic ratio of the element M is greater than or equal to 1 and less than or equal to 3 and the atomic ratio of zinc is greater than or equal to 2 and less than or equal to 4 with the atomic ratio of indium being 4. When the atomic ratio is described as In:M:Zn=5:1:6 or a composition in the neighborhood thereof, the case is included where the atomic ratio of the element M is greater than 0.1 and less than or equal to 2 and the atomic ratio of zinc is greater than or equal to 5 and less than or equal to 7 with the atomic ratio of indium being 5. When the atomic ratio is described as In:M:Zn=1:1:1 or a composition in the neighborhood thereof, the case is included where the atomic ratio of the element M is greater than 0.1 and less than or equal to 2 and the atomic ratio of zinc is greater than 0.1 and less than or equal to 2 with the atomic ratio of indium being 1. Note that in the case where the metal oxide is formed by a sputtering method, the atomic ratio of a target may be different from the atomic ratio of the metal oxide. In particular, the atomic ratio of zinc in the metal oxide is lower than the atomic ratio of zinc in the target in some cases. Specifically, the atomic ratio of zinc contained in the metal oxide may be approximately 40% to 90% of the atomic ratio of zinc contained in the target.

At least part of this embodiment can be implemented in combination with the other embodiments described in this specification as appropriate.

Embodiment 2

Specific structure examples of the display device are described below.

Here, in the case where the pixel of the display device includes three kinds of subpixels exhibiting light of different colors, for example, as the three subpixels, subpixels of three colors of red (R), green (G), and blue (B), subpixels of three colors of yellow (Y), cyan (C), and magenta (M), and the like can be given. In the case where four subpixels are included, the four subpixels can be of four colors of red (R), green (G), blue (B), and white (W) or of four colors of R, G, B, and Y, for example. Each of the subpixels includes a light-emitting device.

Next, pixel layout in the display device in this embodiment is described. There is no particular limitation on the arrangement of subpixels included in a pixel, and a variety of methods can be employed. Examples of the arrangement of subpixels include stripe arrangement, S-stripe arrangement, matrix arrangement, delta arrangement, Bayer arrangement, and Pentile arrangement.

Examples of top surface shapes of the subpixels include polygons such as a triangle, a tetragon (including a rectangle and a square), a pentagon, and a hexagon; polygons with rounded corners; an ellipse; and a circle. Here, the top surface shape of the subpixel corresponds to the top surface shape of a light-emitting region of the light-emitting device.

Figure 8A:
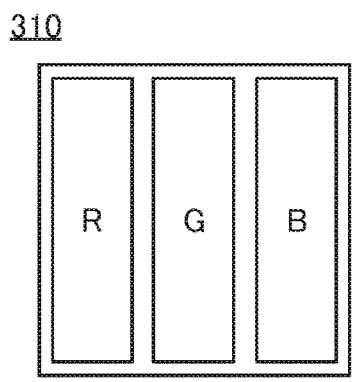
FIG. 8A to FIG. 8E are diagrams each illustrating an example of pixel arrangement.

A pixel 310 illustrated in FIG. 8A includes a subpixel (R) that exhibits a red color, a subpixel (G) that exhibits a green color, and a subpixel (B) that exhibits a blue color. The pixel 310 illustrated in FIG. 8A employs the stripe arrangement. Note that the arrangement order of the subpixels is not limited to the structure illustrated in FIG. 8A. Although FIG. 8A shows the structure in which the subpixels have the same area, the subpixels may differ in area. Here, the area of the subpixel corresponds to the area of a light-emitting region of the light-emitting device. In FIG. 8A, regions of the light-emitting elements in the subpixels are denoted by R, G, and B to easily differentiate the subpixels.

Figure 8B:
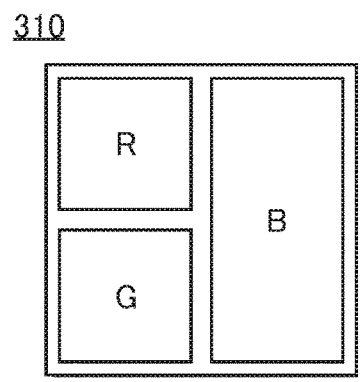

The pixel 310 illustrated in FIG. 8B employs the S-stripe arrangement. The pixel 310 illustrated in FIG. 8B is composed of two rows and two columns, and includes two subpixels (the subpixel (R) and the subpixel (G)) in the left column (first column) and one subpixel (the subpixel (B)) in the right column (second column). In other words, the pixel 310 includes two subpixels (the subpixel (R) and the subpixel (B)) in the upper row (first row) and two subpixels (the subpixel (G) and the subpixel (B)) in the lower row (second row); the subpixel (B) is included in these two rows.

FIG. 8B shows an example where the area of the subpixel (B) is larger than the area of each of the subpixel (R) and the subpixel (G). This structure can be suitably used in the case where the lifetime of the light-emitting device emitting blue light is shorter than the lifetimes of the light-emitting device emitting red light and the light-emitting device emitting blue light. In the subpixel (B) having a large light-emitting area, the current density of the light-emitting device emitting blue light is low, enabling longer lifetimes of the light-emitting device. That is, the display device can have high reliability.

Note that although the area of the subpixel (B) is larger than the areas of the subpixel (R) and the subpixel (G) in FIG. 8B, one embodiment of the present invention is not limited to this structure. The area of the subpixel can be determined depending on the lifetime of the light-emitting device included in the subpixel. The area of the light-emitting device with a short lifetime is preferably made larger than the areas of the other subpixels.

Figure 8C:
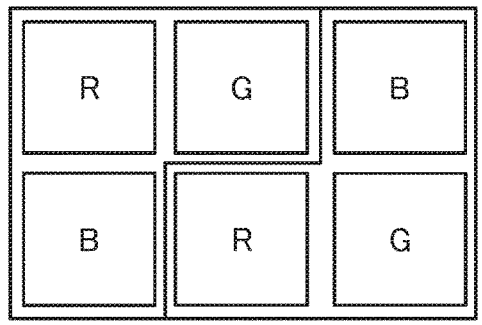

FIG. 8C illustrates two pixels. In the pixels illustrated in FIG. 8C, the subpixels of different colors are arranged in a zigzag manner. Specifically, subpixels of different colors are arranged in the odd-numbered row and the even-numbered row in every column.

Figure 8D:
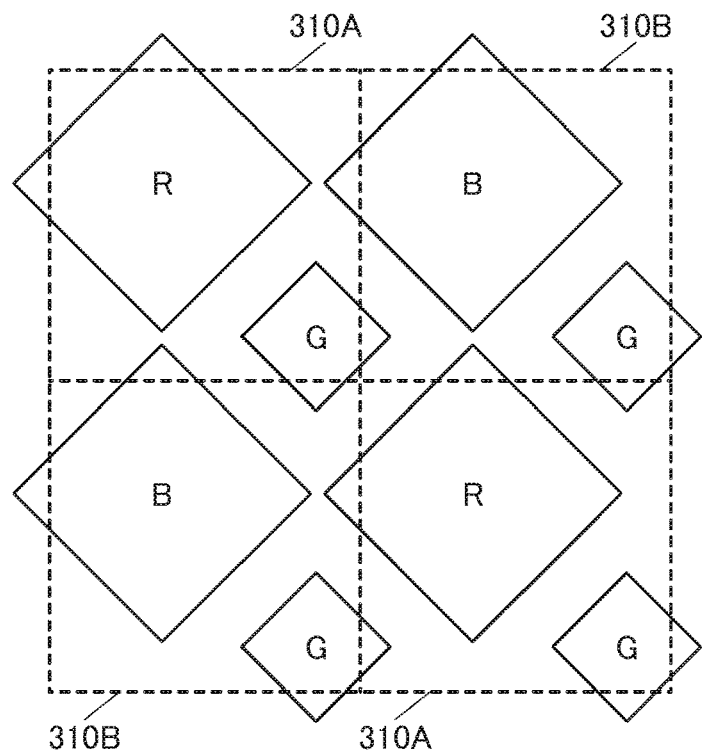

FIG. 8D illustrates pixels employing a PenTile arrangement. The pixels illustrated in FIG. 8D are two pixels, pixels 310A and pixels 310B, including three subpixels, the subpixel (R) that exhibits a red color, the subpixel (G) that exhibits a green color, and the subpixel (B) that exhibits a blue color. The two pixels, the pixel 310A and the pixel 310B, include one subpixel (R), two subpixels (G), and one subpixel (B). Such a structure can increase the areas of the subpixels while maintaining a pseudo-high resolution, thereby lowering the required processing accuracy. That is, when comparison is made with the same processing accuracy, a display device having a higher resolution can be fabricated. In addition, the number of transistors per area can be reduced, whereby the productivity can be increased. Accordingly, a display device having a pseudo-high resolution can be fabricated with high productivity.

Figure 8E:
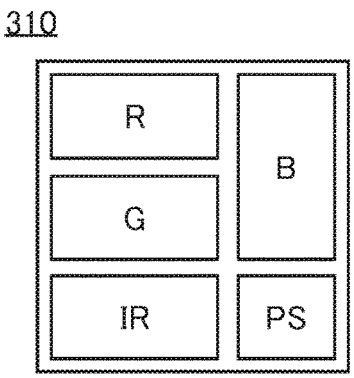

The pixel 310 includes a subpixel (IR) that exhibits infrared light and a pixel (PS) that senses light in addition to the subpixel (R) that exhibits a red color, the subpixel (G) that exhibits a green color, and the subpixel (B) that exhibits a blue color (see FIG. 8E). The pixel PS includes a light-receiving element.

The subpixel (IR) that exhibits infrared light can be used as a light source and the pixel (PS) that senses light can sense the infrared light emitted from the subpixel.

FIG. 8E shows an example in which the pixel (PS) that senses light has the lowest aperture ratio of the subpixel (R) that exhibits a red color, the subpixel (G) that exhibits a green color, the subpixel (B) that exhibits a blue color, the subpixel (IR) that exhibits infrared light, and the pixel (PS) that senses light. When the pixel (PS) that senses light has a narrow light-receiving area, an image capturing range is narrowed and it is possible to inhibit blur from occurring in the captured image being displayed and to increase the definition. Accordingly, high-resolution or high-definition image capturing can be performed, which is preferable. Note that the aperture ratio of each of the subpixel (R) that exhibits a red color, the subpixel (G) that exhibits a green color, the subpixel (B) that exhibits a blue color, the subpixel (IR) that exhibits infrared light, and the pixel (PS) that senses light can be determined as appropriate.

In the structure illustrated in FIG. 8E, the pixel 310 includes a light-emitting element (also referred to as a light-emitting device) and a light-receiving element (also referred to as a light-receiving device). In the display device according to one embodiment of the present invention, the pixel has a light-receiving function, so that the contact or approach of an object can be detected while an image is displayed. Moreover, since the display device of one embodiment of the present invention includes a subpixel that exhibits infrared light, with the use of the subpixels included in the display device, an image can be displayed while infrared light is emitted as a light source. In other words, the display device of one embodiment of the present invention has a structure with high affinity for a function other than a display function (here, a light-receiving function).

The light-receiving element included in the pixel 310 illustrated in FIG. 8E may be used for a touch sensor, a non-contact sensor, or the like.

Here, a touch sensor or a non-contact sensor can sense the approach or contact of an object (e.g., a finger, a hand, or a pen). The touch sensor can detect an object when the electronic device and the object come in direct contact with each other. The non-contact sensor can detect an object even when the object is not in contact with the electronic device. For example, the display device (or the electronic device) is preferably capable of detecting an object when the distance between the display device and the object is greater than or equal to 0.1 mm and less than or equal to 300 mm, preferably greater than or equal to 3 mm and less than or equal to 50 mm. This structure enables the electronic device to be operated without direct contact of an object; in other words, the display device can be operated in a contactless (touchless) manner. With the above-described structure, the electronic device can have a reduced risk of being dirty or damaged, or can be operated without the object directly touching a dirt (e.g., dust, or a virus) attached to the electronic device.

Note that the non-contact sensor function can also be referred to as a hover sensor function, a hover touch sensor function, a near-touch sensor function, a touchless sensor function, or the like. The touch sensor function can also be referred to as a direct touch sensor function or the like.

Figure 9A:
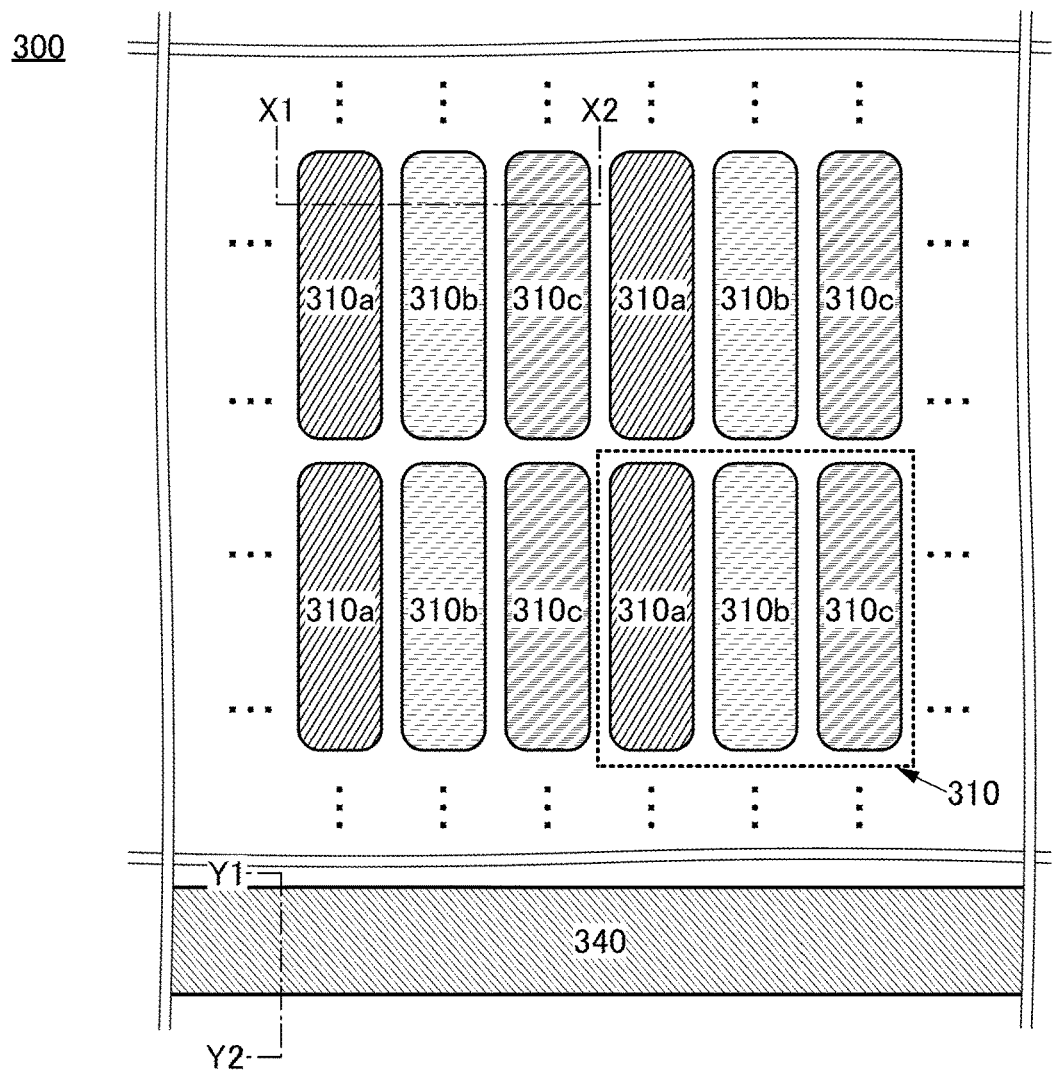
FIG. 9A is a top view illustrating an example of a display device.
Figure 9B:
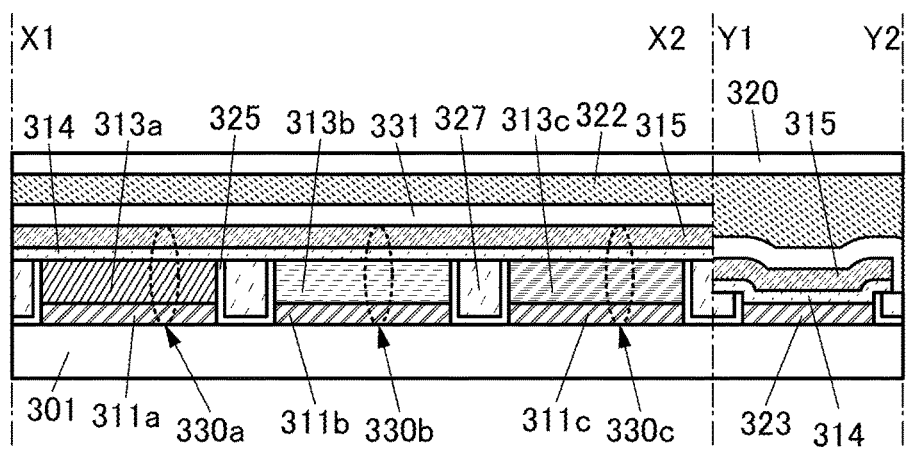
FIG. 9B is a cross-sectional view illustrating an example of a display device.

FIG. 9A and FIG. 9B illustrate a display device of one embodiment of the present invention.

FIG. 9A illustrates a top view of a display device 300. The display device 300 includes a display portion in which a plurality of pixels 310 are arranged in a matrix, and a connection portion 340 outside the display portion. One pixel 310 consists of three subpixels: a subpixel 310a, a subpixel 310b, and a subpixel 310c. Note that the structure of the pixels is not limited to that in FIG. 9A.

Although FIG. 9A illustrates an example in which the connection portion 340 is positioned on the lower side of the display portion in a top view, one embodiment of the present invention is not particularly limited. The connection portion 340 only needs to be provided on at least one of the upper side, the right side, the left side, and the lower side of the display portion in a top view, or may be provided so as to surround the four sides of the display portion. The number of connection portions 340 may be one or more.

FIG. 9B is a cross-sectional view taken along dashed-dotted lines X1-X2 and Y1-Y2 in FIG. 9A. FIG. 10A to FIG. 10C, FIG. 11A and FIG. 11B, and FIG. 12A to FIG. 12C illustrate cross-sectional views taken along dashed-dotted lines X1-X2 and Y1-Y2 in FIG. 9A as modification examples.

As illustrated in FIG. 9B, in the display device 300, light-emitting devices 330a, 330b, and 330c are provided over a layer 301 including transistors and a protective layer 331 is provided to cover these light-emitting devices and light-receiving devices. A substrate 320 is bonded to the protective layer 331 with a resin layer 322. In a region between two adjacent light-emitting devices, an insulating layer 325 and an insulating layer 327 over the insulating layer 325 are provided.

The display device of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 301 including transistors can have a stacked-layer structure in which a plurality of transistors are provided over a substrate and an insulating layer is provided to cover these transistors, for example. The layer 301 including transistors may have a depressed portion between adjacent two devices. For example, an insulating layer positioned as the outermost surface of the layer 301 including transistors may have a depressed portion. As the transistors, the transistor described in Embodiment 1 can be used.

Each of the light-emitting devices includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. Hereinafter, the case where the pixel electrode functions as an anode and the common electrode functions as a cathode is described as an example.

The light-emitting device 330a includes a conductive layer 311a over the layer 301 including transistors, an island-shaped first layer 313a over the conductive layer 311a, a fourth layer 314 over the island-shaped first layer 313a, and a common electrode 315 over the fourth layer 314. The conductive layer 311a functions as a pixel electrode. In the light-emitting device 330a, the first layer 313a and the fourth layer 314 can be collectively referred to as an EL layer.

The first layer 313a includes a hole-injection layer, a hole-transport layer, a light-emitting layer, and an electron-transport layer, for example. Alternatively, the first layer 313a includes a first light-emitting unit, a charge generation layer, and a second light-emitting unit, for example.

The fourth layer 314 includes an electron-injection layer, for example. Alternatively, the fourth layer 314 may include a stack of an electron-transport layer and an electron-injection layer.

The light-emitting device 330b includes a conductive layer 311b over the layer 301 including transistors, an island-shaped second layer 313b over the conductive layer 311b, the fourth layer 314 over the island-shaped second layer 313b, and the common electrode 315 over the fourth layer 314. The conductive layer 311b functions as a pixel electrode. In the light-emitting device 330b, the second layer 313b and the fourth layer 314 can be collectively referred to as an EL layer.

The light-emitting device 330c includes a conductive layer 311c over the layer 301 including transistors, an island-shaped third layer 313c over the conductive layer 311c, the fourth layer 314 over the island-shaped third layer 313c, and the common electrode 315 over the fourth layer 314. The conductive layer 311c functions as a pixel electrode. In the light-emitting device 330c, the third layer 313c and the fourth layer 314 can be collectively referred to as an EL layer.

The fourth layer 314 is shared by the light-emitting devices. As described above, the fourth layer 314 includes an electron-injection layer, for example. Alternatively, the fourth layer 314 may include a stack of an electron-transport layer and an electron-injection layer.

The common electrode 315 is electrically connected to a conductive layer 323 provided in the connection portion 340. Thus, the same potential is supplied to the common electrode 315 included in the light-emitting devices of the respective colors. Note that FIG. 9B illustrates an example in which the fourth layer 314 is provided over the conductive layer 323 and the conductive layer 323 and the common electrode 315 are electrically connected to each other through the fourth layer 314. The fourth layer 314 is not necessarily provided in the connection portion 340. For example, FIG. 10C illustrates an example in which the fourth layer 314 is not provided over the conductive layer 323 and the conductive layer 323 and the common electrode 315 are directly connected to each other.

For example, by using a mask for specifying a deposition area (also referred to as an area mask, a rough metal mask, or the like), the fourth layer 314 and the common electrode 315 can be deposited in different regions.

The side surfaces of the conductive layer 311a to the conductive layer 311c, the first layer 313a, the second layer 313b, and the third layer 313c are each covered with the insulating layer 325 and the insulating layer 327. This inhibits the fourth layer 314 (or the common electrode 315) from being in contact with the side surface of any of the conductive layer 311a to the conductive layer 311c, the first layer 313a, the second layer 313b, and the third layer 313c, thereby inhibiting a short circuit in the light-emitting devices. Thus, the reliability of the light-emitting device can be increased.

The insulating layer 325 preferably covers at least the side surfaces of the conductive layer 311a to the conductive layer 311c. Moreover, the insulating layer 325 preferably covers the side surfaces of the first layer 313a, the second layer 313b, and the third layer 313c. The insulating layer 325 can be in contact with the side surfaces of the conductive layer 311a to the conductive layer 311c, the first layer 313a, the second layer 313b, and the third layer 313c.

The insulating layer 327 is provided over the insulating layer 325 to fill a depressed portion formed on the insulating layer 325. The insulating layer 327 can overlap with the side surfaces of the conductive layer 311a to the conductive layer 311c, the first layer 313a, the second layer 313b, and the third layer 313c with the insulating layer 325 therebetween.

Moreover, providing the insulating layer 325 and the insulating layer 327 can fill a gap between the adjacent island-shaped layers, whereby the formation surface of a layer (the common electrode or the like) provided over the island-shaped layers can be less uneven and flatter. Thus, the coverage with the common electrode can be increased and disconnection of the common electrode can be prevented.

The insulating layer 325 or the insulating layer 327 can be provided in contact with the island-shaped layers. Thus, film separation of the island-shaped layers can be prevented. When the insulating layer and the island-shaped layers are in close contact with each other, an effect of fixing the adjacent island-shaped layers by or attaching the adjacent island-shaped layers to the insulating layer can be attained.

An organic resin film is suitable as the insulating layer 327. In the case where the side surface of an EL layer and a photosensitive organic resin film are in direct contact with each other, the EL layer might be damaged by an organic solvent or the like that might be contained in the photosensitive organic resin film. When an aluminum oxide film formed by an atomic layer deposition (ALD) method is used as the insulating layer 325, a structure can be employed in which the photosensitive organic resin film used as the insulating layer 327 and the side surface of the EL layer are not in direct contact with each other. Thus, the EL layer can be inhibited from being dissolved by the organic solvent, for example.

Note that one of the insulating layer 325 and the insulating layer 327 is not necessarily provided. For example, when the insulating layer 325 having a single-layer structure using an inorganic material is formed, the insulating layer 325 can be used as a protective insulating layer of the EL layer. In this way, the reliability of the display apparatus can be increased. For another example, when the insulating layer 327 having a single-layer structure using an organic material is formed, the insulating layer 327 can fill a gap between adjacent EL layers and planarization can be performed. In this way, the coverage with the common electrode (upper electrode) formed over the EL layers and the insulating layer 327 can be increased.

The fourth layer 314 and the common electrode 315 are provided over the first layer 313a, the second layer 313b, the third layer 313c, the insulating layer 325, and the insulating layer 327. At the stage before the insulating layer 325 and the insulating layer 327 are provided, a level difference due to a region where the pixel electrode and the EL layer are provided and a region where neither the pixel electrode nor the EL layer is provided (region between the light-emitting elements) is caused. The display device of one embodiment of the present invention can eliminate the level difference by including the insulating layer 325 and the insulating layer 327, whereby the coverage with the fourth layer 314 and the common electrode 315 can be improved. Thus, connection defects caused by disconnection can be inhibited. Alternatively, it is possible to inhibit an increase in electric resistance due to local thinning of the common electrode 315 by the step.

In order to improve the planarity of the formation surfaces of the fourth layer 314 and the common electrode 315, the level of the top surface of the insulating layer 325 and the level of the top surface of the insulating layer 327 are each preferably the same or substantially the same as the level of the top surface of at least one of the first layer 313a, the second layer 313b, and the third layer 313c. The top surface of the insulating layer 327 preferably has a flat shape and may have a projection portion, a convex curve, a concave curve, or a depressed portion.

The insulating layer 325 includes regions in contact with the side surfaces of the first layer 313a, the second layer 313b, and the third layer 313c and functions as a protective insulating layer for the first layer 313a, the second layer 313b, and the third layer 313c. Providing the insulating layer 325 can inhibit impurities (e.g., oxygen and moisture) from entering the first layer 313a, the second layer 313b, and the third layer 313c through their side surfaces, whereby the display device can have high reliability.

When the width (thickness) of the insulating layer 325 in the regions in contact with the side surfaces of the first layer 313a, the second layer 313b, and the third layer 313c is large in the cross-sectional view, the intervals between the first layer 313a, the second layer 313b, and the third layer 313c increase, so that the aperture ratio may be reduced. When the width (thickness) of the insulating layer 325 is small, the effect of inhibiting impurities from entering the first layer 313a, the second layer 313b, and the third layer 313c through their side surfaces may be weakened. The width (thickness) of the insulating layer 325 in the regions in contact with the side surfaces of the first layer 313a, the second layer 313b, and the third layer 313c is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 325 is within the above range, the display device can have both a high aperture ratio and high reliability.

The insulating layer 325 can be an insulating layer containing an inorganic material. As the insulating layer 325, an inorganic insulating film such as an oxide insulating film, a nitride insulating film, an oxynitride insulating film, or a nitride oxide insulating film can be used, for example. The insulating layer 325 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Aluminum oxide is particularly preferable because it has high selectivity with respect to the EL layer in etching and has a function of protecting the EL layer in forming the insulating layer 327 which is to be described later. In particular, when an inorganic insulating film such as an aluminum oxide film, a hafnium oxide film, or a silicon oxide film that is formed by an ALD method is employed for the insulating layer 325, it is possible to form the insulating layer 325 that has few pinholes and an excellent function of protecting the EL layer. The insulating layer 325 may have a stacked-layer structure of a film formed by an ALD method and a film formed by a sputtering method. For example, the insulating layer 325 may have a stacked-layer structure of an aluminum oxide film formed by an ALD method and a silicon nitride film formed by a sputtering method.

The insulating layer 325 can be formed by a sputtering method, a chemical vapor deposition (CVD) method, a pulsed laser deposition (PLD) method, an ALD method, or the like. The insulating layer 325 is preferably formed by an ALD method enabling good coverage.

The insulating layer 327 provided over the insulating layer 325 has a function of enabling planarization in the depressed portion on the insulating layer 325, which is formed between the adjacent light-emitting devices. In other words, the insulating layer 327 has an effect of improving the planarity of the formation surface of the common electrode 315. An insulating layer containing an organic material can be suitably used as the insulating layer 327. For example, the insulating layer 327 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like. For the insulating layer 327, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used. The insulating layer 327 can be formed using a photosensitive resin. A photoresist may be used as the photosensitive resin. As the photosensitive resin, a positive photosensitive material or a negative photosensitive material can be used.

The difference between the level of the top surface of the insulating layer 327 and the level of the top surface of any of the first layer 313a, the second layer 313b, and the third layer 313c is preferably less than or equal to 0.5 times, further preferably less than or equal to 0.3 times the thickness of the insulating layer 327, for example. For another example, the insulating layer 327 may be provided such that the level of the top surface of any of the first layer 313a, the second layer 313b, and the third layer 313c is higher than the level of the top surface of the insulating layer 327. For another example, the insulating layer 327 may be provided such that the level of the top surface of the insulating layer 327 is higher than the level of the top surface of the light-emitting layer included in the first layer 313a, the second layer 313b, or the third layer 313c.

Figure 10A:
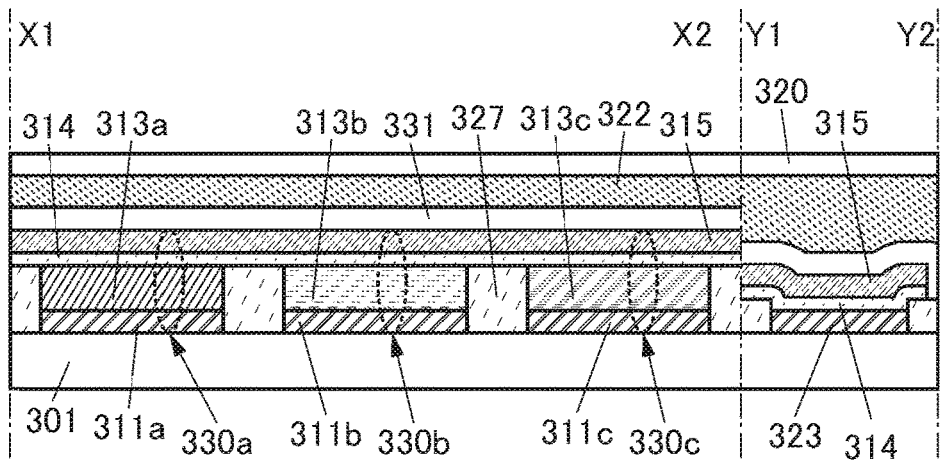
FIG. 10A to FIG. 10C are cross-sectional views each illustrating an example of a display device.

FIG. 10A illustrates an example in which the insulating layer 325 is not provided. In the case where the insulating layer 325 is not provided, a structure can be employed in which the insulating layer 327 is in contact with the side surfaces of the conductive layer 311a to the conductive layer 311c, the first layer 313a, the second layer 313b, and the third layer 313c. The insulating layer 327 can be provided to fill gaps between the EL layers of the light-emitting devices.

In that case, the insulating layer 327 is preferably formed using an organic material that causes less damage to the first layer 313a, the second layer 313b, and the third layer 313c. For the insulating layer 327, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin is preferably used, for example.

Figure 10B:
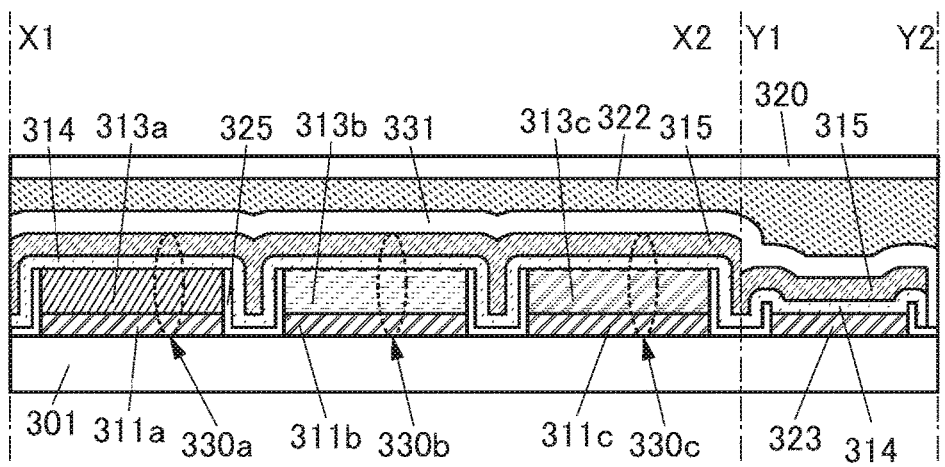
Figure 10C:
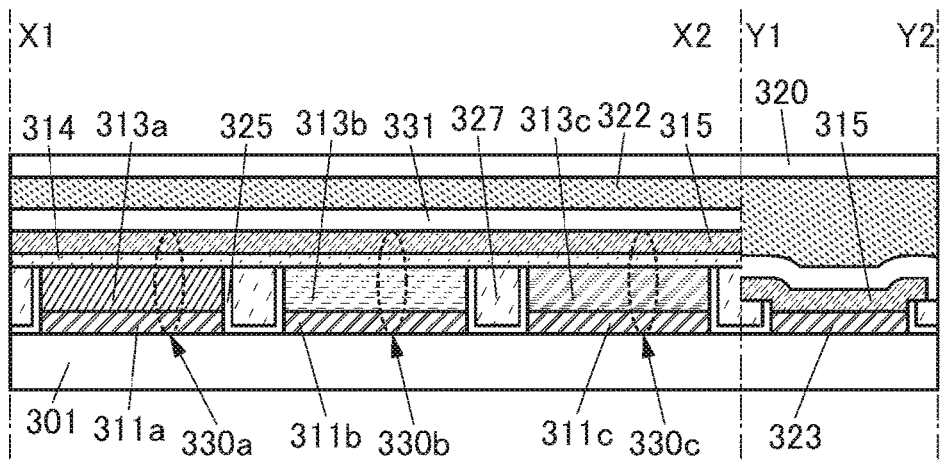

FIG. 10B illustrates an example in which the insulating layer 327 is not provided.

The protective layer 331 is preferably provided over the light-emitting devices 330a, 330b, and 330c. Providing the protective layer 331 can improve the reliability of the light-emitting devices.

There is no limitation on the conductivity of the protective layer 331. For the protective layer 331, at least one of an insulating film, a semiconductor film, and a conductive film can be used.

The protective layer 331 including an inorganic film can inhibit deterioration of the light-emitting devices 330a, 330b, and 330c by preventing oxidation of the common electrode 315 and inhibiting entry of impurities (e.g., moisture and oxygen) into the light-emitting devices, for example; thus, the reliability of the display device can be improved.

For the protective layer 331, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The protective layer 331 preferably includes a nitride insulating film or a nitride oxide insulating film, and further preferably includes a nitride insulating film.

For the protective layer 331, an inorganic film containing an In—Sn oxide (also referred to as ITO), an In—Zn oxide, a Ga—Zn oxide, an Al—Zn oxide, an indium gallium zinc oxide (In—Ga—Zn oxide, also referred to as IGZO), or the like can also be used. The inorganic film preferably has high resistance, specifically, higher resistance than the common electrode 315. The inorganic film may further contain nitrogen.

When light emitted from the light-emitting device is extracted through the protective layer 331, the protective layer 331 preferably has a high visible-light-transmitting property. For example, ITO, IGZO, and aluminum oxide are preferable because they are inorganic materials having a high visible-light-transmitting property.

The protective layer 331 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 331 may include an organic film. For example, the protective layer 331 may include both an organic film and an inorganic film.

The end portions of top surfaces of the conductive layer 311a to the conductive layer 311c are not covered with an insulating layer. This allows the distance between adjacent light-emitting devices to be extremely narrowed. As a result, the display device can have high resolution or high definition.

Figure 11A:
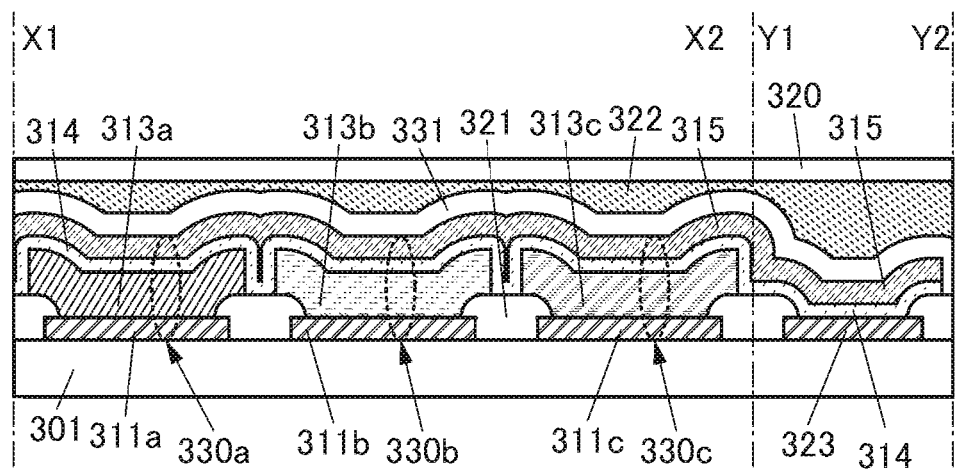
FIG. 11A and FIG. 11B are cross-sectional views each illustrating an example of a display device.
Figure 11B:
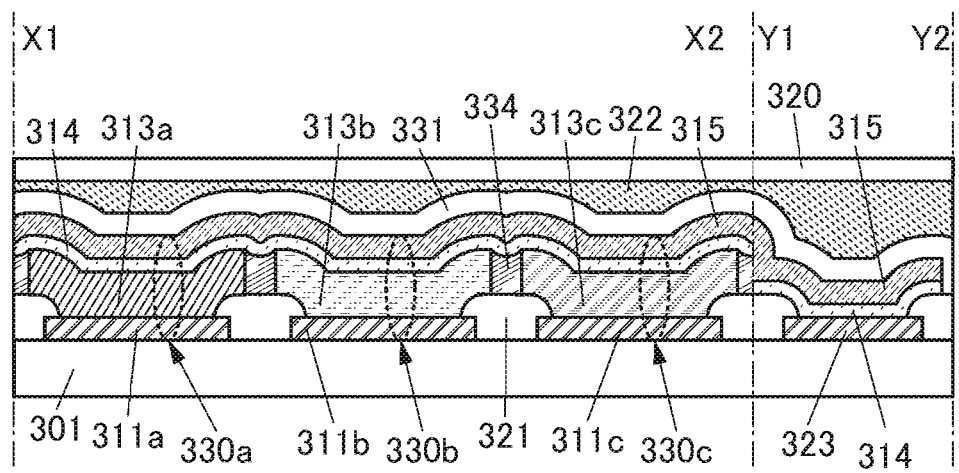

Note that as illustrated in FIG. 11A and FIG. 11B, the end portions of the conductive layer 311a to the conductive layer 311c may be covered with an insulating layer 321. The insulating layer 321 can have a single-layer structure or a stacked-layer structure including one or both of an inorganic insulating film and an organic insulating film.

Examples of an organic insulating material that can be used for the insulating layer 321 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 321, an inorganic insulating film that can be used as the protective layer 331 can be used.

When an inorganic insulating film is used as the insulating layer 321 that covers the end portions of the pixel electrodes, impurities are less likely to enter the light-emitting devices as compared with the case where an organic insulating film is used; therefore, the reliability of the light-emitting devices can be improved. When an organic insulating film is used as the insulating layer 321 that covers the end portions of the pixel electrodes, high step coverage can be obtained as compared with the case where an inorganic insulating film is used; therefore, an influence of the shape of the pixel electrodes can be small. Therefore, a short circuit in the light-emitting devices can be prevented. Specifically, when an organic insulating film is used as the insulating layer 321, the insulating layer 321 can be processed into a tapered shape or the like. In this specification and the like, a tapered shape indicates a shape in which at least part of the side surface of a structure is inclined to a substrate surface. For example, a tapered shape preferably includes a region where the angle between the inclined side surface and the substrate surface (such an angle is also referred to as a taper angle) is less than 90°.

Note that the insulating layer 321 is not necessarily provided. The aperture ratio of the subpixel can be sometimes increased without providing the insulating layer 321. Alternatively, the distance between subpixels can be shortened and the resolution or the definition of the display device can be sometimes increased.

Note that FIG. 11A illustrates an example in which the fourth layer 314 is also formed in a region between the first layer 313a and the second layer 313b, for example; however, as illustrated in FIG. 11B, a space 334 may be formed in the region.

The space 334 contains, for example, one or more selected from air, nitrogen, oxygen, carbon dioxide, and Group 18 elements (typified by helium, neon, argon, xenon, and krypton). Alternatively, a resin or the like may fill the space 334.

FIG. 9A and the like each illustrate an example in which the end portion of the conductive layer 311a and the end portion of the first layer 313a are aligned or substantially aligned with each other. In other words, the top surface shapes of the conductive layer 311a and the first layer 313a are the same or substantially the same.

Figure 12A:
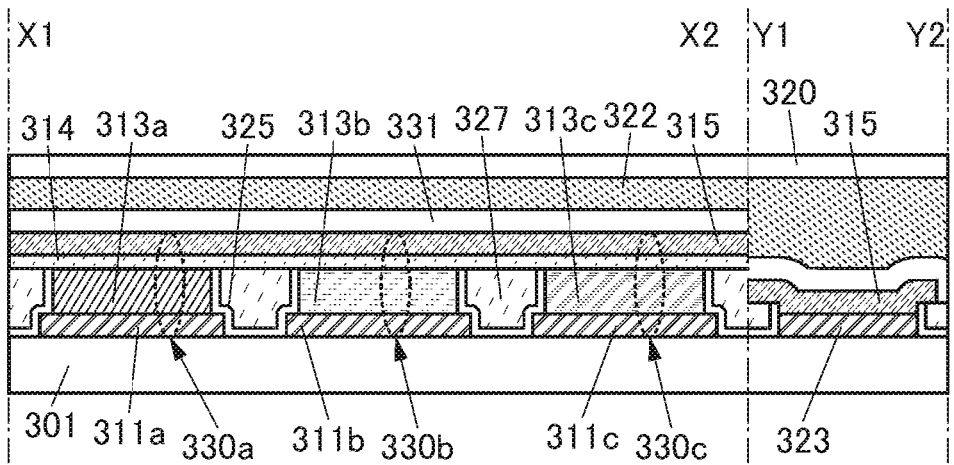
FIG. 12A to FIG. 12C are cross-sectional views each illustrating an example of a display device.
Figure 12B:
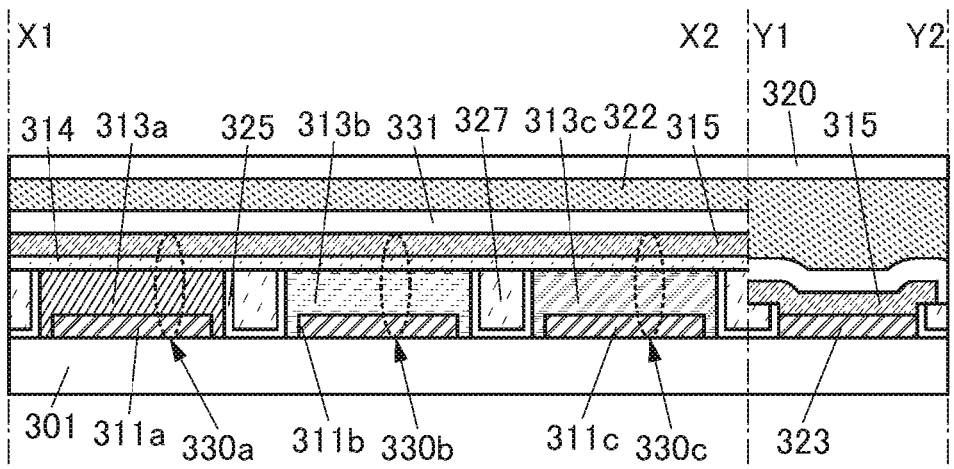

The size relationships of the shapes between the conductive layer 311a and the first layer 313a, between the conductive layer 311b and the second layer 313b, between the conductive layer 311c and the third layer 313c, and the like are not particularly limited. FIG. 12A illustrates an example in which the end portion of the first layer 313a is positioned on an inner side than the end portion of the conductive layer 311*a*. In FIG. 12A, the end portion of the first layer 313*a* is positioned over the conductive layer 311*a*. FIG. 12B illustrates an example in which the end portion of the first layer 313*a* is positioned on an outer side than the end portion of the conductive layer 311*a*. FIG. 12B, the first layer 313*a* is provided to cover the end portion of the conductive layer 311*a*.

In the case where end portions are aligned or substantially aligned with each other and the case where top surface shapes are the same or substantially the same, it can be said that outlines of stacked layers at least partly overlap with each other in a top view. For example, the case of processing the upper layer and the lower layer with the use of the same mask pattern or mask patterns that are partly the same is included. However, in some cases, the outlines do not completely overlap with each other and the upper layer is positioned inward from the lower layer or the upper layer is positioned outward from the lower layer; such a case is also described with the expression "end portions are substantially aligned with each other" or "top surface shapes are substantially the same."

Figure 12C:
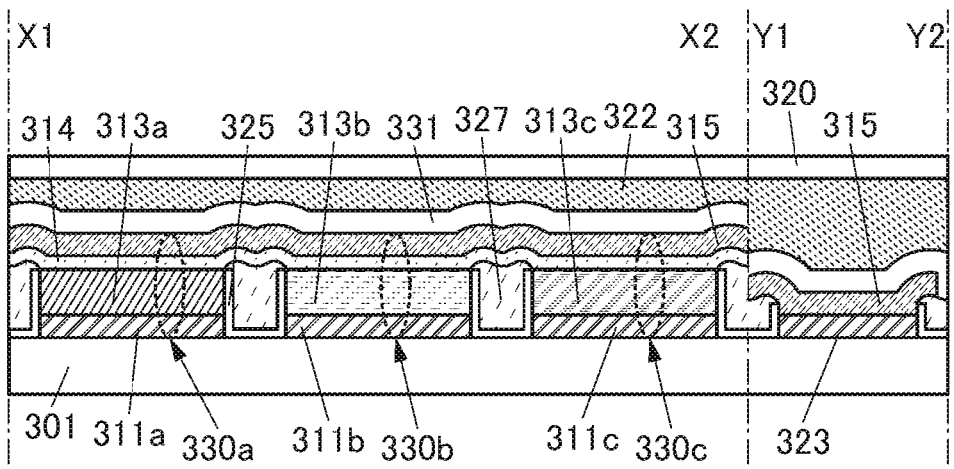

FIG. 12C illustrates a modification example of the insulating layer 327. In FIG. 12C, in a cross-sectional view, the top surface of the insulating layer 327 has a shape gently bulged toward the center, i.e., a convex surface, and has a shape in which the center and its vicinity are depressed, i.e., a concave surface.

FIG. 13A to FIG. 13F each illustrate a cross-sectional structure of a region 139 including the insulating layer 327 and its surroundings.

Figure 13A:
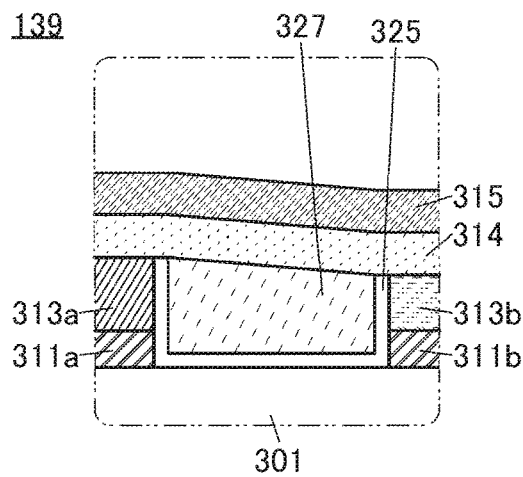
FIG. 13A to FIG. 13F are cross-sectional views each illustrating an example of a display device.

FIG. 13A illustrates an example in which the first layer 313*a* and the second layer 313*b* have different thicknesses. The top surface of the insulating layer 325 is level or substantially level with the top surface of the first layer 313*a* on the first layer 313*a* side, and level or substantially level with the top surface of the second layer 313*b* on the second layer 313*b* side. The top surface of the insulating layer 327 has a gentle slope whose side closer to the first layer 313*a* is higher and side closer to the second layer 313*b* is lower. In this manner, the top surfaces of the insulating layer 325 and the insulating layer 327 are preferably level with the top surface of the adjacent EL layer. Alternatively, the top surfaces may have a flat portion that is level with the top surface of any adjacent EL layers.

Figure 13D:
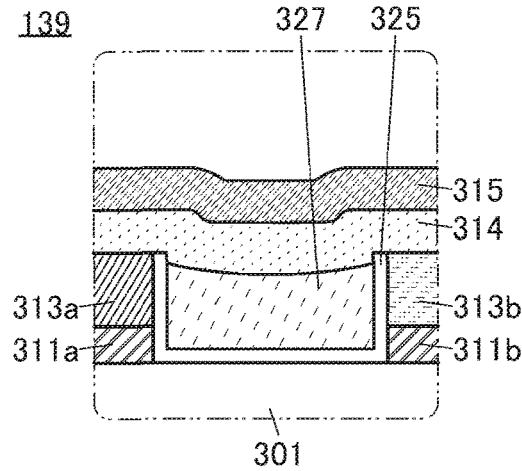
Figure 13B:
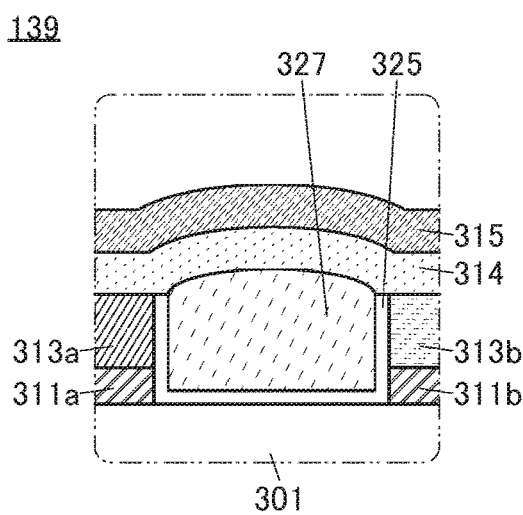

In FIG. 13B, the top surface of the insulating layer 327 has a region whose level is higher than the levels of the top surface of the first layer 313*a* and the top surface of the second layer 313*b*. In FIG. 13B, the top surface of the insulating layer 327 can have, in a cross-sectional view, a shape in which the center and its vicinity are bulged, i.e., a shape including a convex surface.

Figure 13E:
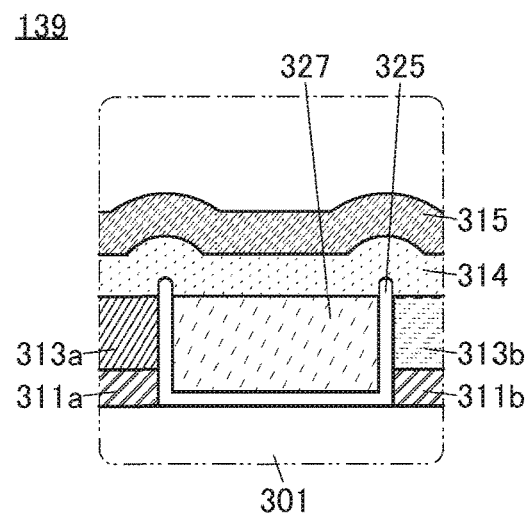
Figure 13C:
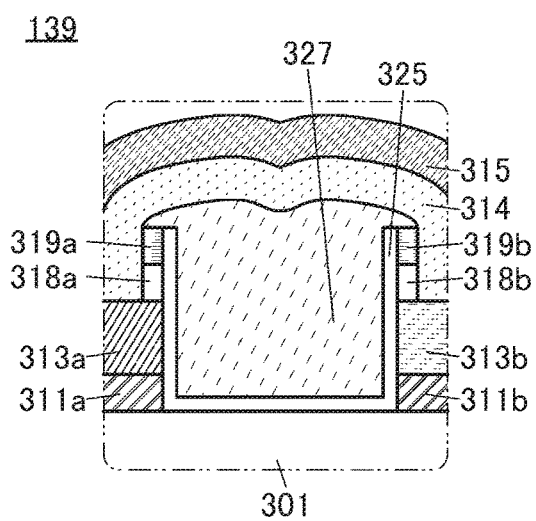

In FIG. 13C, in a cross-sectional view, the top surface of the insulating layer 327 has a shape gently bulged toward the center, i.e., a convex surface, and has a shape in which the center and its vicinity are depressed, i.e., a concave surface. The insulating layer 327 has a region whose level is higher than the levels of the top surface of the first layer 313*a* and the top surface of the second layer 313*b*. In the region 139, the display device includes at least one of a sacrificial layer 318*a* and a sacrificial layer 319*a*, the insulating layer 327 includes a first region that is higher in level than the top surface of the first layer 313*a* and the top surface of the second layer 313*b* and positioned outside the insulating layer 325, and the first region is positioned over at least one of the sacrificial layer 318*a* and the sacrificial layer 319*a*. In addition, in the region 139, the display device includes at least one of a sacrificial layer 318*b* and a sacrificial layer 319*b*, the insulating layer 327 includes a second region that is higher in level than the top surface of the first layer 313*a* and the top surface of the second layer 313*b* and positioned outside the insulating layer 325, and the second region is positioned over at least one of the sacrificial layer 318*b* and the sacrificial layer 319*b*.

In FIG. 13D, the top surface of the insulating layer 327 has a region whose level is lower than the levels of the top surface of the first layer 313*a* and the top surface of the second layer 313*b*. The top surface of the insulating layer 327 has, in a cross-sectional view, a shape in which the center and its vicinity are depressed, i.e., a shape including a concave surface.

In FIG. 13E, the top surface of the insulating layer 325 has a region whose level is higher than the levels of the top surface of the first layer 313*a* and the top surface of the second layer 313*b*. That is, the insulating layer 325 protrudes from the formation surface of the fourth layer 314 and forms a projecting portion.

In formation of the insulating layer 325, for example, when the insulating layer 325 is formed to be level or substantially level with the sacrificial layer, the insulating layer 325 may protrude as illustrated in FIG. 13E.

Figure 13F:
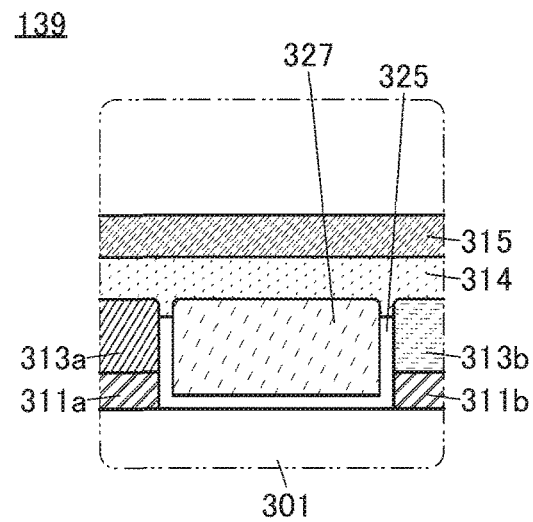

In FIG. 13F, the top surface of the insulating layer 325 has a region whose level is lower than the levels of the top surface of the first layer 313*a* and the top surface of the second layer 313*b*. That is, the insulating layer 325 forms a depressed portion on the formation surface of the fourth layer 314.

As described above, the insulating layer 325 and the insulating layer 327 can have a variety of shapes.

As the sacrificial layer, an inorganic film such as a metal film, an alloy film, a metal oxide film, a semiconductor film, or an inorganic insulating film can be used, for example.

For the sacrificial layer, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example.

For the sacrificial layer, a metal oxide such as an In—Ga—Zn oxide can be used. As the sacrificial layer, an In—Ga—Zn oxide film can be formed by a sputtering method, for example. It is also possible to use indium oxide, an In—Zn oxide, an In—Sn oxide, an indium titanium oxide (In—Ti oxide), an indium tin zinc oxide (In—Sn—Zn oxide), an indium titanium zinc oxide (In—Ti—Zn oxide), an indium gallium tin zinc oxide (In—Ga—Sn—Zn oxide), or the like. Alternatively, an indium tin oxide containing silicon, or the like can also be used.

In place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used. In particular, M is preferably one or more selected from gallium, aluminum, and yttrium.

As the sacrificial layer, any of a variety of inorganic insulating films that can be used as the protective layer 331 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer. As the sacrificial layer, an aluminum oxide film can be formed by an ALD method, for example. An ALD method is preferably used, in which case damage to a base (in particular, the EL layer or the like) can be reduced. As the sacrificial layer, a silicon nitride film can be formed by a sputtering method, for example.

For example, the sacrificial layer can employ a stacked-layer structure of an inorganic insulating film (e.g., an aluminum oxide film) formed by an ALD method and an In—Ga—Zn oxide film formed by a sputtering method. Alternatively, the sacrificial layer can employ a stacked-layer structure of an inorganic insulating film (e.g., an aluminum oxide film) formed by an ALD method and an aluminum film, a tungsten film, or an inorganic insulating film (e.g., a silicon nitride film) formed by a sputtering method.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. The SBS structure allows optimization of materials and structures of light-emitting devices and thus can extend freedom of choice of the materials and the structures, which makes it easy to improve the luminance and the reliability.

In this specification and the like, a light-emitting device capable of emitting white light may be referred to as a white light-emitting device. Note that a combination of white light-emitting devices with coloring layers (e.g., color filters) enables a full-color display device.

Structures of light-emitting devices can be classified roughly into the single structure and the tandem structure. A device with the single structure includes one light-emitting unit between a pair of electrodes, and the light-emitting unit preferably includes one or more light-emitting layers. When white light emission is obtained using two light-emitting layers, the two light-emitting layers are selected such that emission colors of the light-emitting layers are complementary colors. For example, when emission colors of a first light-emitting layer and a second light-emitting layer are complementary colors, the light-emitting device can be configured to emit white light as a whole. When white light emission is obtained using three or more light-emitting layers, the light-emitting device is configured to emit white light as a whole by combining emission colors of the three or more light-emitting layers. To obtain a white color by using three or more light-emitting layers, the light-emitting device is configured to emit white light as a whole by combining emission colors of the three or more light-emitting layers.

A device having the tandem structure includes two or more light-emitting units between a pair of electrodes, and each light-emitting unit preferably includes one or more light-emitting layers. To obtain white light emission, the structure is employed in which light from light-emitting layers of a plurality of light-emitting units is combined to enable white light emission. Note that a structure for obtaining white light emission is similar to a structure of the case of the single structure. In the device having the tandem structure, a charge-generation layer is suitably provided between the plurality of light-emitting units.

Furthermore, a display device with a high contrast ratio can be obtained by combining a white light-emitting device (one or both of a single structure and a tandem structure), a color filter, and the MML structure of one embodiment of the present invention.

When the above-described white light-emitting device (having the single structure or the tandem structure) and a light-emitting device having the SBS structure are compared with each other, the light-emitting device having the SBS structure can have lower power consumption than the white light-emitting device. To reduce power consumption, a light-emitting device having the SBS structure is preferably used. Meanwhile, the white light-emitting device is preferable in terms of lower manufacturing cost or higher manufacturing yield because the manufacturing process of the white light-emitting device is simpler than that of a light-emitting device having the SBS structure.

In particular, in the case where a light-emitting device having an MML structure employs the SBS structure, a layer provided between light-emitting devices (e.g., also referred to as an organic layer or a common layer which is shared by the light-emitting devices) is divided; accordingly, display with no or extremely low side leakage can be achieved.

In the display device of this embodiment, the distance between the light-emitting devices can be narrowed. Specifically, the distance between the light-emitting devices, the distance between the EL layers, or the distance between the pixel electrodes can be less than 10 µm, less than or equal to 5 µm, less than or equal to 3 µm, less than or equal to 2 µm, less than or equal to 1 µm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display device includes a region where the distance between the side surface of the first layer 313a and the side surface of the second layer 313b or the distance between the side surface of the second layer 313b and the side surface of the third layer 313c is less than or equal to 1 µm, preferably less than or equal to 0.5 µm (500 nm), further preferably less than or equal to 100 nm.

A light-blocking layer may be provided on the surface of the substrate 320 on the resin layer 322 side. Any of a variety of optical members can be arranged on the outer surface of the substrate 320. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 320.

For the substrate 320, glass, quartz, ceramics, sapphire, a resin, a metal, an alloy, a semiconductor, or the like can be used. The substrate on the side from which light from the light-emitting device is extracted is formed using a material that transmits the light. When the substrate 320 is formed using a flexible material, the flexibility of the display device can be increased. Furthermore, a polarizing plate may be used as the substrate 320.

For the substrate 320, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 320.

In the case where a circularly polarizing plate overlaps with the display device, a substrate with high optical isotropy is preferably used as the substrate included in the display device. A substrate with high optical isotropy has a low birefringence (in other words, a small amount of birefringence).

The absolute value of a retardation (phase difference) of a substrate having high optical isotropy is preferably less than or equal to 30 nm, further preferably less than or equal to 20 nm, still further preferably less than or equal to 10 nm.

Examples of a film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the resin layer 322, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene-vinyl acetate) resin. In particular, a material with low moisture permeability, such as an epoxy resin, is preferable. A two-component-mixture-type resin may be used. An adhesive sheet or the like may be used.

As examples of the materials that can be used for the gate, the source, and the drain of the transistor and conductive layers such as a variety of wirings and electrodes included in the display device, metals such as aluminum, titanium, chromium, nickel, copper, yttrium, zirconium, molybdenum, silver, tantalum, and tungsten, and an alloy containing any of these metals as its main component can be given. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to allow light transmission. Alternatively, a stacked-layer film of any of the above materials can be used for the conductive layers. For example, a stacked-layer film of indium tin oxide and an alloy of silver and magnesium is preferably used to increase conductivity. They can also be used for conductive layers such as a variety of wirings and electrodes included in the display device, and the conductive layer (the conductive layer functioning as the pixel electrode or the common electrode) included in the light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

Next, materials that can be used in the light-emitting device will be described.

A conductive film that transmits visible light and infrared light is used for the electrode through which light is extracted among the pixel electrode and the common electrode. A conductive film that reflects visible light and infrared light is preferably used for the electrode through which light is not extracted.

The light-emitting device preferably employs a microcavity structure. Therefore, one of the pair of electrodes of the light-emitting device preferably includes an electrode having properties of transmitting and reflecting visible light (a semi-transmissive and semi-reflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

Note that the semi-transmissive and semi-reflective electrode can have a stacked-layer structure of a reflective electrode having a property of reflecting visible light and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting device. The semi-transmissive and semi-reflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1 \times 10^{-2}$ Ωcm. The near-infrared light (light at wavelengths greater than or equal to 750 nm and less than or equal to 1300 nm) transmittance and reflectivity of these electrodes preferably satisfy the above-described numerical ranges of the visible light transmittance and reflectivity.

The first layer 313a, the second layer 313b, and the third layer 313c each include the light-emitting layer. The first layer 313a, the second layer 313b, and the third layer 313c preferably include the light-emitting layers that emit light of different colors.

The light-emitting layer is a layer containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is appropriately used. A substance that emits near-infrared light can also be used as the light-emitting substance.

In addition to the light-emitting layer, the first layer 313a, the second layer 313b, and the third layer 313c may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used in the light-emitting device, and an inorganic compound may also be included. Each layer included in the light-emitting device can be formed by an evaporation method (including a vacuum evaporation method), a transfer method, a printing method, an ink-jet method, a coating method, or the like.

For example, the first layer 313a, the second layer 313b, and the third layer 313c may each include one or more of a hole-injection layer, a hole-transport layer, a hole-blocking layer, an electron-blocking layer, an electron-transport layer, and an electron-injection layer. Furthermore, the first layer 313a, the second layer 313b, and the third layer 313c may each include a charge-generation layer (also referred to as an intermediate layer).

The fourth layer 314 can include one or more of a hole-injection layer, a hole-transport layer, a hole-blocking layer, an electron-blocking layer, an electron-transport layer, and an electron-injection layer. For example, in the case where the conductive layer 311a to the conductive layer 311c each function as an anode and the common electrode 315 functions as a cathode, the fourth layer 314 preferably includes an electron-injection layer.

The hole-injection layer is a layer injecting holes from an anode to a hole-transport layer and containing a material with a high hole-injection property. Examples of the material with a high hole-injection property include an aromatic amine compound and a composite material containing a hole-transport material and an acceptor material (electron-accepting material).

Thin films that form the display device (insulating films, semiconductor films, conductive films, and the like) can be formed by a sputtering method, a CVD method, a vacuum evaporation method, a PLD method, an ALD method, or the like. Examples of the CVD method include a plasma enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the display device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For fabrication of the light-emitting devices, a vacuum process such as an evaporation method or a solution process such as a spin coating method or an ink-jet method can be especially used. As examples of the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. Specifically, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

The thin films included in the display device can be processed by a photolithography method or the like. Alternatively, a nanoimprinting method, a sandblasting method, a lift-off method, or the like may be used for the processing of the thin films. Island-shaped thin films may be directly formed by a film formation method using a shielding mask such as a metal mask.

As described above, in the display device of one embodiment of the present invention, an island-shaped EL layer is formed by processing an EL layer deposited on the entire surface, not by using a pattern of a metal mask; thus, the island-shaped EL layer can have a uniform thickness. In addition, a high-resolution display device or a display device with a high aperture ratio, which has been difficult to achieve, can be fabricated. Moreover, EL layers can be formed separately for the respective colors, enabling the display device to perform extremely clear display with high contrast and high display quality. In addition, a sacrificial layer provided over an EL layer can reduce damage to the EL layer in the manufacturing process of the display device, increasing the reliability of the light-emitting device.

The display device of one embodiment of the present invention has a structure including the OS transistor and the light-emitting device having the MML (metal mask less) structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, a high chroma, and a high contrast ratio in an image displayed on the display device. With the structure where the leakage current that might flow through the transistor and the lateral leakage current that might flow between light-emitting elements are extremely low, display with little leakage of light at the time of black display (i.e., with few phenomena in which the black image looks whitish) (such display is also referred to as deep black display) can be achieved.

The display device of one embodiment of the present invention can have a structure in which an insulator covering the end portion of the pixel electrode is not provided. In other words, an insulator is not provided between the pixel electrode and the EL layer in the structure. With such a structure, light can be efficiently extracted from the EL layer, leading to extremely low viewing angle dependence. For example, in the display device of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display device of one embodiment of the present invention can have improved viewing angle dependence and high image visibility.

In the case where a display device is formed using the fine metal mask (FMM) structure, the pixel arrangement structure or the like is limited in some cases. Here, the FMM structure will be described below.

In the FMM structure, a metal mask provided with an opening portion (also referred to as an FMM) is set to be opposed to a substrate so that an EL can be deposited to a desired region at the time of EL evaporation. Then, the EL is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM. Therefore, the weight and strength of the FMM are important parameters.

The pixel arrangement structure with an FMM needs to be designed under certain restrictions; for example, the above-described parameters and the like need to be considered. By contrast, in the display device of one embodiment of the present invention manufactured using an MML structure, an excellent effect such as higher flexibility in the pixel arrangement structure or the like than the FMM structure can be exhibited. This structure is highly compatible with a flexible device or the like, for example, and thus one or both of a pixel and a driver circuit can have a variety of circuit arrangements.

The first layer, the second layer, and the third layer included in the light-emitting devices of different colors are formed in separate steps. Accordingly, the EL layers can be formed to have structures (material, thickness, and the like) appropriate for the light-emitting devices of the respective colors. Thus, the light-emitting devices can have favorable characteristics.

This embodiment can be combined with the other embodiments as appropriate.

Embodiment 3

In this embodiment, the display device of one embodiment of the present invention will be described with reference to FIG. 14, FIG. 15A, and FIG. 15B.

The display device in this embodiment can be a high-definition display device or a large-sized display device. Accordingly, the display device of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Device]

Figure 14:
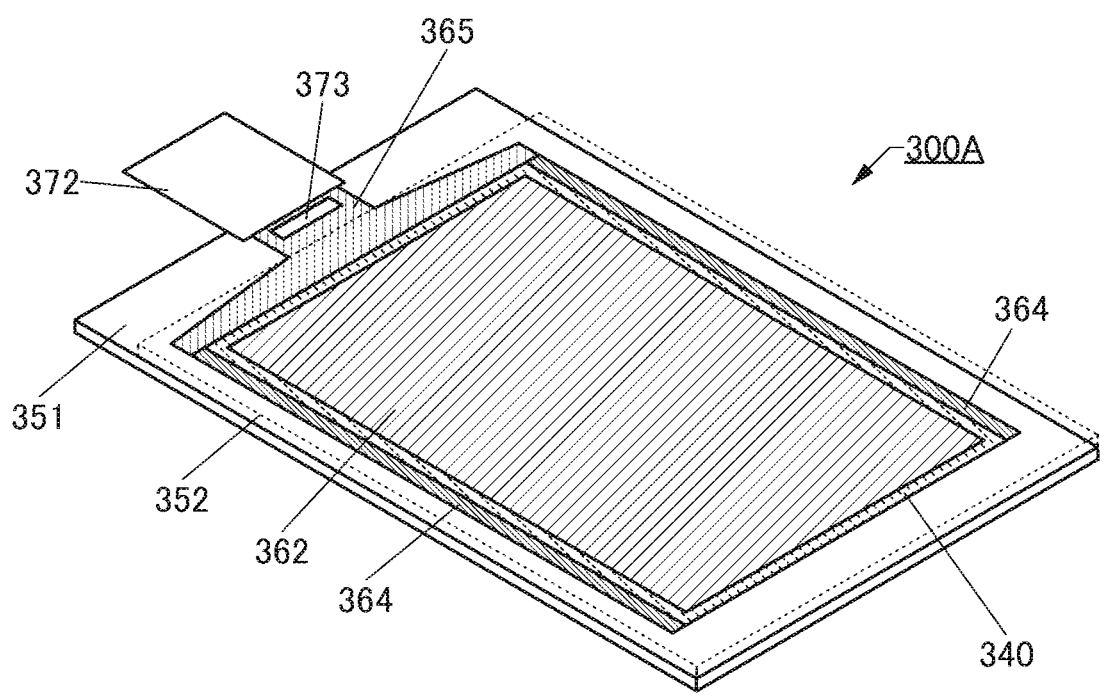
FIG. 14 is a perspective view illustrating an example of a display device.

FIG. 14 is a perspective view of a display device 300A, and FIG. 15A is a cross-sectional view of the display device 300A.

The display device 300A has a structure where a substrate 352 and a substrate 351 are bonded to each other. In FIG. 14, the substrate 352 is denoted by a dashed line.

The display device 300A includes a display portion 362, the connection portion 340, a circuit 364, a wiring 365, and the like. FIG. 14 illustrates an example in which an IC 373 and an FPC 372 are mounted on the display device 300A. Thus, the structure illustrated in FIG. 14 can be regarded as a display module including the display device 300A, the IC (integrated circuit), and the FPC.

The connection portion 340 is provided outside the display portion 362. The connection portion 340 can be provided along one or more sides of the display portion 362. The number of connection portions 340 can be one or more. FIG. 14 illustrates an example where the connection portion 340 is provided to surround the four sides of the display portion. A common electrode of a light-emitting device is electrically connected to a conductive layer in the connection portion 340, so that a potential can be supplied to the common electrode.

As the circuit 364, a scan line driver circuit can be used, for example.

The wiring 365 has a function of supplying a signal and power to the display portion 362 and the circuit 364. The signal and power are input to the wiring 365 from the outside through the FPC 372 or from the IC 373.

FIG. 14 illustrates an example in which the IC 373 is provided over the substrate 351 by a COG (Chip On Glass) method, a COF (Chip On Film) method, or the like. An IC including a scan line driver circuit, a signal line driver circuit, or the like can be used as the IC 373, for example. Note that the display device 300A and the display module are not necessarily provided with an IC. The IC may be mounted on the FPC by a COF method or the like.

FIG. 15A illustrates an example of cross sections of part of a region including the FPC 372, part of the circuit 364, part of the display portion 362, part of the connection portion 340, and part of a region including an end portion in the display device 300A.

The display device 300A illustrated in FIG. 15A includes a transistor 201, a transistor 205, the light-emitting device 330a which emits red light, the light-emitting device 330b which emits green light, the light-emitting device 330c which emits blue light, and the like between the substrate 351 and the substrate 352.

The light-emitting device 330a includes the conductive layer 311a, a conductive layer 312a over the conductive layer 311a, and a conductive layer 326a over the conductive layer 312a. All of the conductive layer 311a, the conductive layer 312a, and the conductive layer 326a can be referred to as the pixel electrode, or one or two of them can be referred to as the pixel electrode.

The conductive layer 311a is connected to a conductive layer 222b included in the transistor 205 through an opening provided in an insulating layer 324. The end portion of the conductive layer 312a is positioned outward from the end portion of the conductive layer 311a. The end portion of the conductive layer 312a and the end portion of the conductive layer 326a are aligned or substantially aligned with each other. For example, a conductive layer functioning as a reflective electrode can be used as the conductive layer 311a and the conductive layer 312a, and a conductive layer functioning as a transparent electrode can be used as the conductive layer 326a.

The light-emitting device 330b includes the conductive layer 311b, a conductive layer 312b over the conductive layer 311b, and a conductive layer 326b over the conductive layer 312b.

The light-emitting device 330c includes a conductive layer 311c, a conductive layer 312c over the conductive layer 311c, and a conductive layer 326c over the conductive layer 312c.

Detailed description of the conductive layer 311b, the conductive layer 312b, and the conductive layer 326b of the light-emitting device 330b and the conductive layer 311c, the conductive layer 312c, and the conductive layer 326c of the light-emitting device 330c is omitted because these conductive layers are similar to the conductive layer 311a, the conductive layer 312a, and the conductive layer 326a of the light-emitting device 330a.

Depressed portions are formed on the conductive layer 311a, the conductive layer 311b, and the conductive layer 311c to cover the openings provided in the insulating layer 324. A layer 328 is embedded in each of the depressed portions.

The layer 328 has a function of enabling planarization in the depressed portions of the conductive layer 311a, the conductive layer 311b, and the conductive layer 311c. Over the conductive layer 311a, the conductive layer 311b, the conductive layer 311c, and the layer 328, the conductive layer 312a, the conductive layer 312b, and the conductive layer 312c that are respectively connected electrically to the conductive layer 311a, the conductive layer 311b, and the conductive layer 311c are provided. Thus, regions overlapping with the depressed portions of the conductive layer 311a, the conductive layer 311b, and the conductive layer 311c can also be used as the light-emitting regions, increasing the aperture ratio of the pixels.

The layer 328 may be an insulating layer or a conductive layer. Any of a variety of inorganic insulating materials, organic insulating materials, and conductive materials can be used for the layer 328 as appropriate. In particular, the layer 328 is preferably formed using an insulating material.

An insulating layer containing an organic material can be suitably used as the layer 328. For the layer 328, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can also be used for the layer 328. As the photosensitive resin, a positive photosensitive material or a negative photosensitive material can be used.

When a photosensitive resin is used, the layer 328 can be formed through only light-exposure and development steps, reducing the influence of dry etching, wet etching, or the like on the surfaces of the conductive layer 311a, the conductive layer 311b, and the conductive layer 311c. When the layer 328 is formed using a negative photosensitive resin, the layer 328 can sometimes be formed using the same photomask (light-exposure mask) as the photomask used for forming the opening in the insulating layer 324.

The top surface and the side surface of the conductive layer 312a and the top surface and the side surface of the conductive layer 326a are covered with the first layer 313a. The top surface and the side surface of the conductive layer 312b and the top surface and the side surface of the conductive layer 326b are covered with the second layer 313b. Moreover, the top surface and the side surface of the conductive layer 312c and the top surface and the side surface of the conductive layer 326c are covered with the third layer 313c. Accordingly, regions provided with the conductive layer 312a, the conductive layer 312b, or the conductive layer 312c can be entirely used as the light-emitting regions of the light-emitting device 330a, the light-emitting device 330b, or the light-emitting device 330c, increasing the aperture ratio of the pixel.

The side surfaces of the first layer 313a, the second layer 313b, and the third layer 313c are covered with the insulating layer 325 and the insulating layer 327. The sacrificial layer 318a is positioned between the first layer 313a and the insulating layer 325, the sacrificial layer 318b is positioned between the second layer 313b and the insulating layer 325, and the sacrificial layer 318c is positioned between the third layer 313c and the insulating layer 325. The fourth layer 314 is provided over the first layer 313a, the second layer 313b, the third layer 313c, the insulating layer 325 and the insulating layer 327, and the common electrode 315 is provided over the fourth layer 314. The fourth layer 314 and the common electrode 315 are each one continuous film shared by the light-emitting device and the light-emitting devices. The protective layer 331 is provided over the light-emitting device 330a, the light-emitting device 330b, and the light-receiving device 330c.

The protective layer 331 and the substrate 352 are bonded to each other with an adhesive layer 342. A solid sealing structure, a hollow sealing structure, or the like can be employed to seal the light-emitting devices. In FIG. 15A, a solid sealing structure is employed in which a space between the substrate 352 and the substrate 351 is filled with the adhesive layer 342. Alternatively, a hollow sealing structure in which the space is filled with an inert gas (e.g., nitrogen or argon) may be employed. The adhesive layer 342 may be provided not to overlap with the light-emitting device. The space may be filled with a resin different from that of the frame-like adhesive layer 342.

The conductive layer 323 is provided over the insulating layer 324 in the connection portion 340. An example is described in which the conductive layer 323 has a stacked-layer structure of a conductive film obtained by processing the same conductive film as the conductive layer 311a, the conductive layer 311b, and the conductive layer 311c; a conductive film obtained by processing the same conductive film as the conductive layer 312a, the conductive layer 312b, and the conductive layer 312c; and a conductive film obtained by processing the same conductive film as the conductive layers 326b, 326c, and 326a. The end portion of the conductive layer 323 is covered with the sacrificial layer, the insulating layer 325, and the insulating layer 327. The fourth layer 314 is provided over the conductive layer 323, and the common electrode 315 is provided over the fourth layer 314. The conductive layer 323 and the common electrode 315 are electrically connected to each other through the fourth layer 314. Note that a structure in which the fourth layer 314 is not formed in the connection portion 340 may be employed. In that case, the conductive layer 323 and the common electrode 315 are in direct contact with each other to be electrically connected to each other.

The display device 300A is of a top-emission type. Light from the light-emitting device is emitted toward the substrate 352 side. For the substrate 352, a material having a high visible-light-transmitting property is preferably used. The pixel electrode contains a material that reflects visible light, and a counter electrode (the common electrode 315) contains a material that transmits visible light.

The insulating layer 215 is provided to cover the transistors. The insulating layer 324 is provided to cover the transistors and has a function of a planarization layer. Note that there is no limitation on the number of insulating layers covering the transistors, and either a single layer or two or more layers may be employed.

A material that does not easily allow diffusion of impurities such as water and hydrogen is preferably used for at least one of the insulating layers covering the transistors. In that case, the insulating layer can function as a barrier layer. Such a structure can effectively inhibit diffusion of impurities into the transistors from the outside and increase the reliability of the display device.

An inorganic insulating film is preferably used as the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film can be suitably used for the insulating layer 324 functioning as the planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The insulating layer 324 may have a stacked-layer structure of an organic insulating film and an inorganic insulating film. The outermost layer of the insulating layer 324 preferably functions as an etching protective film. In that case, the formation of a depressed portion in the insulating layer 324 can be inhibited in processing of the conductive layer 311b, the conductive layer 312b, the conductive layer 326b, or the like. Alternatively, a depressed portion may be formed in the insulating layer 324 in processing of the conductive layer 311b, the conductive layer 312b, the conductive layer 326b, or the like.

A connection portion 204 is provided in a region of the substrate 351 where the substrate 352 does not overlap. In the connection portion 204, the wiring 365 is electrically connected to the FPC 372 through a conductive layer 366 and a connection layer 203. An example is described in which the conductive layer 366 has a stacked-layer structure of a conductive film obtained by processing the same conductive film as the conductive layer 311a, the conductive layer 311b, and the conductive layer 311c; a conductive film obtained by processing the same conductive film as the conductive layer 312a, the conductive layer 312b, and the conductive layer 312c; and a conductive film obtained by processing the same conductive film as the conductive layer 326a, the conductive layer 326b, and the conductive layer 326c. On the top surface of the connection portion 204, the conductive layer 366 is exposed. Thus, the connection portion 204 and the FPC 372 can be electrically connected to each other through the connection layer 203.

A light-blocking layer 317 is preferably provided on the surface of the substrate 352 on the substrate 351 side. The light-blocking layer 317 can be provided between adjacent light-emitting devices, in the connection portion 340, and in the circuit 364, for example. Any of a variety of optical members can be arranged on the outer surface of the substrate 352. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 352.

The protective layer 331 provided to cover the light-emitting devices and the light-receiving device can inhibit an impurity such as water from entering the light-emitting devices and the light-receiving device, and increase the reliability of the light-emitting devices and the light-receiving device.

For each of the substrate 351 and the substrate 352, glass, quartz, ceramics, sapphire, a resin, a metal, an alloy, a semiconductor, or the like can be used. The substrate on the side from which light from the light-emitting device is extracted is formed using a material that transmits the light. When the substrate 351 or the substrate 352 are formed using a flexible material, the flexibility of the display device can be increased. Furthermore, a polarizing plate may be used as the substrate 351 or the substrate 352.

For each of the substrate 351 and the substrate 352, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 351 and the substrate 352.

In the case where a circularly polarizing plate overlaps with the display device, a substrate with high optical isotropy is preferably used as the substrate included in the display device. A substrate with high optical isotropy has a low birefringence (in other words, a small amount of birefringence).

The absolute value of a retardation (phase difference) of a substrate having high optical isotropy is preferably less than or equal to 30 nm, further preferably less than or equal to 20 nm, still further preferably less than or equal to 10 nm.

Examples of a film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

As the adhesive layer 342, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene-vinyl acetate) resin. In particular, a material with low moisture permeability, such as an epoxy resin, is preferable. A two-component-mixture-type resin may be used. An adhesive sheet or the like may be used.

For the connection layer 203, an anisotropic conductive film (ACF), an anisotropic conductive paste (ACP), or the like can be used.

As examples of the materials that can be used for the gate, the source, and the drain of the transistor and conductive layers such as a variety of wirings and electrodes included in the display device, metals such as aluminum, titanium, chromium, nickel, copper, yttrium, zirconium, molybdenum, silver, tantalum, and tungsten, and an alloy containing any of these metals as its main component can be given. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to allow light transmission. Alternatively, a stacked-layer film of any of the above materials can be used for the conductive layers. For example, a stacked-layer film of indium tin oxide and an alloy of silver and magnesium is preferably used to increase conductivity. They can also be used for conductive layers such as a variety of wirings and electrodes included in the display device, and the conductive layer (the conductive layer functioning as the pixel electrode or the common electrode) included in the light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

<Transistors>

FIG. 15B is an enlarged view of a cross section including the transistor 201 and the transistor 205.

The transistor 205 includes a semiconductor layer 108, an insulating layer 117, an insulating layer 110, and a conductive layer 112 that are stacked in this order. Parts of the insulating layer 117 and the insulating layer 110 function as gate insulating layers of the transistor 201. The conductive layer 112 functions as the gate electrode of the transistor 201. The transistor 201 is what is called a top-gate transistor, in which the gate electrode is provided over the semiconductor layer 108.

In the transistor 201, the semiconductor layer 208, the insulating layer 110, and the conductive layer 212 are stacked in this order. Part of the insulating layer 110 functions as a gate insulating layer of the transistor 205. The conductive layer 212 functions as a gate electrode of the transistor 205. The transistor 205 is what is called a top-gate transistor, in which the gate electrode is provided over the semiconductor layer 208. The transistor 205 is different from the transistor 201 in the formation surface of the semiconductor layer. Furthermore, the transistor 205 is different from the transistor 201 in the structure of the gate insulating layer.

The components of the transistor 201 and the transistor 205 other than their semiconductor layers can be formed in the same steps. This can inhibit an increase in the number of steps even when two types of transistors are incorporated.

The transistor 205 illustrated in FIG. 15B includes a conductive layer 106 functioning as a back gate. In addition, the transistor 201 illustrated in FIG. 15B includes a conductive layer 206 functioning as a back gate.

In FIG. 15B, the conductive layer 106 is provided over and in contact with the substrate 351. An insulating layer 103 is provided over and in contact with the conductive layer 106 and the substrate 351. The conductive layer 108 is provided on and in contact with the insulating layer 103. The insulating layer 117 is provided in contact with top surfaces of the insulating layer 103 and the substrate 351 and a top surface and a side surface of the semiconductor layer 108. The semiconductor layer 208 is provided over and in contact with the insulating layer 117. In other words, the semiconductor layer 208 is provided on a surface different from that of the semiconductor layer 108. The insulating layer 117 functions as a base film in the transistor 201. The insulating layer 110 is provided in contact with a top surface of the insulating layer 117 and top and side surfaces of the semiconductor layer 208. The conductive layer 112 and the conductive layer 212 are provided over and in contact with the insulating layer 110. The conductive layer 112 includes a region overlapping with the semiconductor layer 108 with the insulating layer 117 and the insulating layer 110 therebetween. The conductive layer 212 includes a region overlapping with the semiconductor layer 208 with the insulating layer 110 therebetween.

Preferably, the transistor 201 and the transistor 205 further include an insulating layer 118, as illustrated in FIG. 15B. The insulating layer 118 is provided to cover the insulating layer 110, the conductive layer 112, and the conductive layer 212 and functions as a protective layer protecting the transistor 201 and the transistor 205.

The transistor 205 may include a conductive layer 222a and a conductive layer 222b over the insulating layer 118. The conductive layer 222a functions as one of a source electrode and a drain electrode of the transistor 205, and the conductive layer 222b functions as the other of the source electrode and the drain electrode of the transistor 205. The conductive layer 222a and the conductive layer 222b are electrically connected to low-resistance regions 108N in the semiconductor layer 108 through opening portions provided in the insulating layer 118, the insulating layer 110, and the insulating layer 117.

The transistor 201 may include a conductive layer 365a and a conductive layer 365b over the insulating layer 118. The conductive layer 365a functions as one of a source electrode and a drain electrode of the transistor 201, and the conductive layer 365b functions as the other of the source electrode and the drain electrode of the transistor 201. The conductive layer 365a and the conductive layer 365b are electrically connected to low-resistance regions 208N in the semiconductor layer 208 through opening portions provided in the insulating layer 118 and the insulating layer 110.

Here, the semiconductor layer 108 and the semiconductor layer 208 preferably include metal oxides having different compositions. The semiconductor layer 108 and the semiconductor layer 208 can be formed by processing metal oxide films having different compositions. The display device of one embodiment of the present invention includes, over the same substrate, a plurality of transistors whose semiconductor layers have different compositions, and the components other than the semiconductor layers can be formed in the same steps.

As described above, electrical characteristics and reliability of a transistor depend on the composition of the metal oxide used for the semiconductor layer. Therefore, by determining the composition of the metal oxide in accordance with the electrical characteristics and reliability required for the transistor, the display device can have both good electrical characteristics and high reliability.

The case where the transistor 201 is used as a transistor required to have a high on-state current is described as an example. For example, in the case where In—Ga—Zn oxides are used for both of the semiconductor layer 108 and the semiconductor layer 208, it is possible to use, for the semiconductor layer 208, a metal oxide in which the ratio of the number of indium atoms to the number of atoms of the contained metal elements is higher than that for the semiconductor layer 108. For example, for the semiconductor layer 108, a metal oxide in which the ratio of the number of gallium atoms to the number of atoms of the contained metal elements is higher than that for the semiconductor layer 208 can be used.

Also in the case where an In—Ga—Zn oxide is used for the semiconductor layer 108 and a metal oxide containing indium, other than the In—Ga—Zn oxide, is used for the semiconductor layer 208, a metal oxide in which the ratio of the number of indium atoms to the number of atoms of the metal elements is higher than that for the semiconductor layer 108 can be used for the semiconductor layer 208.

A metal oxide containing indium, other than the In—Ga—Zn oxide, can be used for the semiconductor layer 108. Also in that case, a metal oxide in which the ratio of the number of indium atoms to the number of atoms of the metal elements is higher than that for the semiconductor layer 108 can be used for the semiconductor layer 208.

Alternatively, for the semiconductor layer 108, a metal oxide in which the ratio of the number of indium atoms to the number of atoms of the contained metal elements is higher than that for the semiconductor layer 208 may be used.

The semiconductor layer 108 includes a region overlapping with the conductive layer 112 and a pair of low-resistance regions 108N between which the region is sandwiched. A region of the semiconductor layer 108 that overlaps with the conductive layer 112 functions as a channel formation region of the transistor 205. The pair of low-resistance regions 108N function as a source region and a drain region of the transistor 205. The semiconductor layer 208 similarly includes a channel formation region overlapping with the conductive layer 212 and a pair of low-resistance regions 208N between which the region is sandwiched.

In the transistor 205, the low-resistance region 108N can be regarded as a region having lower resistance than the channel formation region of the transistor 205, a region having a higher carrier concentration than the channel formation region, a region having a higher density of oxygen vacancy than the channel formation region, a region having a higher impurity concentration than the channel formation region, or an n-type region. Also in the transistor 201, the low-resistance region 208N can be regarded as a region having lower resistance than the channel formation region of the transistor 201, a region having a higher carrier concentration than the channel formation region, a region having a higher density of oxygen vacancy than the channel formation region, a region having a higher impurity concentration than the channel formation region, or an n-type region.

Each of the low-resistance region 108N and the low-resistance region 208N is a region including an impurity element. Examples of the impurity element are hydrogen, boron, carbon, nitrogen, fluorine, phosphorus, sulfur, arsenic, aluminum, and a noble gas. Note that typical examples of a noble gas include helium, neon, argon, krypton, and xenon. In particular, the low-resistance region 108N and the low-resistance region 208N preferably contain boron or phosphorus. The low-resistance region 108N and the low-resistance region 208N may contain two or more of the elements described above. Note that the low-resistance region 108N and the low-resistance region 208N may contain different impurity elements.

The low-resistance region 108N and the low-resistance region 208N can be formed by, for example, addition of an impurity through the insulating layer 110 with the conductive layer 112 and the conductive layer 212, respectively, used as masks.

Note that one structure or two or more kinds of structures may be employed for a plurality of transistors included in the circuit 364. Similarly, one structure or two or more kinds of structures may be employed for a plurality of transistors included in the display portion 362.

The transistors having the same structure may be used for the circuit 364 and the display portion 362.

For example, the transistor 205 may be used for the circuit 364.

Figure 16:
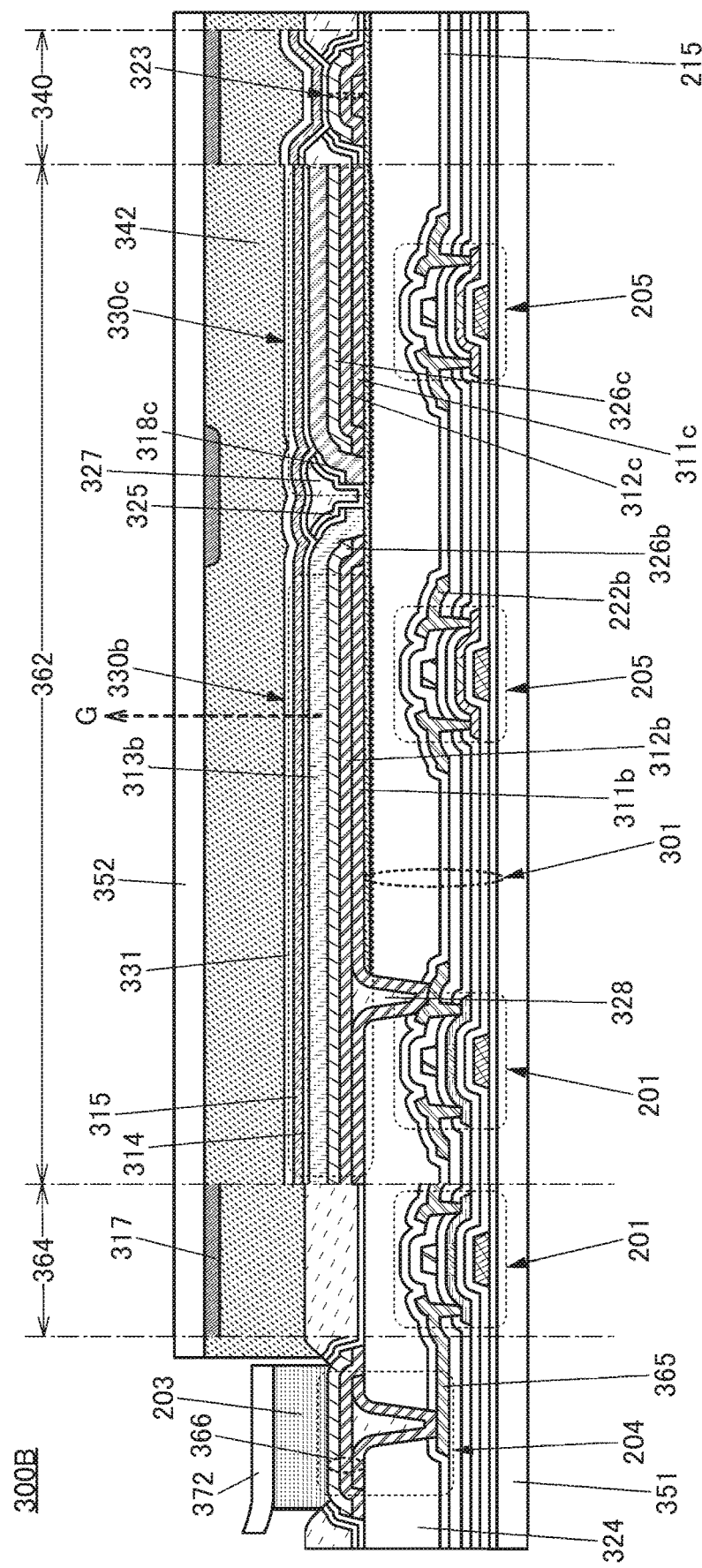
FIG. 16 is a cross-sectional view illustrating an example of a display device.

A display device 300B illustrated in FIG. 16 shows an example in which the transistor 201 and the transistor 205 are used as the transistors included in the display portion 362. When the pixel circuit included in the display portion 362 includes the transistor 201 and the transistor 205, a display device with high display quality and high reliability can be achieved. The manufacturing process of the display device can be made simpler than that of FIG. 17 described later.

Although the example in which the transistor 201 is used as a transistor included in the circuit 364 in the display device 300B illustrated in FIG. 16 is described, the transistor 205 may be used.

Figure 17:
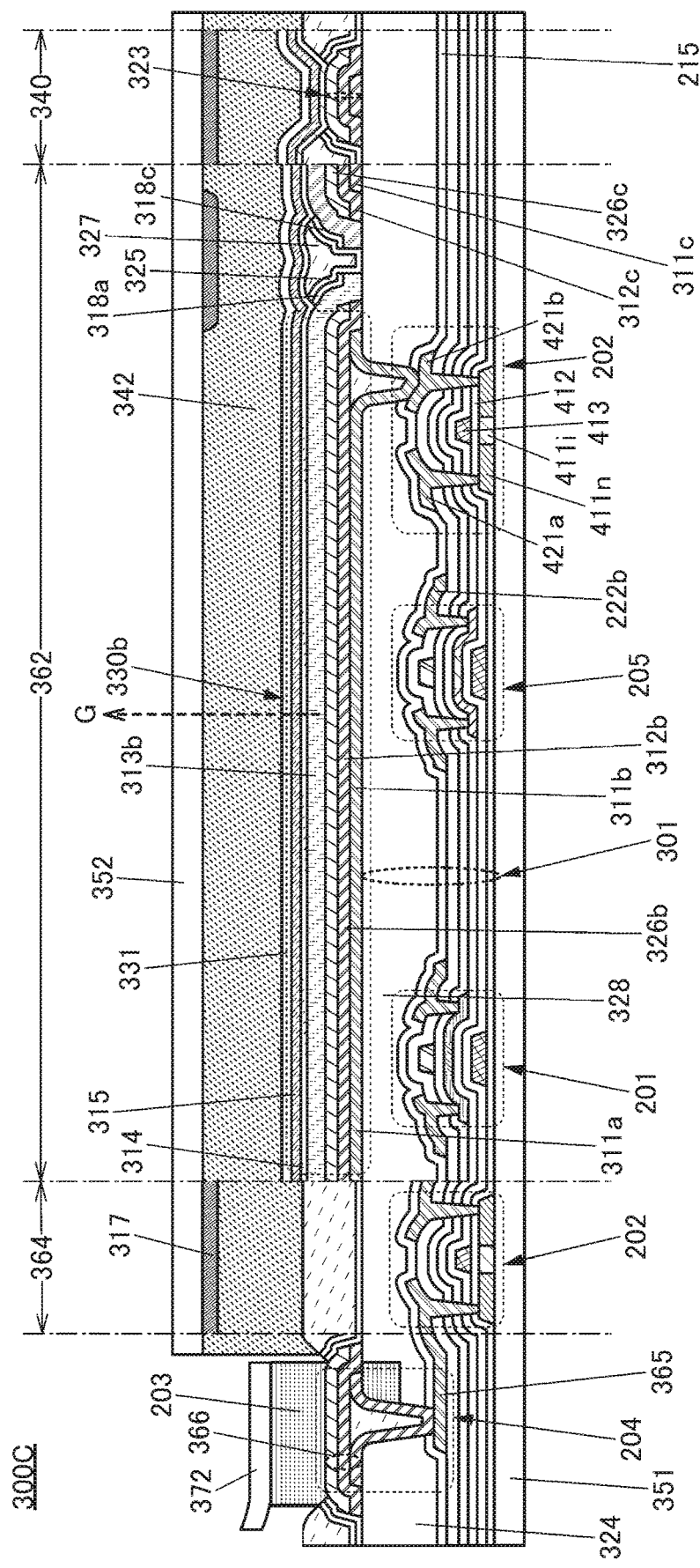
FIG. 17 is a cross-sectional view illustrating an example of a display device.

A display device 300C illustrated in FIG. 17 shows an example in which the transistor 201, the transistor 205, and the transistor 202 are used as the transistors in the display portion 362 and the transistor 202 is used as the transistor included in the circuit 364. When the pixel circuit included in the display portion 362 includes the transistor 201, the transistor 202, and the transistor 205, a display device with high display quality and high reliability can be achieved.

The transistor 202 includes a semiconductor layer 411, an insulating layer 412, a conductive layer 413, and the like. The semiconductor layer 411 includes a channel formation region 411i and low-resistance regions 411n. The semiconductor layer 411 contains silicon. The semiconductor layer 411 preferably contains polycrystalline silicon. For example, LTPS can be used as polycrystalline silicon. Part of the insulating layer 412 functions as a gate insulating layer. Part of the conductive layer 413 functions as a gate electrode.

The low-resistance regions 411n are regions containing an impurity element. For example, in the case where the transistor 202 is an n-channel transistor, phosphorus, arsenic, or the like is added to the low-resistance region 411n. Meanwhile, in the case where the transistor 202 is a p-channel transistor, boron, aluminum, or the like is added to the low-resistance region 411n. In addition, in order to control the threshold voltage of the transistor 202, the above-described impurity may be added to the channel formation region 411i.

The circuit 364 is formed using, for example, both n-channel transistors and p-channel transistors. Alternatively, the circuit 364 may be formed using only either n-channel transistors or p-channel transistors.

The transistor 202 may include a conductive layer 421a and a conductive layer 421b over the insulating layer 118. The conductive layer 421a functions as one of a source electrode and a drain electrode of the transistor 202, and the conductive layer 421b functions as the other of the source electrode and the drain electrode of the transistor 202. The conductive layer 421a and the conductive layer 421b are each electrically connected to the low-resistance region 411n through an opening portion provided in the insulating layer 118, the insulating layer 110, the insulating layer 117, and the insulating layer 412.

Here, the conductive layer 421a and the conductive layer 421b that are electrically connected to the transistor 202 are preferably formed by processing the same conductive film as that for the conductive layer 222a, the conductive layer 222b, the conductive layer 365a, and the conductive layer 365b. This is preferable because the manufacturing process can be simplified.

The conductive layer 413 functioning as the gate electrode of the transistor 202, the conductive layer 206 functioning as the second gate electrode of the transistor 201, and the conductive layer 106 functioning as the second gate of the transistor 205 are preferably formed by processing the same conductive film. This is preferable because the manufacturing process can be simplified.

Note that the transistor 202 may include a second gate electrode. When the transistor 202 includes the second gate electrode, for example, a conductive layer functioning as the second gate electrode is provided over the substrate 351, an insulating layer is provided in contact with top surfaces of the conductive layer and the substrate 351, and the semiconductor layer 411 is provided over the insulating layer. In addition, the conductive layer 413 and the conductive layer functioning as the second gate electrode preferably have a region where they overlap with each other.

At least part of this embodiment can be implemented in combination with the other embodiments described in this specification as appropriate.

Embodiment 4

In this embodiment, a light-emitting device that can be used in the display device of one embodiment of the present invention will be described.

Figure 18A:
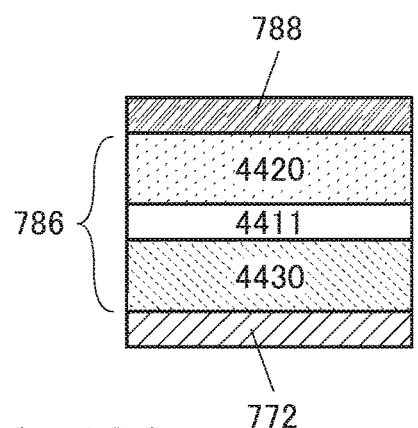
FIG. 18A to FIG. 18F are diagrams each illustrating a structure example of a light-emitting device.

As illustrated in FIG. 18A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430 provided between the pair of electrodes can function as a single light-emitting unit, and the structure in FIG. 18A is referred to as a single structure in this specification.

Figure 18B:
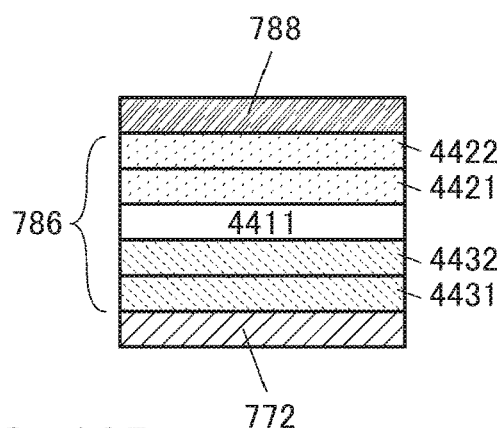

FIG. 18B is a modification example of the EL layer 786 included in the light-emitting device illustrated in FIG. 18A. Specifically, the light-emitting device illustrated in FIG. 18B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. When the lower electrode 772 is an anode and the upper electrode 788 is a cathode, for example, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layered structure, carriers can be efficiently injected to the light-emitting layer 4411, and the efficiency of the recombination of carriers in the light-emitting layer 4411 can be enhanced.

Figure 18C:
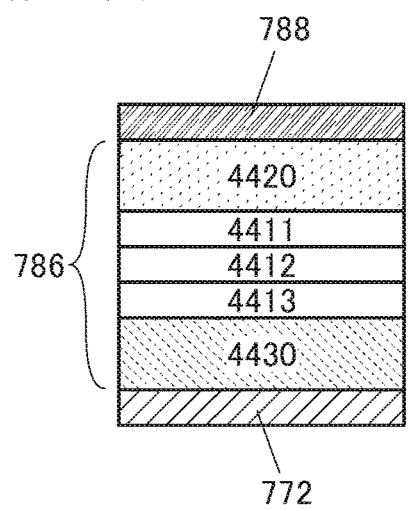
Figure 18D:
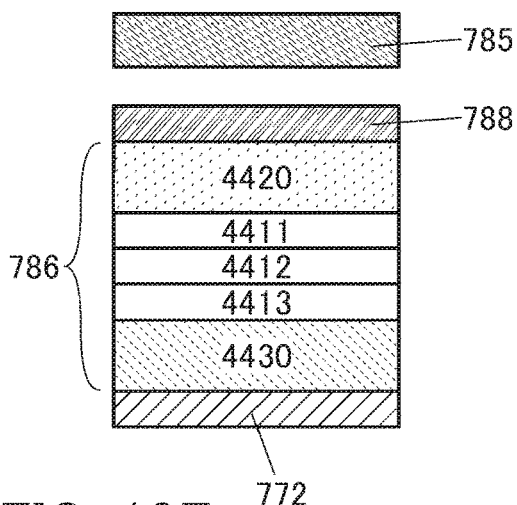

Note that a structure in which a plurality of light-emitting layers (light-emitting layers 4411, 4412, and 4413) are provided between the layer 4420 and the layer 4430 as illustrated in FIG. 18C or FIG. 18D is a variation of the single structure.

Figure 18E:
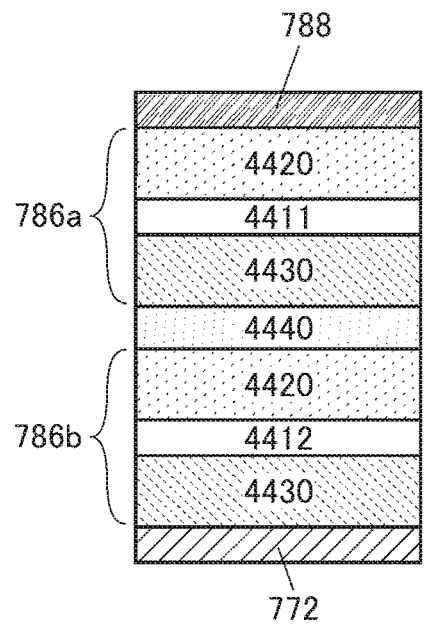
Figure 18F:
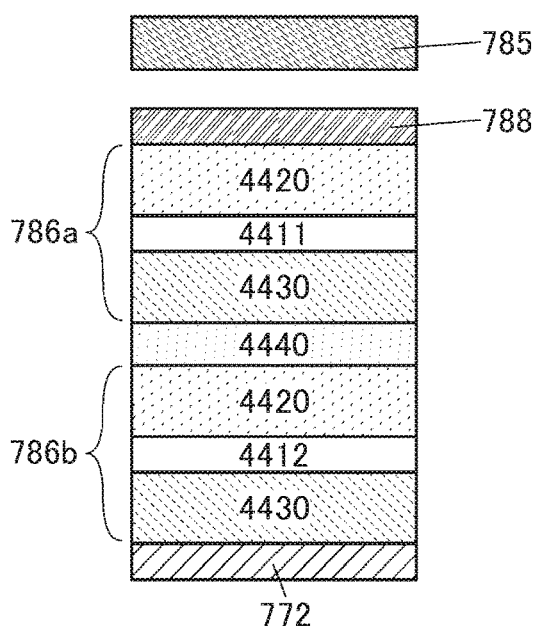

A structure in which a plurality of light-emitting units (an EL layer 786a and an EL layer 786b) are connected in series with a charge-generation layer 4440 therebetween as illustrated in FIG. 18E or FIG. 18F is referred to as a tandem structure in this specification. Note that a tandem structure may be referred to as a stack structure. The tandem structure enables a light-emitting device capable of high luminance light emission.

In FIG. 18C and FIG. 18D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 18D.

Alternatively, light-emitting materials that emit light of different colors may be used for the light-emitting layer 4411, the light-emitting layer 4412, and the light-emitting layer 4413. White light emission can be obtained when light emitted from the light-emitting layer 4411, light emitted from the light-emitting layer 4412, and light emitted from the light-emitting layer 4413 have a relationship of complementary colors. A color filter (also referred to as a coloring layer) may be provided as the layer 785 illustrated in FIG. 18D. When white light passes through a color filter, light of a desired color can be obtained.

In FIG. 18E and FIG. 18F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when light emitted from the light-emitting layer 4411 and light emitted from the light-emitting layer 4412 have a relationship of complementary colors. FIG. 18F illustrates an example in which the layer 785 is further provided. One or both of a color conversion layer and a color filter (coloring layer) can be used as the layer 785.

Also in the structures illustrated in FIG. 18C, FIG. 18D, FIG. 18E, and FIG. 18F, the layer 4420 and the layer 4430 may each have a stacked-layer structure of two or more layers as illustrated in FIG. 18B.

A structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, white, or the like depending on the material of the EL layer 786. Furthermore, the color purity can be further increased when the light-emitting device has a microcavity structure.

A light-emitting device that emits white light preferably contains two or more kinds of light-emitting substances in its light-emitting layer. To obtain white light emission, two or more light-emitting substances are selected such that their emission colors are complementary. For example, when the emission color of a first light-emitting layer and the emission color of a second light-emitting layer are complementary colors, it is possible to obtain a light-emitting device which emits white light as a whole. The same can be applied to a light-emitting device including three or more light-emitting layers.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

This embodiment can be combined with the other embodiments as appropriate.

Embodiment 5

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, an XRD spectrum of a quartz glass substrate shows a peak with a substantially bilaterally symmetrical shape. On the other hand, a peak of an XRD spectrum of an IGZO film having a crystal structure has a bilaterally asymmetrical shape. The asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in a diffraction pattern of an IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, silicon, boron, copper, vanadium, beryllium, iron, nickel, germanium, zirconium, molybdenum, lanthanum, cerium, neodymium, hafnium, tantalum, tungsten, magnesium, cobalt, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\zeta$ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, In—Zn oxide and In—Ga—Zn oxide are suitable because they can inhibit generation of a crystal grain boundary as compared with In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than [Ga] in the composition of the CAC-OS. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a film formation gas. The ratio of the flow rate of an oxygen gas to the total flow rate of the film formation gas at the time of film formation is preferably as low as possible, and for example, the ratio of the flow rate of an oxygen gas to the total flow rate of the film formation gas at the time of film formation is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current, high field-effect mobility, and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be obtained. In addition, a transistor having high reliability can be obtained.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film also be reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10$ 20 atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 6

In this embodiment, electronic devices of embodiments of the present invention will be described with reference to FIG. 19 to FIG. 21.

An electronic device of this embodiment is provided with the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or notebook personal computer, a monitor of a computer or the like, digital signage, and a large game machine like a pachinko machine.

The display device of one embodiment of the present invention can have high resolution, and thus can be favorably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display device of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display device having one or both of high definition and high resolution, the electronic device can provide higher realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 19A:
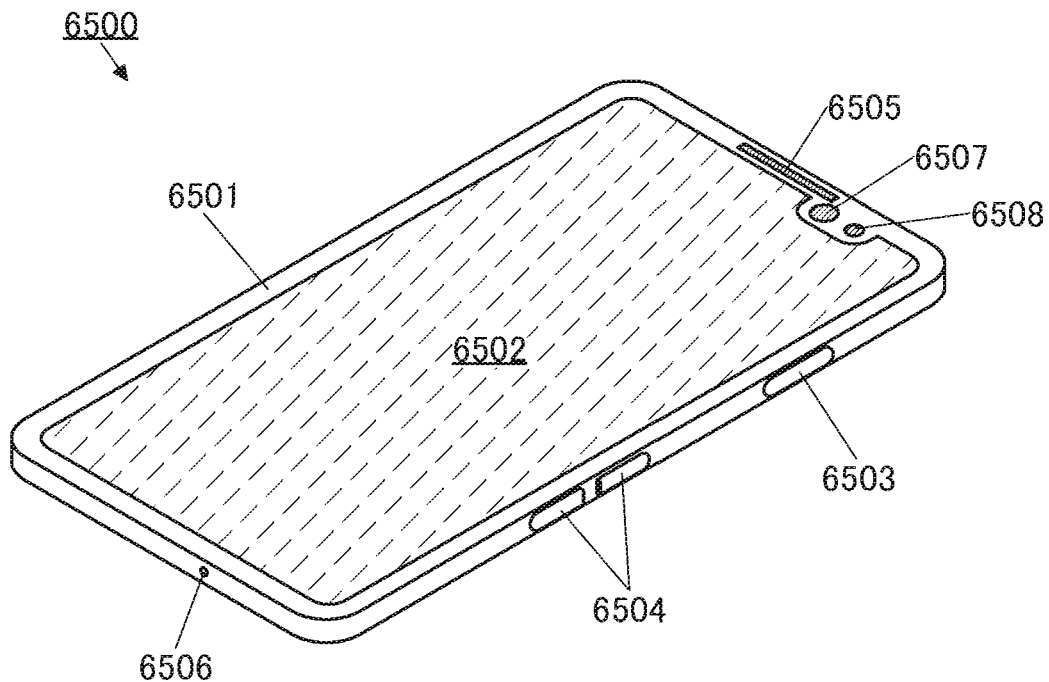
FIG. 19A and FIG. 19B are diagrams illustrating an example of an electronic device.

An electronic device 6500 illustrated in FIG. 19A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502.

Figure 19B:
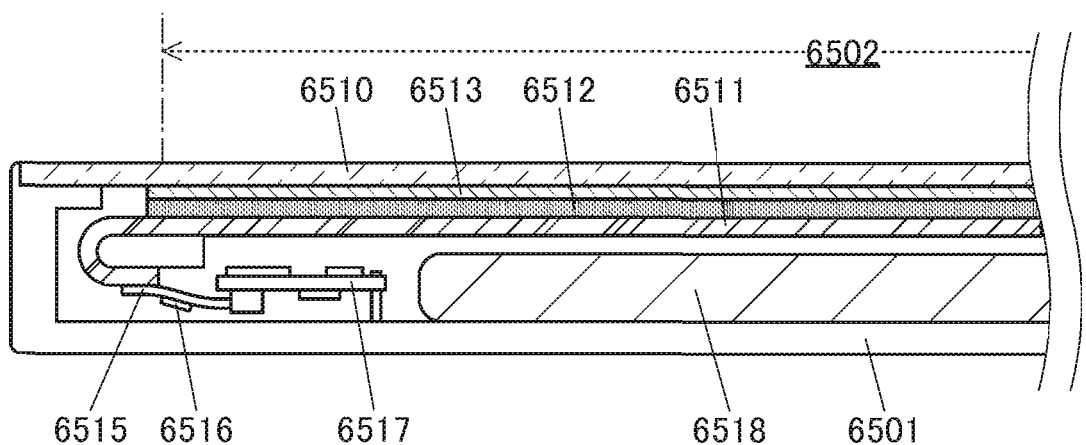

FIG. 19B is a schematic cross-sectional view including the end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be obtained. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the display portion, whereby an electronic device with a narrow bezel can be obtained.

Figure 20A:
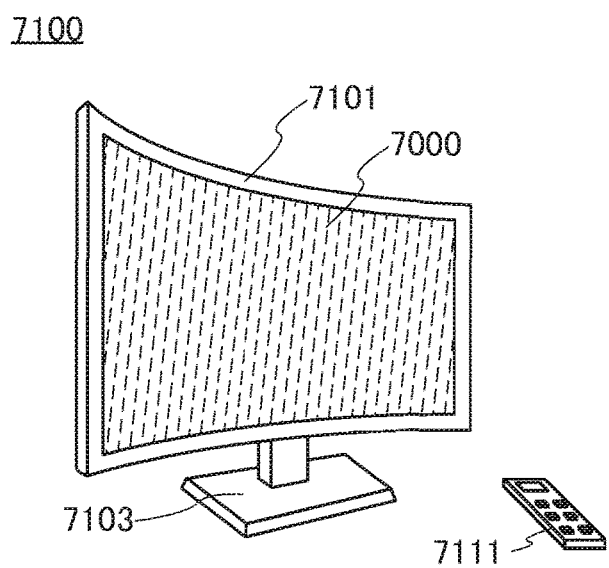
FIG. 20A to FIG. 20D are diagrams illustrating examples of electronic devices.

FIG. 20A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 20A can be performed with an operation switch provided in the housing 7101 and a separate remote controller 7111.

Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 20B:
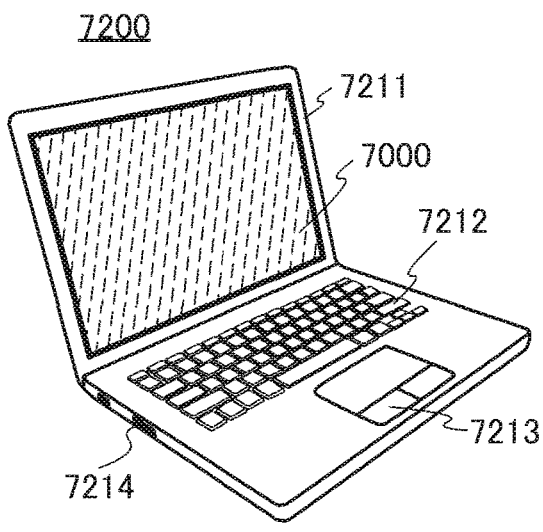

FIG. 20B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 20C:
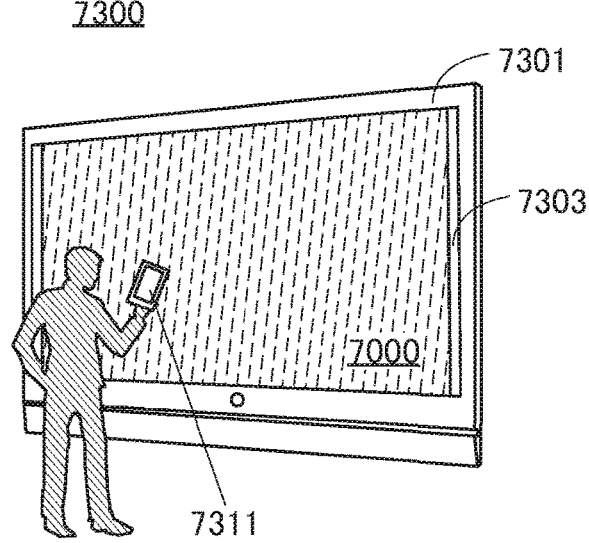
Figure 20D:
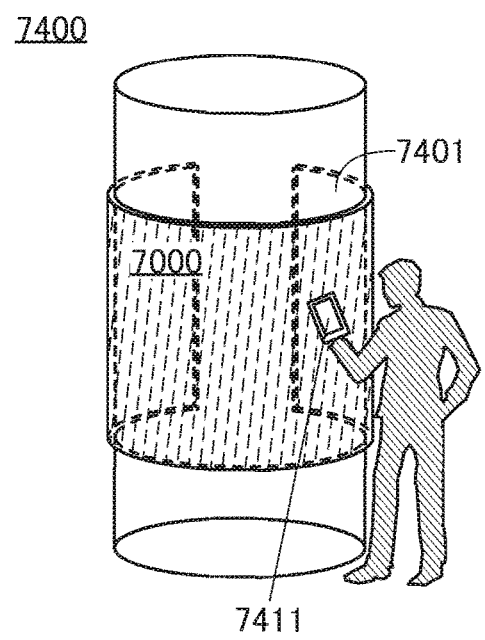

FIG. 20C and FIG. 20D illustrate examples of digital signage.

Digital signage 7300 illustrated in FIG. 20C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 20D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 20C and FIG. 20D.

A larger area of the display portion 7000 can increase the amount of information that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As shown in FIG. 23C and FIG. 23D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

The display portion included in the electronic device of one embodiment of the present invention preferably includes a light-receiving device as a sensor device. When the display portion includes both the light-emitting device and the light-receiving device, the number of components can be reduced. In other words, the electronic device of one embodiment of the present invention includes both the light-emitting device and the sensor device, so that, for example, a fingerprint authentication device or a capacitive touch panel device for scrolling or the like is not necessarily provided separately from the electronic device. Thus, one embodiment of the present invention can provide an electronic device with reduced manufacturing cost.

Electronic devices illustrated in FIG. 21A to FIG. 21F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 21A to FIG. 21F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 21A to FIG. 21F are described in detail below.

Figure 21A:
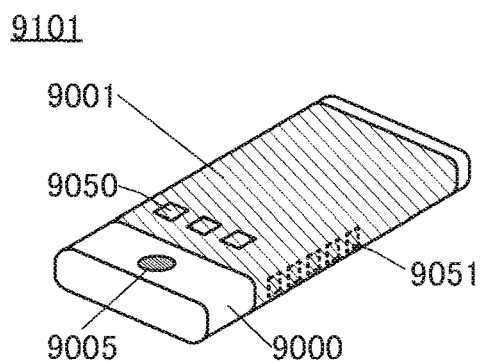
FIG. 21A to FIG. 21F are diagrams illustrating examples of electronic devices.

FIG. 21A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 21A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 21B:
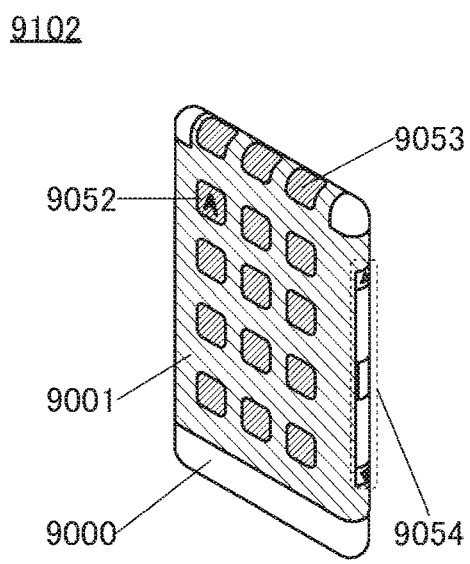

FIG. 21B is a perspective view illustrating a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 21C:
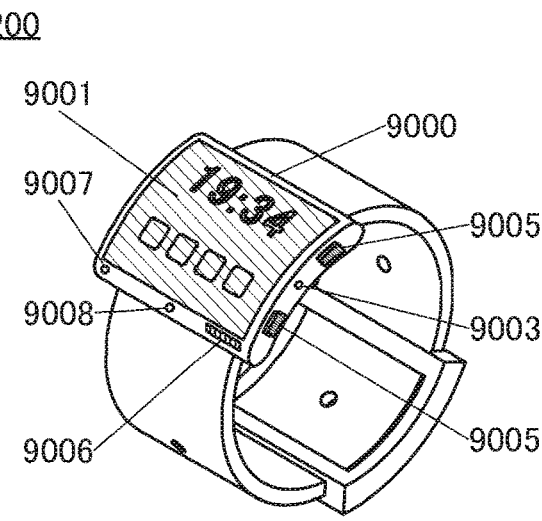

FIG. 21C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 21D:
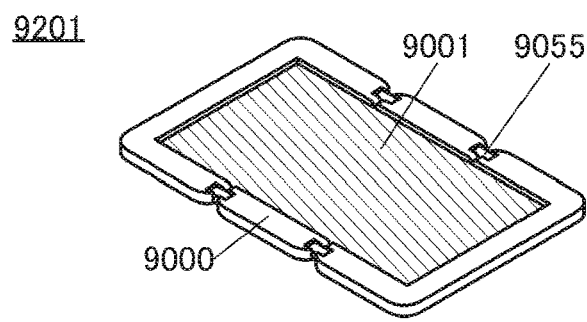
Figure 21E:
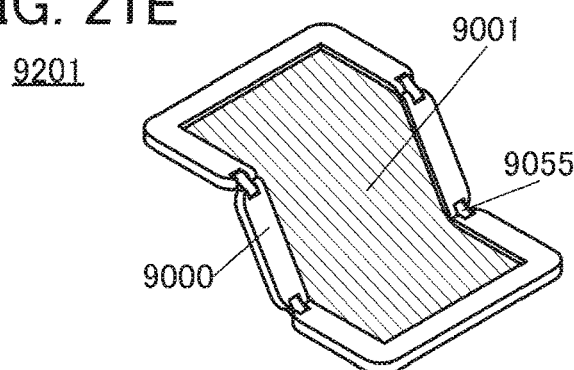
Figure 21F:
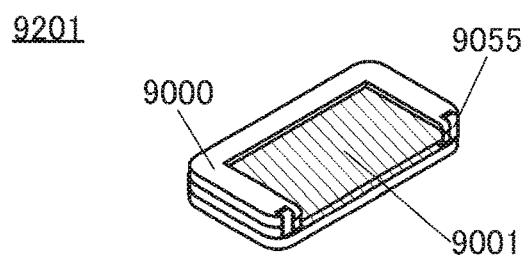

FIG. 21D to FIG. 21F are perspective views illustrating a foldable portable information terminal 9201. FIG. 21D is a perspective view of an opened state of the portable information terminal 9201, FIG. 21F is a perspective view of a folded state thereof, and FIG. 21E is a perspective view of a state in the middle of change from one of FIG. 21D and FIG. 21F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with the other embodiments as appropriate.

Example

In this example, characteristics of an OS transistor in one embodiment of the present invention and transistors using LTPS are described.

<Fabrication of Transistor 1>

An OS transistor was fabricated as a transistor 1.

First, a 100-nm-thick tungsten film was formed over a substrate by a sputtering method, and then processed to form a first conductive layer. Next, a first insulating layer was formed over the substrate and over the first conductive layer by a plasma CVD method. The first insulating layer had a stacked-layer structure of a 120-nm-thick silicon nitride film and a 150-nm-thick silicon oxynitride film.

Next, heat treatment was performed at 350° C. for 10 minutes.

Next, a 25-nm-thick metal oxide film was deposited over the first insulating layer and processed to obtain a semiconductor layer. For deposition of the metal oxide film, a sputtering method was employed and a metal oxide having an atomic ratio of metal elements of In:Ga:Zn=1:1:1 was used as a target.

Next, heat treatment was performed at 340° C. for 2 hours.

Next, as a second insulating layer, a 140-nm-thick silicon oxynitride film was formed over the semiconductor layer by a plasma CVD method.

Next, heat treatment was performed at 340° C. for one hour.

Then, a second conductive layer was formed over the second insulating layer. The second conductive layer had a stacked-layer structure of a 50-nm-thick titanium layer, a 200-nm-thick aluminum layer, and a 50-nm-thick titanium layer.

Next, a third insulating layer was formed over the second conductive layer, opening portions reaching the semiconductor layer were provided in the third insulating layer, and conductive layers functioning as a source electrode and a drain electrode were formed to fill the opening portions.

Through the above steps, the OS transistor formed over a glass substrate was obtained.

<Fabrication of Transistor 2 and Transistor 3>

Transistors using LTPS were fabricated as a transistor 2 and a transistor 3. The thickness of LTPS was 50 nm. As gate insulating layers, silicon oxynitride was used and the thickness was set to 110 nm. Each of the transistors had a top-gate structure and was formed to include a back gate. In the structure, 140-nm-thick silicon nitride oxide was provided over the back gate, 100-nm-thick silicon oxynitride was provided over the silicon nitride oxide, and LTPS was provided over the silicon oxynitride. The transistor 2 was an n-channel transistor and the transistor 3 was a p-channel transistor.

<Id-Vg Characteristics>

Then, the Id-Vg characteristics of the transistors samples fabricated above were measured.

The Id-Vg characteristics of the transistors were measured under the following conditions: the voltage applied to the gate electrode (hereinafter, also referred to as a gate voltage (Vg)) was applied in the range of −15 V to +20 V in 0.1 V steps (Pscan in the figure) and then in the range of +20 V to −15 V in 0.1 V steps (Mscan in the figure). Moreover, a voltage applied to the source electrode (hereinafter also referred to as a source voltage ($V_s$)) was 0 V (comm), and a voltage applied to the drain electrode (hereinafter also referred to as a drain voltage ($V_d$)) was 0.1 V and 10 V. Note that $1 \times 10^{-3}$ A was set to the upper limit in the measurement of the drain current (Id).

Here, the Id-Vg characteristics in the case of application of the same gate voltage to the second gate electrode and the first gate electrode were measured.

For the measurement, the transistors having a channel length of 10 μm and a channel width of 6 μm as designed values were used. As the OS transistor, a transistor having a channel length of 6 μm and a channel width of 6 μm as designed values was also used.

FIG. 22A, FIG. 22B, FIG. 23A, and FIG. 23B show the Id-Vg characteristics of the transistors. In each graph, the horizontal axis represents gate voltage (Vg), and the vertical axis represents drain current (Id). Two Id-Vg characteristics at drain voltages of 0.1 V and 10 V are shown together.

Figure 22A:
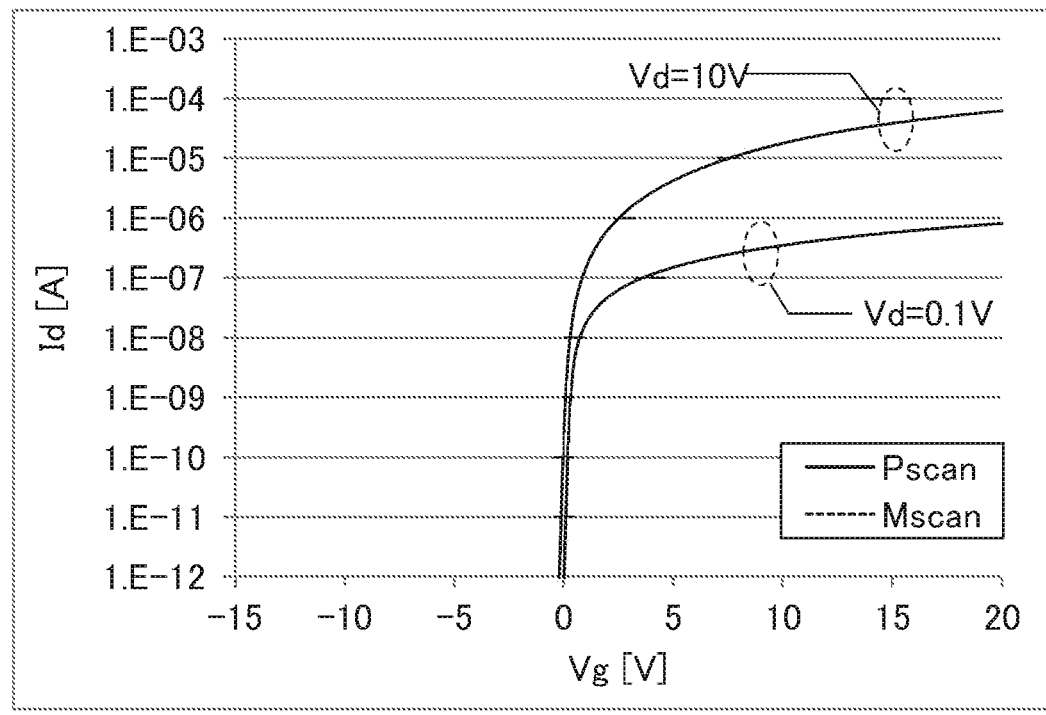
FIG. 22A and FIG. 22B show Id-Vg characteristics of transistors.
Figure 22B:
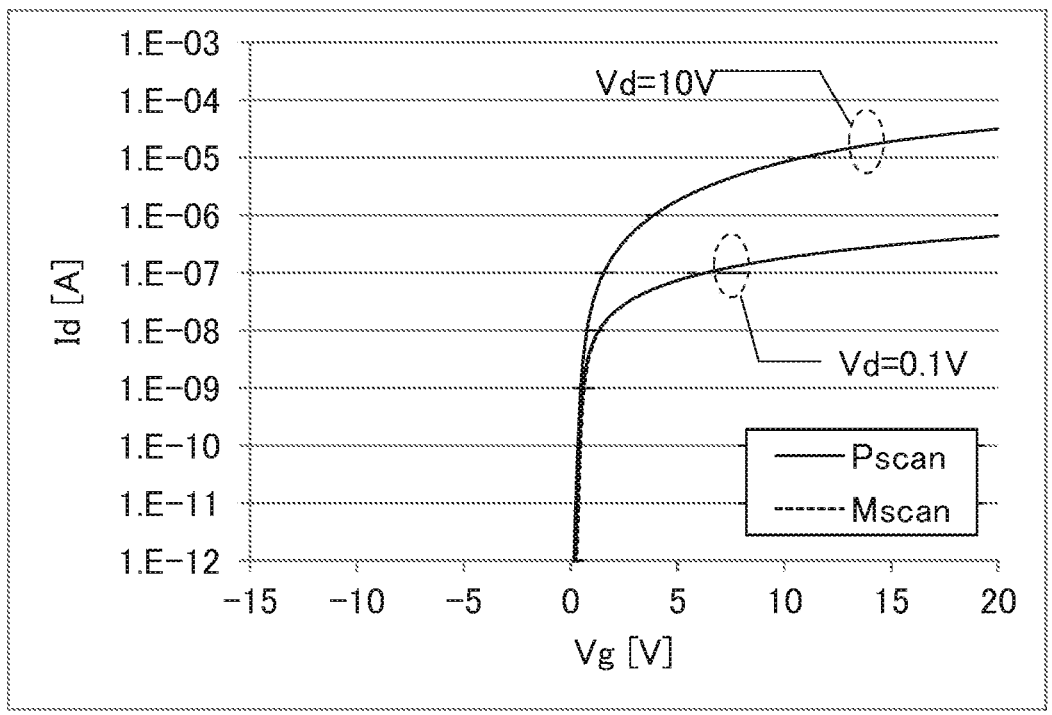
Figure 23A:
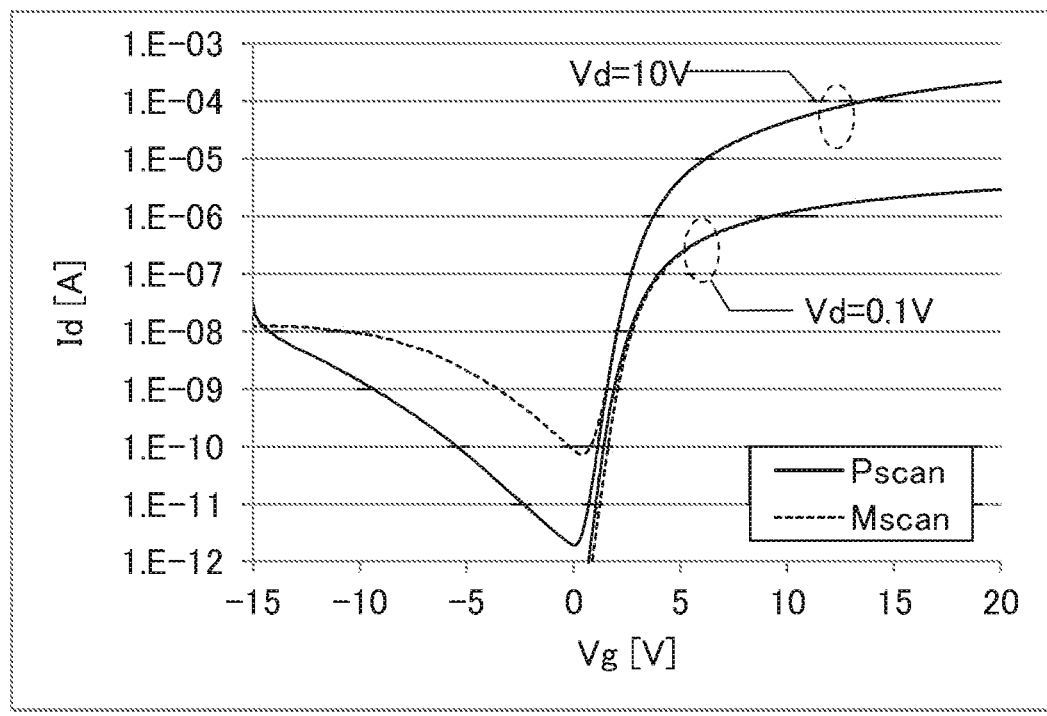
FIG. 23A and FIG. 23B show Id-Vg characteristics of transistors.
Figure 23B:
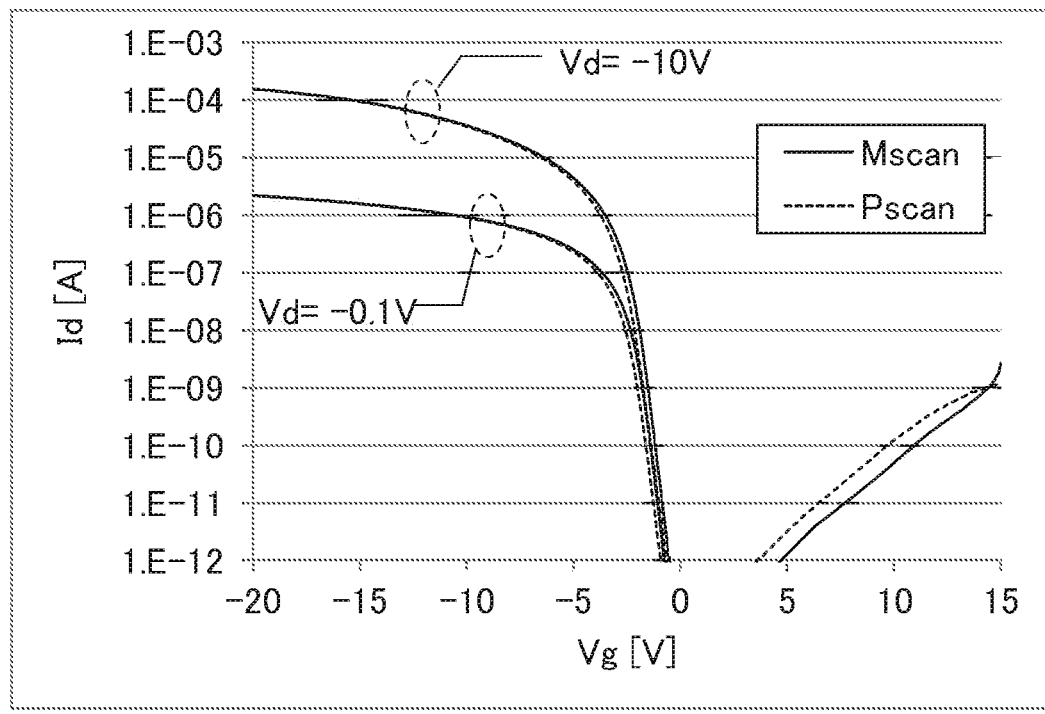

FIG. 22A shows the Id-Vg characteristics of the n-channel OS transistor having a channel length of 10 μm and a channel width of 6 μm, FIG. 22B shows the Id-Vg characteristics of the n-channel OS transistor having a channel length of 6 μm and a channel width of 6 μm, FIG. 23A shows the Id-Vg characteristics of the n-channel LTPS transistor having a channel length of 10 μm and a channel width of 6 μm, and FIG. 22B shows the Id-Vg characteristics of the p-channel LTPS transistor having a channel length of 10 μm and a channel width of 6 μm.

As shown in FIG. 22A and FIG. 22B, in the case of the OS transistors, the difference between the Id-Vg curve obtained by sweeping the gate voltage in the positive direction (Pscan) and the Id-Vg curve obtained by sweeping the gate voltage in the negative direction (Mscan) is extremely small, which indicates small hysteresis.

REFERENCE NUMERALS

C1: capacitor, GL: wiring, EL1: light-emitting element, ND1: node, ND2: node, ND3: node, PS: pixel, Px: pixel, t1: time, t2: time, t3: time, Tr1: transistor, Tr2: transistor, Tr3: transistor, Tr4: transistor, Try: transistor, Tr6: transistor, Tr7: transistor, Va_1: potential, Vd 1: potential, Vdata: wiring, Vdata_1: signal, Vdd: wiring, Vem1: wiring, Vem2: wiring, Vi_1: potential, Vini: wiring, Vscan1: wiring, Vscan2: wiring, Vss: wiring, 10: display device, 11: display portion, 12: driver circuit, 12a: driver circuit, 12b: driver circuit, 13: driver circuit, 31: shift register circuit, 32: latch circuit, 33: latch circuit, 34: level shifter circuit, 35: DAC circuit, 36: analog buffer circuit, 37: source follower circuit, 38: sampling circuit, 41: latch circuit portion, 42: level shifter circuit portion, 43: D-A converter portion, 44: analog buffer circuit portion, 45: source follower circuit portion, 46: demultiplexer circuit, 51: pixel circuit, 103: insulating layer, 106: conductive layer, 108: semiconductor layer, 108N: low-resistance region, 110: insulating layer, 112: conductive layer, 117: insulating layer, 118: insulating layer, 139: region, 201: transistor, 202: transistor, 203: connection layer, 204: connection portion, 205: transistor, 206: conductive layer, 208: semiconductor layer, 208N: low-resistance region, 212: conductive layer, 215: insulating layer, 222a: conductive layer, 222b: conductive layer, 300: display device, 300A: display device, 300B: display device, 300C: display device, 301: layer, 310: pixel, 310a: subpixel, 310A: pixel, 310b: subpixel, 310B: pixel, 310c: subpixel, 311a: conductive layer, 311b: conductive layer, 311c: conductive layer, 312a: conductive layer, 312b: conductive layer, 312c: conductive layer, 313a: layer, 313b: layer, 313c: layer, 314: layer, 315: common electrode, 317: light-blocking layer, 318a: sacrificial layer, 318b: sacrificial layer, 318c: sacrificial layer, 319a: sacrificial layer, 319b: sacrificial layer, 320: substrate, 321: insulating layer, 322: resin layer, 323: conductive layer, 324: insulating layer, 325: insulating layer, 326a: conductive layer, 326b: conductive layer, 326c: conductive layer, 327: insulating layer, 328: layer, 330a: light-emitting device, 330b: light-emitting device, 330c: light-emitting device, 331: protective layer, 334: space, 340: connection portion, 342: adhesive layer, 351: substrate, 352: substrate, 362: display portion, 364: circuit, 365: wiring, 365a: conductive layer, 365b: conductive layer, 366: conductive layer, 372: FPC, 373: IC, 411: semiconductor layer, 411i: channel formation region, 411n: low-resistance region, 412: insulating layer, 413: conductive layer, 421a: conductive layer, 421b: conductive layer, 772: lower electrode, 785: layer, 786: EL layer, 786a: EL layer, 786b: EL layer, 788: upper electrode, 4411: light-emitting layer, 4412: light-emitting layer, 4413: light-emitting layer, 4420: layer, 4421: layer, 4422: layer, 4430: layer, 4431: layer, 4432: layer, 4440: charge-generation layer, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising a first transistor, a second transistor, a third transistor, and a light-emitting element,
wherein the light-emitting element is electrically connected to one of a source and a drain of the first transistor,
wherein the other of the source and the drain of the first transistor is electrically connected to one of a source and a drain of the second transistor,
wherein a gate electrode of the second transistor is electrically connected to one of a source and a drain of the third transistor,
wherein a semiconductor layer of the second transistor comprises indium, zinc, and an element M,
wherein the element M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt,
wherein a semiconductor layer of the third transistor comprises indium, zinc and the element M,
wherein a ratio of the number of indium atoms to a total number of the indium atoms, zinc atoms, and atoms of the element M in the semiconductor layer of the second transistor is higher than or equal to 30 atomic % and lower than or equal to 100 atomic %,
wherein a ratio of the number of atoms of the element M to a total number of indium atoms, zinc atoms, and the atoms of the element M in the semiconductor layer of the third transistor is higher than that in the semiconductor layer of the second transistor, and
wherein the second transistor is configured to control the amount of light emission of the light-emitting element.

2. The display device according to claim 1,
wherein the other of the source and the drain of the third transistor is electrically connected to the other of the source and the drain of the second transistor, and
wherein the ratio of the number of the indium atoms to the total number of the indium atoms, the zinc atoms, and the atoms of the element M in the semiconductor layer of the second transistor is higher than that in the semiconductor layer of the third transistor.

3. The display device according to claim 1,
wherein the ratio of the number of the atoms of the element M to the total number of atoms of contained metal elements in the semiconductor layer of the third transistor is higher than or equal to 20 atomic % and lower than or equal to 60 atomic %.

4. The display device according to claim 1, further comprising a fourth transistor, a fifth transistor, a first wiring, a capacitor, and a driver circuit,
wherein one of a source and a drain of the fourth transistor is electrically connected to the one of the source and the drain of the second transistor,
wherein one of a source and a drain of the fifth transistor is electrically connected to the other of the source and the drain of the second transistor,
wherein the other of the source and the drain of the fourth transistor is electrically connected to the first wiring,
wherein a first electrode of the capacitor is electrically connected to the one of the source and the drain of the first transistor,
wherein a second electrode of the capacitor is electrically connected to a gate of the second transistor, and
wherein the first wiring is configured to supply a video signal output from the driver circuit to the other of the source and the drain of the fourth transistor.

5. The display device according to claim 4,
wherein the display device is configured to write a potential to the gate of the second transistor by turning on the second transistor, the third transistor, and the fourth transistor and turning off the first transistor and the fifth transistor, and
wherein the display device is configured to retain the written potential by turning off the third transistor and the fourth transistor after the potential is written.

6. The display device according to claim 4,
wherein the display device is configured to write a potential to the gate of the second transistor by turning on the second transistor, the third transistor, and the fourth transistor and turning off the first transistor and the fifth transistor,
wherein the display device is configured to retain the written potential by turning off the third transistor and the fourth transistor after the potential is written, and
wherein the display device is configured to control the amount of light emission of the light-emitting element by turning on the first transistor, the second transistor, and the fifth transistor and flowing current through the light-emitting element, after the potential is retained.

* * * * *